(12) United States Patent
Satou et al.

(10) Patent No.: US 6,172,867 B1
(45) Date of Patent: Jan. 9, 2001

(54) ELECTRONIC APPARATUS WITH REINFORCED UPPER CASE

(75) Inventors: Youji Satou; Katumaru Sasaki, both of Tokyo (JP)

(73) Assignee: Kabushiki Kaisha Toshiba, Kawasaki (JP)

(*) Notice: Under 35 U.S.C. 154(b), the term of this patent shall be extended for 0 days.

(21) Appl. No.: 08/639,259

(22) Filed: Apr. 24, 1996

Related U.S. Application Data

(63) Continuation of application No. 08/394,229, filed on Feb. 24, 1995, which is a continuation of application No. 08/158,888, filed on Nov. 19, 1993, which is a division of application No. 08/118,481, filed on Sep. 8, 1993, now Pat. No. 5,316,491, which is a continuation of application No. 07/900,974, filed on Jun. 18, 1992, now abandoned.

(30) Foreign Application Priority Data

Jul. 31, 1991 (JP) .................................................. 3-190207

(51) Int. Cl.⁷ ...................................................... G06F 1/16
(52) U.S. Cl. .......................... 361/680; 361/786; 361/683; 312/223.1
(58) Field of Search .................................... 361/680, 681, 361/684, 685, 686, 687, 786; 312/223.1, 223.2; 364/708.1

(56) References Cited

U.S. PATENT DOCUMENTS

| | | |
|---|---|---|
| Re. 32,977 * | 7/1989 | Gotoh et al. ............. 361/680 X |
| D. 271,767 | 12/1983 | Ohie . |
| D. 276,342 | 11/1984 | Kitai . |
| D. 277,003 | 1/1985 | Cridland et al. . |
| D. 283,511 | 4/1986 | Dunn . |
| D. 311,172 | 10/1990 | Makidera . |
| D. 338,459 | 8/1993 | Fullmer . |

(List continued on next page.)

FOREIGN PATENT DOCUMENTS

| | | |
|---|---|---|
| 0 149 762 | 11/1984 | (EP) . |
| 393 846 A2 | 10/1990 | (EP) . |
| 2 144 569 | 3/1985 | (GB) . |
| 2 205 000 | 11/1988 | (GB) . |
| 54-96546 | 7/1979 | (JP) . |
| 57-17041 | 1/1982 | (JP) . |
| 650463 | 5/1985 | (JP) . |
| 650878 | 5/1985 | (JP) . |
| 650879 | 5/1985 | (JP) . |
| 650881 | 5/1985 | (JP) . |
| 666246 | 11/1985 | (JP) . |
| 62-30096 | 6/1987 | (JP) . |
| 64-54125 | 1/1989 | (JP) . |
| 2-161798 | 6/1990 | (JP) ........................... H05K/9/00 |

(List continued on next page.)

OTHER PUBLICATIONS

Japan Pat Um Appln. Kokai Publication No. 3–9065, Letter of Amendment, No date.
Desktop Expansion Base Operations and Installation Guide; Compaq Computer Corporation, Jan. 1992.
TS000SXe Portable Personal Computer Reference Manual; Toshiba Corporation, Apr. 1991.
Article—"Incredible shrinking computers," IEEE Spectrum, No. 5, May 28, 1991, pp. 37–41.

Primary Examiner—Leo P. Picard
Assistant Examiner—Lisa Lea Edmonds
(74) Attorney, Agent, or Firm—Limbach & Limbach, LLP

(57) ABSTRACT

A body of an electronic apparatus includes an upper case and a lower case fitted to the upper case. A display is rotatably mounted on an outer surface of the upper case. A keyboard is attached to an inner surface of the upper case, and a shield plate is fixed to an inner surface of the keyboard. On the shield plate are mounted a memory device and circuit boards with electronic parts. A supporting unit attached to the inner surface of the upper case and arranged to the side of the keyboard has a storing portion for storing a battery pack.

35 Claims, 52 Drawing Sheets

U.S. PATENT DOCUMENTS

| | | | |
|---|---|---|---|
| 3,094,364 | 6/1963 | Lingg . | |
| 3,709,538 | 1/1973 | Seitz et al. . | |
| 3,907,346 | 9/1975 | Van Klompenburg . | |
| 3,917,372 | 11/1975 | Selinko . | |
| 4,113,292 | 9/1978 | Gauron et al. . | |
| 4,316,236 | 2/1982 | Lechner et al. . | |
| 4,361,372 | 11/1982 | Majkrzak et al. . | |
| 4,392,503 | 7/1983 | Watanabe . | |
| 4,497,036 * | 1/1985 | Dunn | 364/708.1 |
| 4,527,821 | 7/1985 | Tanaka . | |
| 4,560,845 | 12/1985 | Takamura et al. . | |
| 4,564,751 | 1/1986 | Alley et al. . | |
| 4,571,456 | 2/1986 | Paulsen et al. . | |
| 4,631,641 | 12/1986 | Brombal et al. . | |
| 4,649,381 | 3/1987 | Masuda et al. . | |
| 4,654,818 | 3/1987 | Wetterau, Jr. . | |
| 4,667,299 | 5/1987 | Dunn . | |
| 4,676,081 | 6/1987 | Craig . | |
| 4,680,674 | 7/1987 | Moore . | |
| 4,680,676 | 7/1987 | Petratos et al. . | |
| 4,683,736 | 8/1987 | Weinerman et al. . | |
| 4,718,740 | 1/1988 | Cox . | |
| 4,742,487 * | 5/1988 | Nigro, Jr. et al. | 364/708.1 |
| 4,769,557 | 9/1988 | Houf et al. . | |
| 4,769,764 | 9/1988 | Levanon . | |
| 4,788,658 | 11/1988 | Handbuth . | |
| 4,790,579 | 12/1988 | Maxwell et al. . | |
| 4,821,146 | 4/1989 | Behrens et al. . | |
| 4,836,790 | 6/1989 | Narita . | |
| 4,858,162 | 8/1989 | Kieffer et al. . | |
| 4,862,166 | 8/1989 | Yamakawa . | |
| 4,864,523 * | 9/1989 | Sasaki | 364/708.1 |
| 4,872,091 | 10/1989 | Maniwa et al. . | |
| 4,881,839 | 11/1989 | Grimm . | |
| 4,890,197 | 12/1989 | Banjo et al. . | |
| 4,903,222 | 2/1990 | Carter et al. . | |
| 4,905,173 * | 2/1990 | Bianco | 361/680 |
| 4,917,618 | 4/1990 | Behrens et al. . | |
| 4,920,298 | 4/1990 | Hinotani et al. . | |
| 4,926,365 | 5/1990 | Hsieh . | |
| 4,941,841 | 7/1990 | Dardon et al. . | |
| 4,950,053 | 8/1990 | Haim et al. . | |
| 4,955,817 | 9/1990 | Sugai . | |
| 4,960,384 | 10/1990 | Singer et al. . | |
| 4,969,830 | 11/1990 | Daly et al. . | |
| 4,980,522 * | 12/1990 | Murakami et al. | 361/680 X |
| 4,980,800 | 12/1990 | Furuta . | |
| 4,989,167 * | 1/1991 | Kapec et al. | 364/681 |
| 5,008,976 | 4/1991 | Busch . | |
| 5,017,767 | 5/1991 | Mizuno . | |
| 5,029,045 | 7/1991 | Sanai et al. . | |
| 5,029,984 | 7/1991 | Adachi et al. . | |
| 5,030,128 | 7/1991 | Herron et al. . | |
| 5,033,972 | 7/1991 | Komatsu et al. . | |
| 5,036,313 * | 7/1991 | Lin et al. | 361/680 X |
| 5,045,971 | 9/1991 | Ono et al. . | |
| 5,061,845 | 10/1991 | Pinnavain . | |
| 5,086,509 | 2/1992 | Inubushi et al. . | |
| 5,091,823 | 2/1992 | Kanbara et al. . | |
| 5,130,892 | 7/1992 | Satou . | |
| 5,132,876 * | 7/1992 | Ma | 361/680 |
| 5,134,245 | 7/1992 | Katz . | |
| 5,136,329 | 8/1992 | Sugiura . | |
| 5,136,466 | 8/1992 | Remise et al. . | |
| 5,136,468 * | 8/1992 | Wong et al. | 361/683 |
| 5,145,389 | 9/1992 | Okubo . | |
| 5,146,354 | 9/1992 | Plesinger . | |
| 5,148,350 | 9/1992 | Chan et al. . | |
| 5,150,257 | 9/1992 | Mohabbatuzadeh et al. . | |
| 5,157,588 | 10/1992 | Kim et al. . | |
| 5,159,533 | 10/1992 | Kuang . | |
| 5,182,660 | 1/1993 | Tanaka . | |
| 5,184,961 | 2/1993 | Ramirez et al. . | |
| 5,189,638 | 2/1993 | Kimura . | |
| 5,196,994 | 3/1993 | Tanuma et al. . | |
| 5,204,805 | 4/1993 | Takahashi et al. . | |
| 5,207,586 | 5/1993 | MacGregor et al. . | |
| 5,210,442 | 5/1993 | Ishimoto . | |
| 5,224,024 | 6/1993 | Tu et al. . | |
| 5,237,486 * | 8/1993 | LaPointe et al. | 361/681 |
| 5,242,310 | 9/1993 | Leung . | |
| 5,244,397 | 9/1993 | Anhalt . | |
| 5,249,103 | 9/1993 | Forsythe . | |
| 5,251,096 | 10/1993 | Hosoi et al. . | |
| 5,255,154 * | 10/1993 | Hosoi et al. | 361/680 |
| 5,260,884 | 11/1993 | Stern . | |
| 5,264,992 * | 11/1993 | Hogdahl et al. | 361/683 |
| 5,283,673 | 2/1994 | Murase et al. . | |
| 5,283,714 | 2/1994 | Tsai et al. . | |
| 5,292,267 | 3/1994 | Kobayashi et al. . | |
| 5,299,038 | 3/1994 | Hamada et al. . | |
| 5,305,180 | 4/1994 | Mitchell et al. . | |
| 5,306,079 | 4/1994 | Liu . | |
| 5,357,402 | 10/1994 | Anhalt . | |
| 5,422,784 * | 6/1995 | Wakahara et al. | 361/680 |
| 5,774,331 * | 6/1998 | Sach | 361/708.1 |

FOREIGN PATENT DOCUMENTS

| | | | |
|---|---|---|---|
| 2-163999 | 6/1990 | (JP) | H05K/9/00 |
| 3-9065 | 1/1991 | (JP) . | |
| 3-25961 | 3/1991 | (JP) . | |
| 3-29382 | 3/1991 | (JP) . | |
| 3-37564 | 4/1991 | (JP) . | |
| 3-129419 * | 6/1991 | (JP) | G06F/1/16 |
| 4-102888 | 4/1992 | (JP) . | |
| WO 91/00681 | 1/1991 | (WO) | H05K/1/14 |
| WO 91/07716 | 5/1991 | (WO) . | |

* cited by examiner

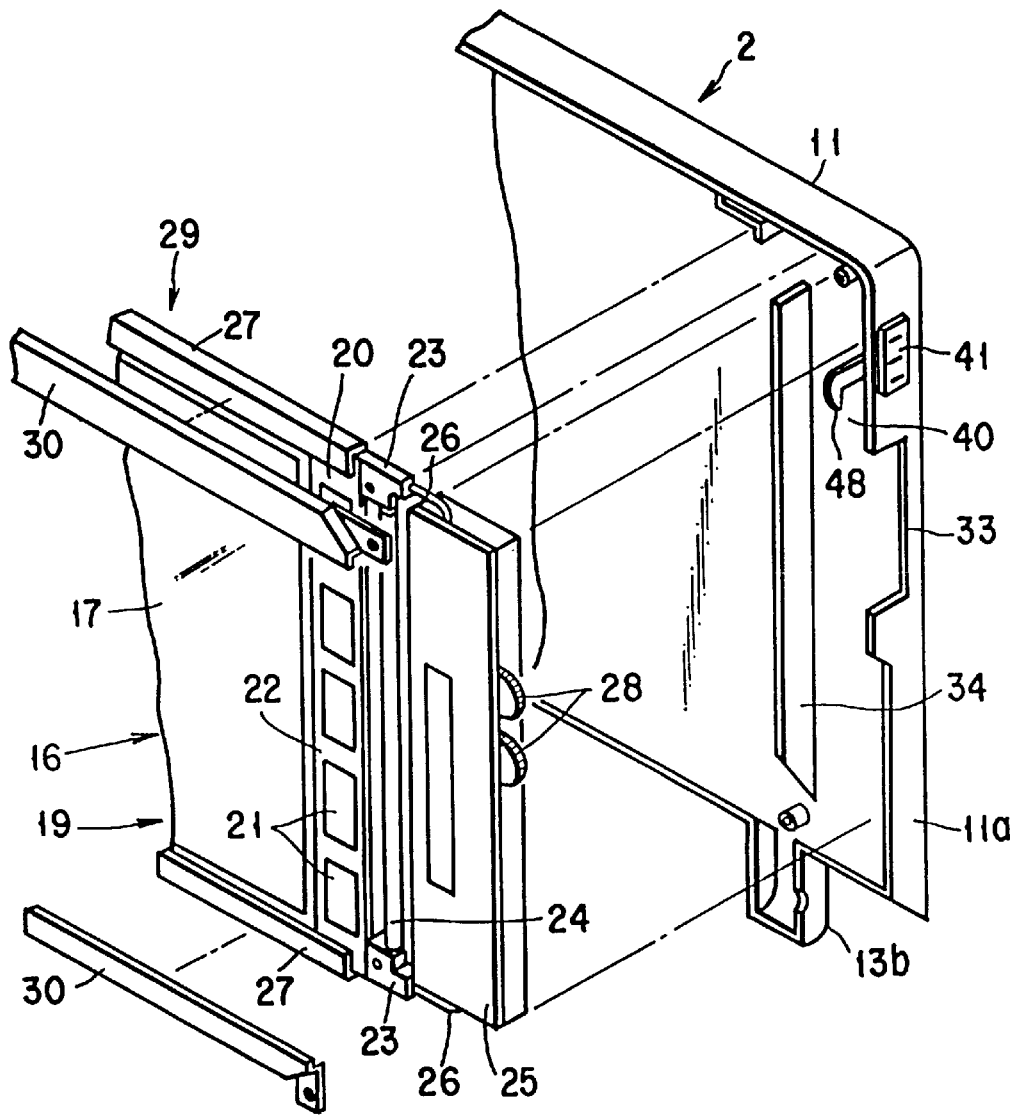
F I G. 4

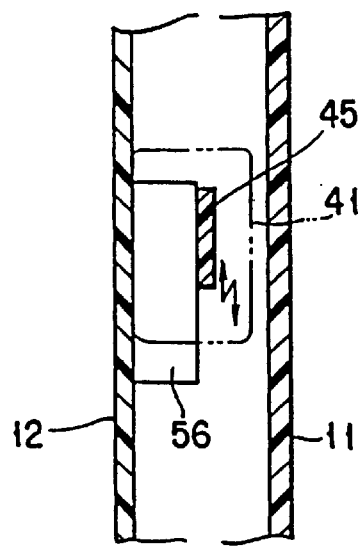
F I G. 8
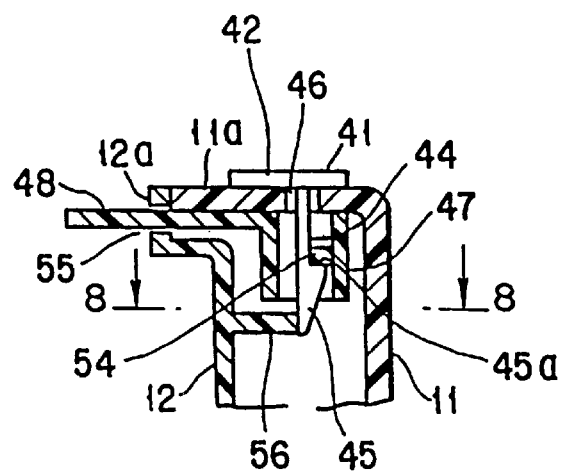
F I G. 9

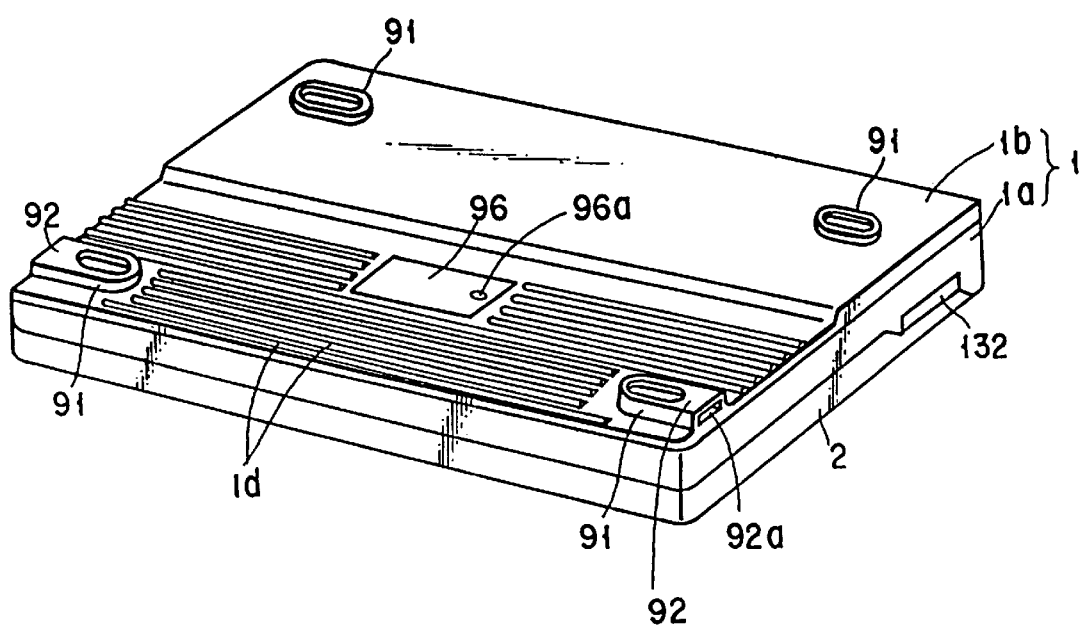
F I G. 10

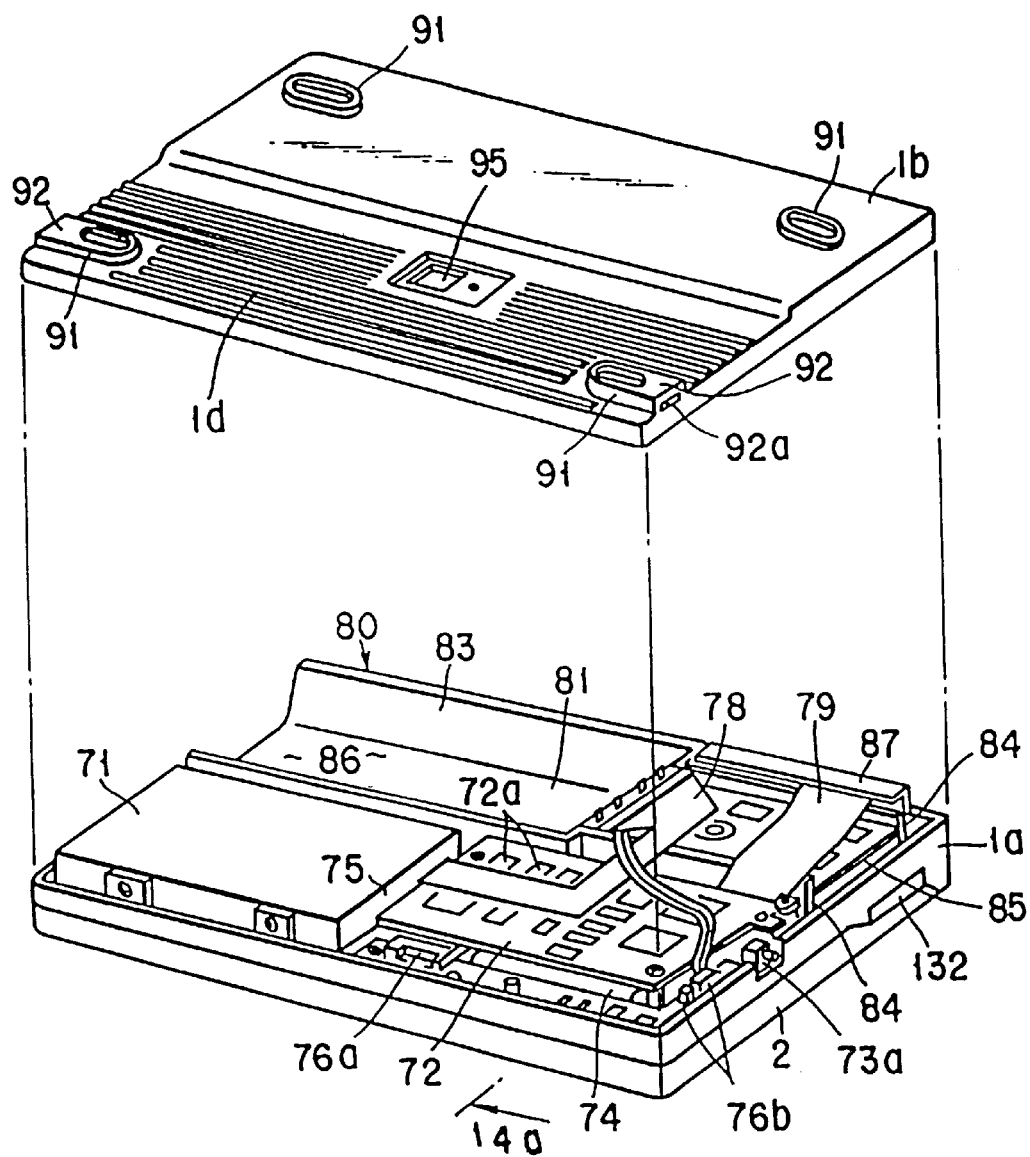
F I G. 11

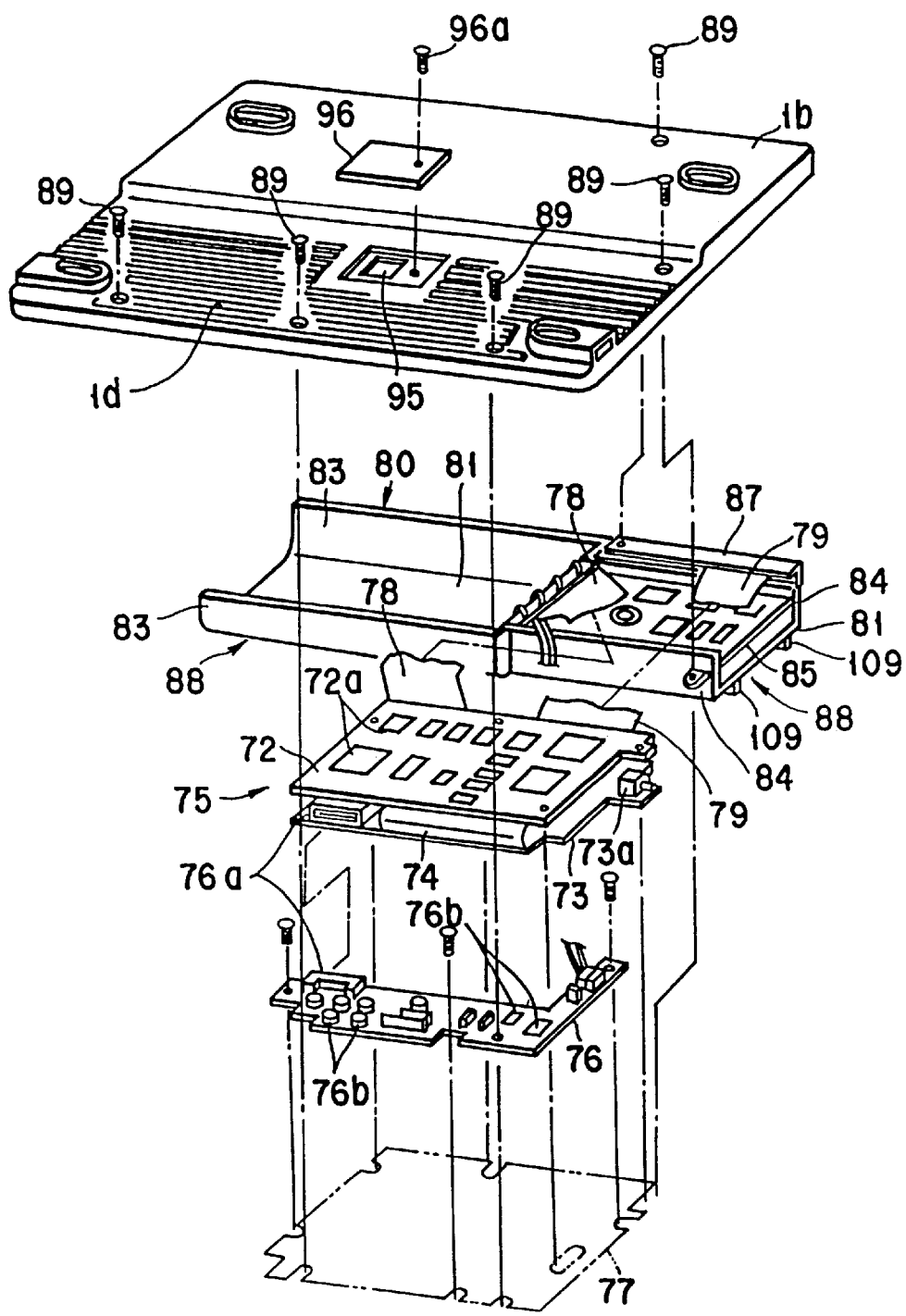
F I G. 12

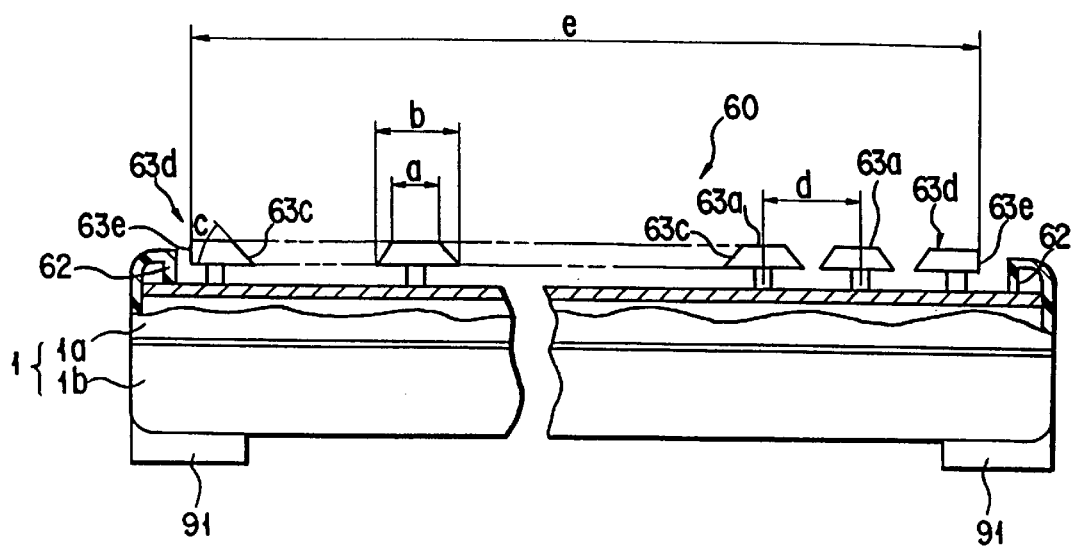
F I G. 14 B

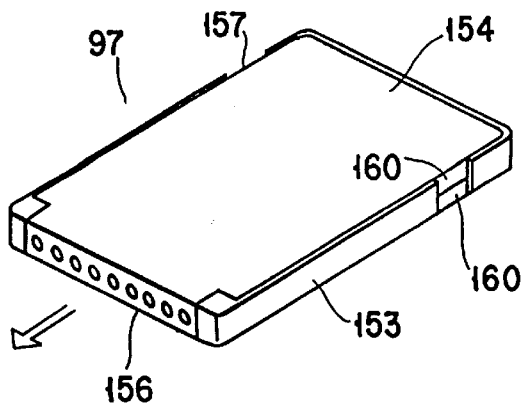
F I G. 15
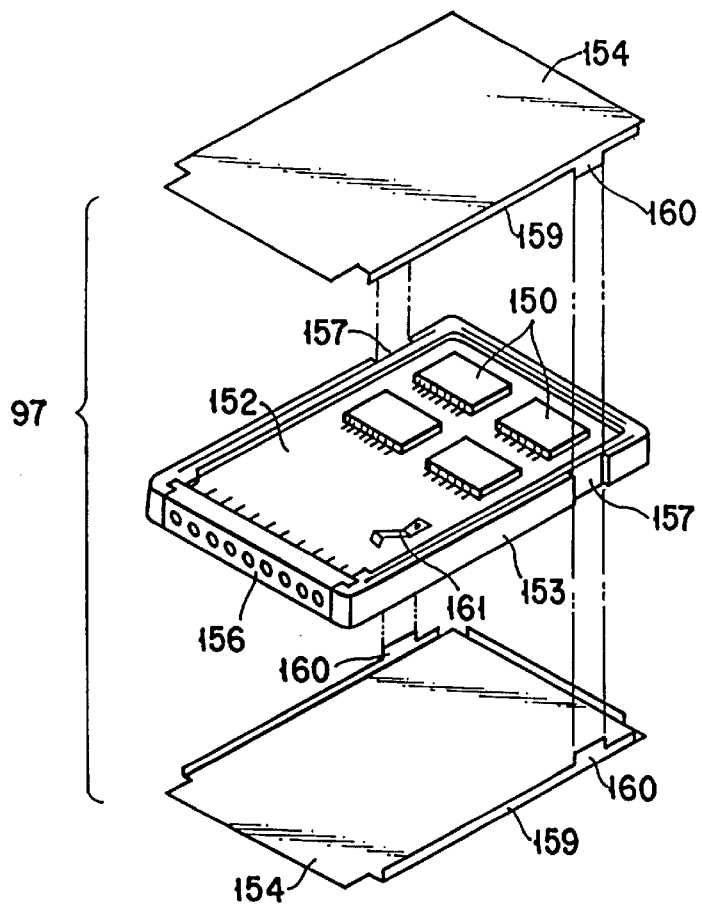
F I G. 16

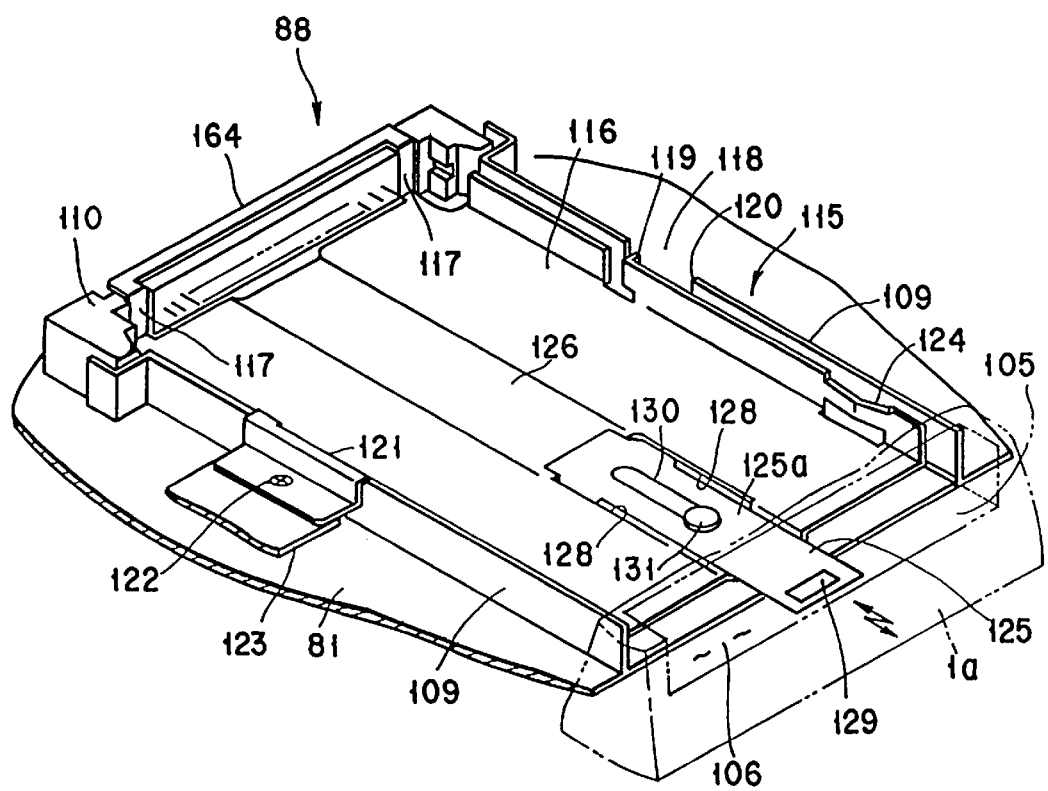
F I G. 19

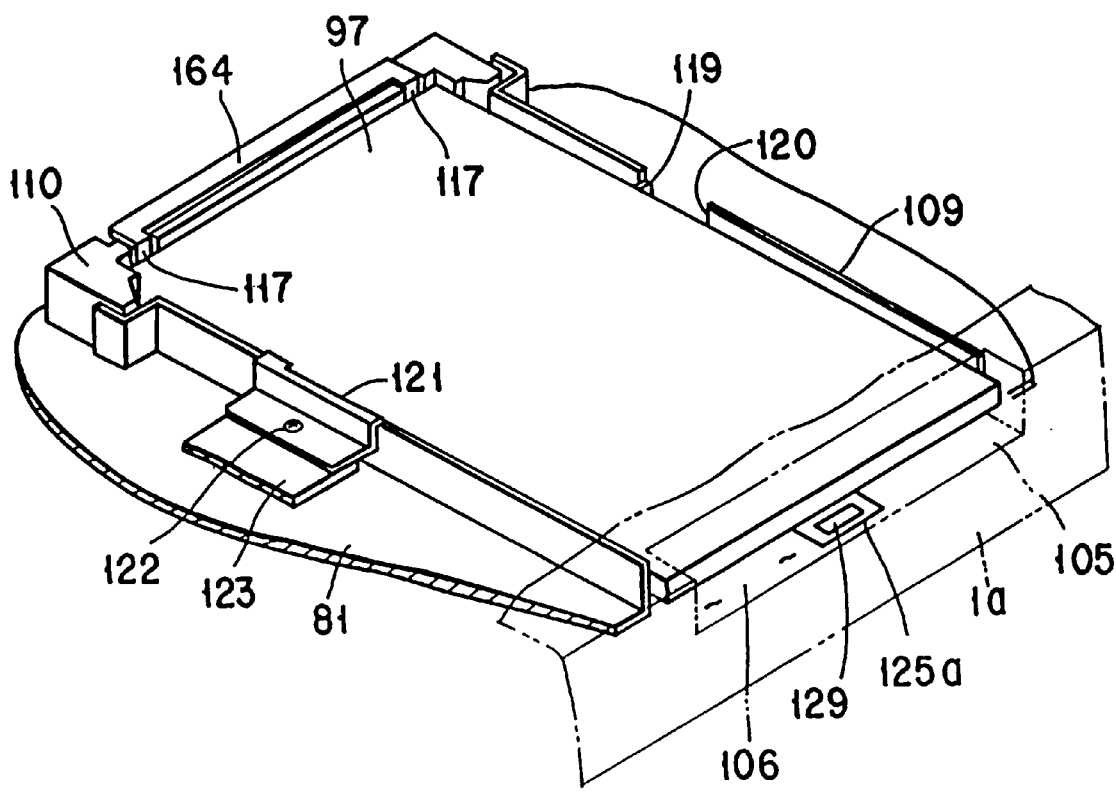
F I G. 21

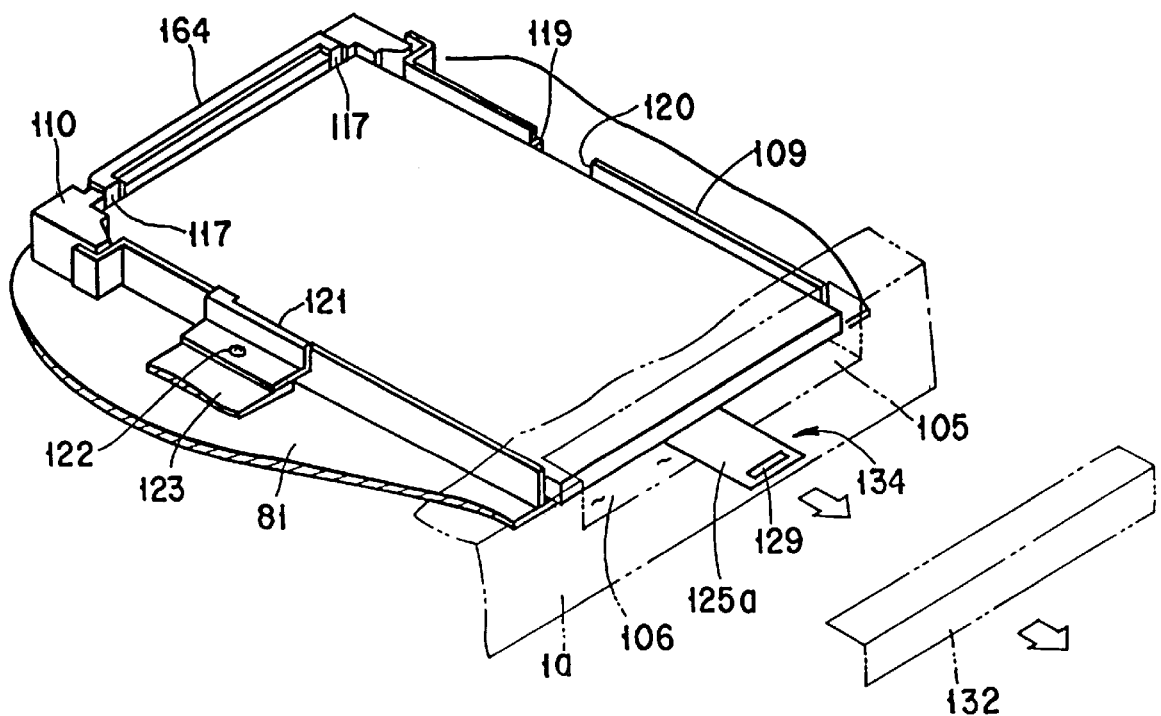
F I G. 22

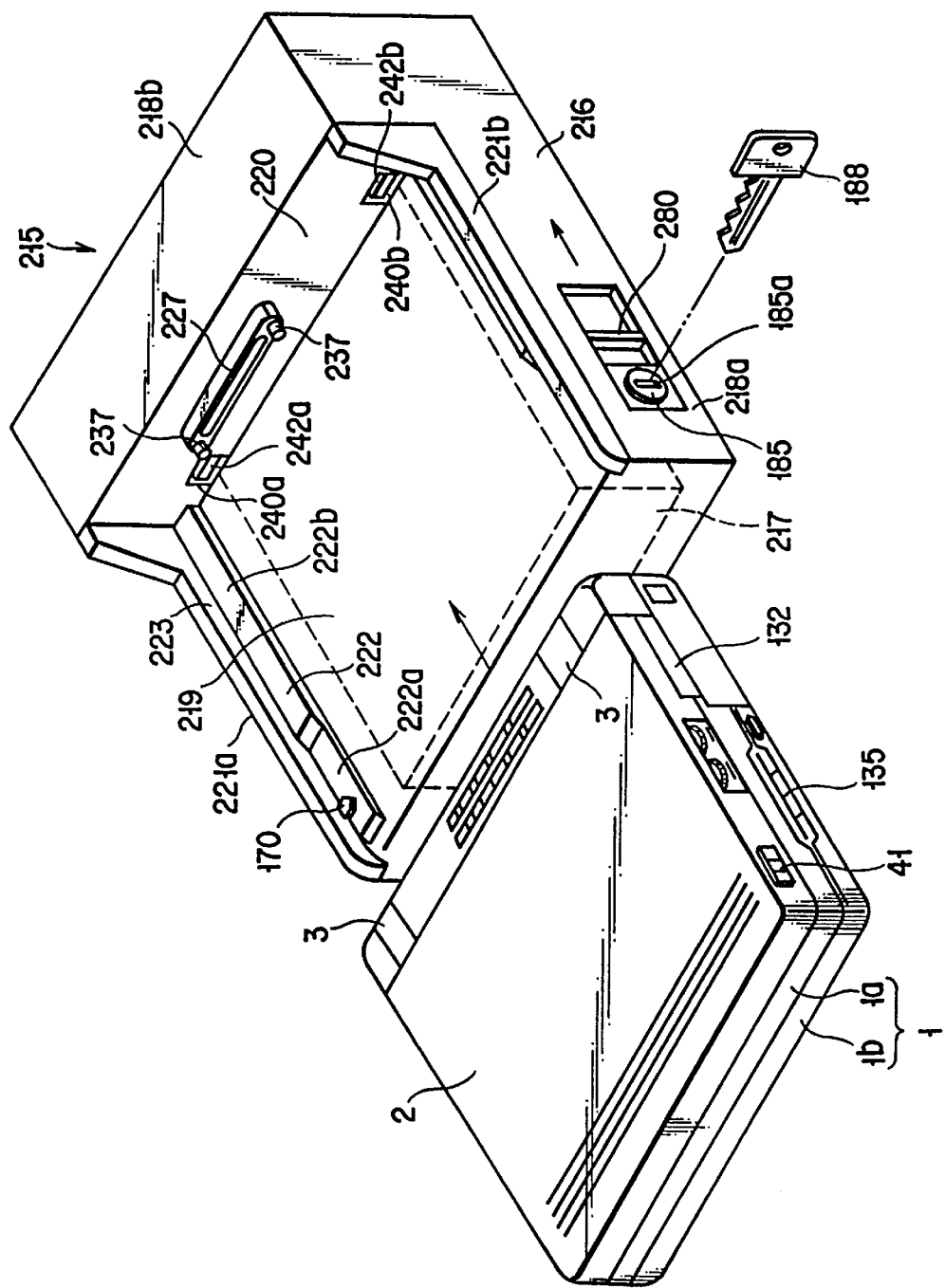
F I G. 24

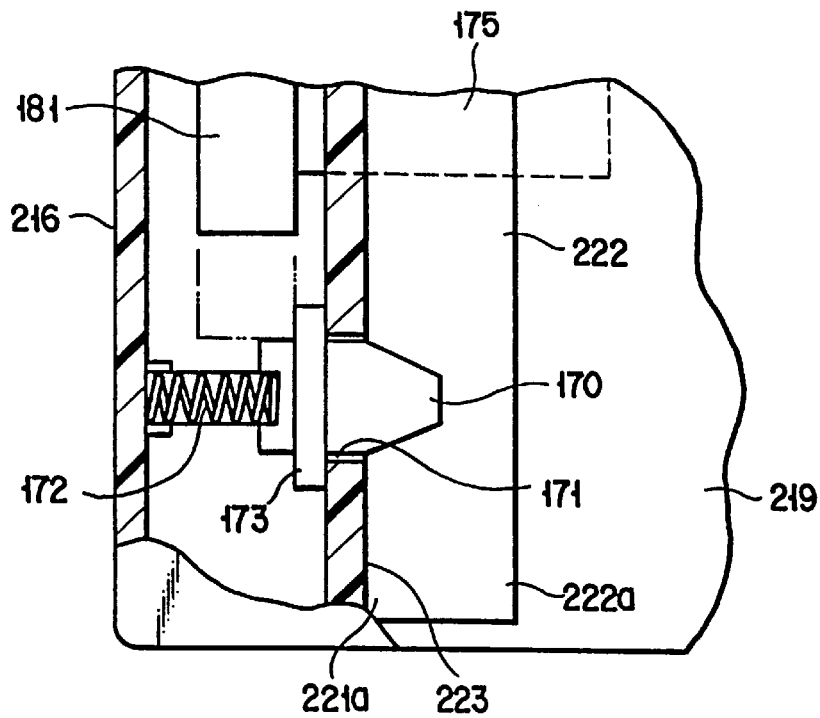
F I G. 25
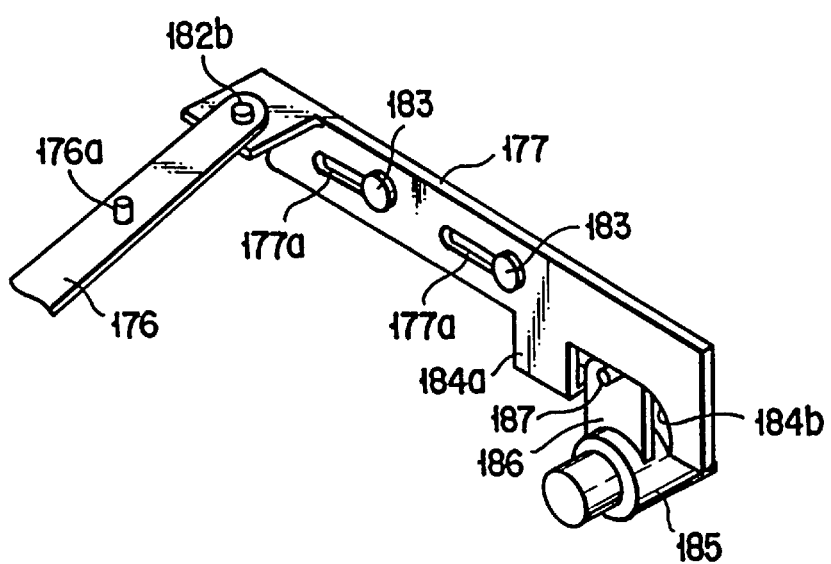
F I G. 26

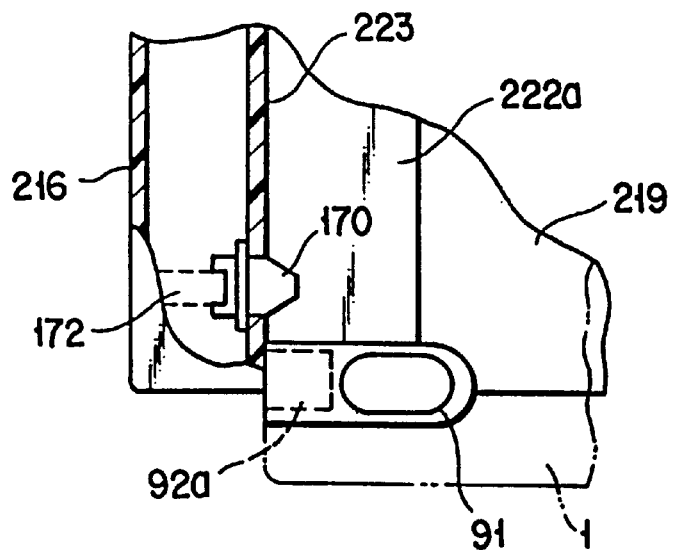
F I G. 31
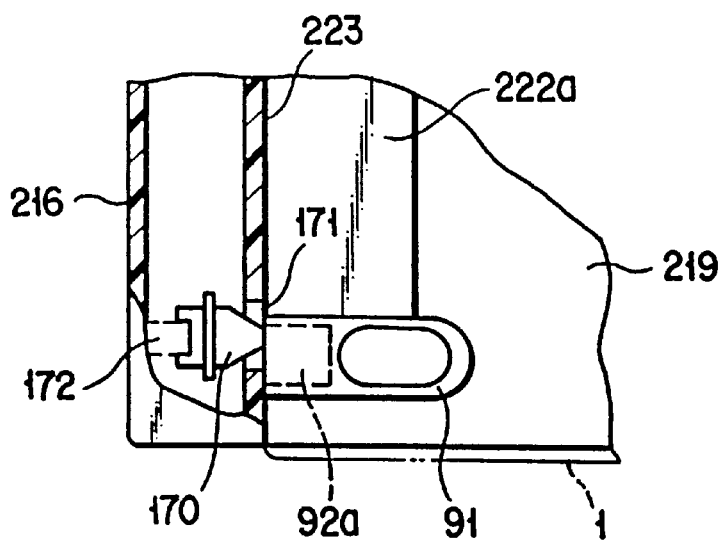
F I G. 32

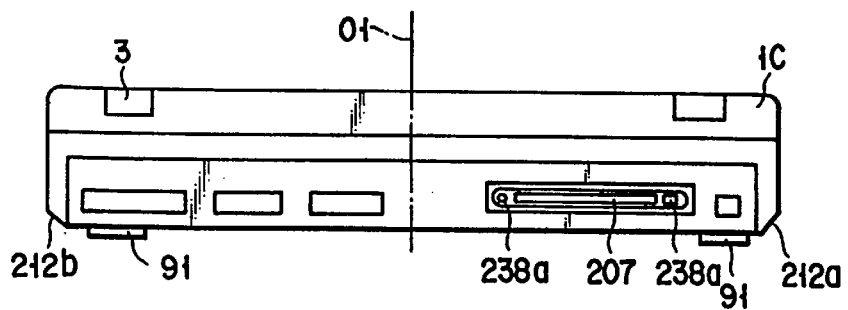
F I G. 36
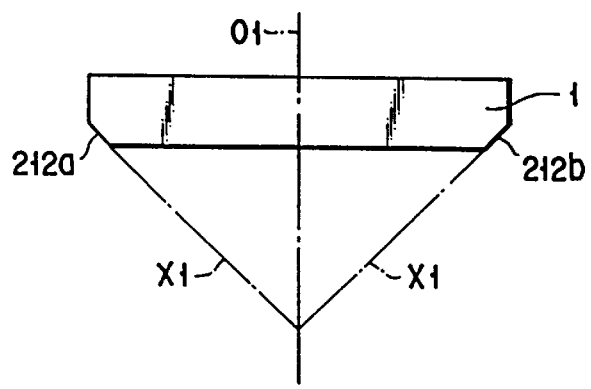
F I G. 37
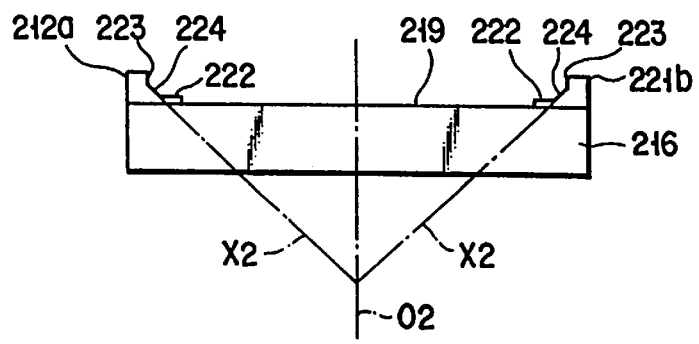
F I G. 38

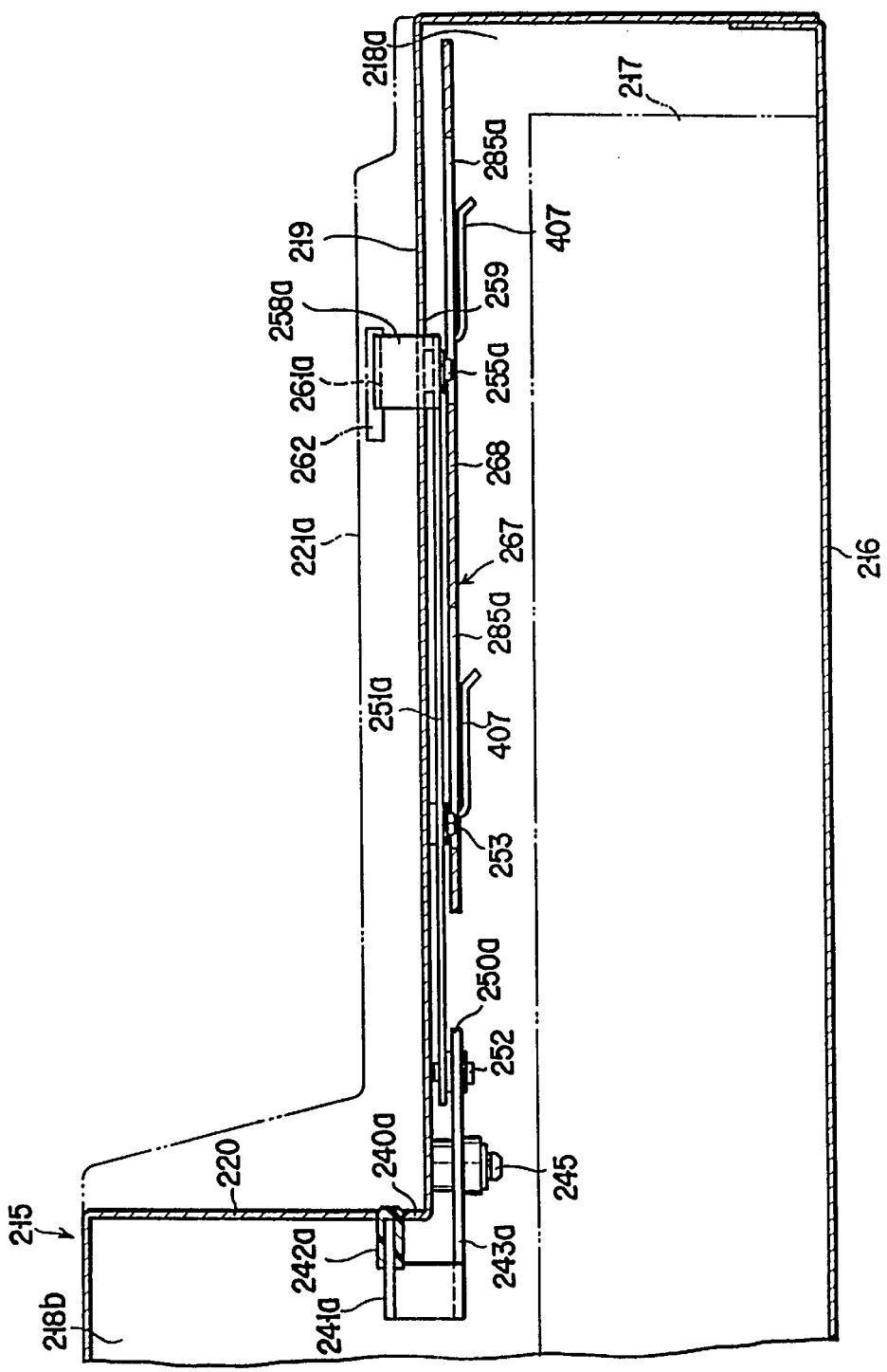
F I G. 46

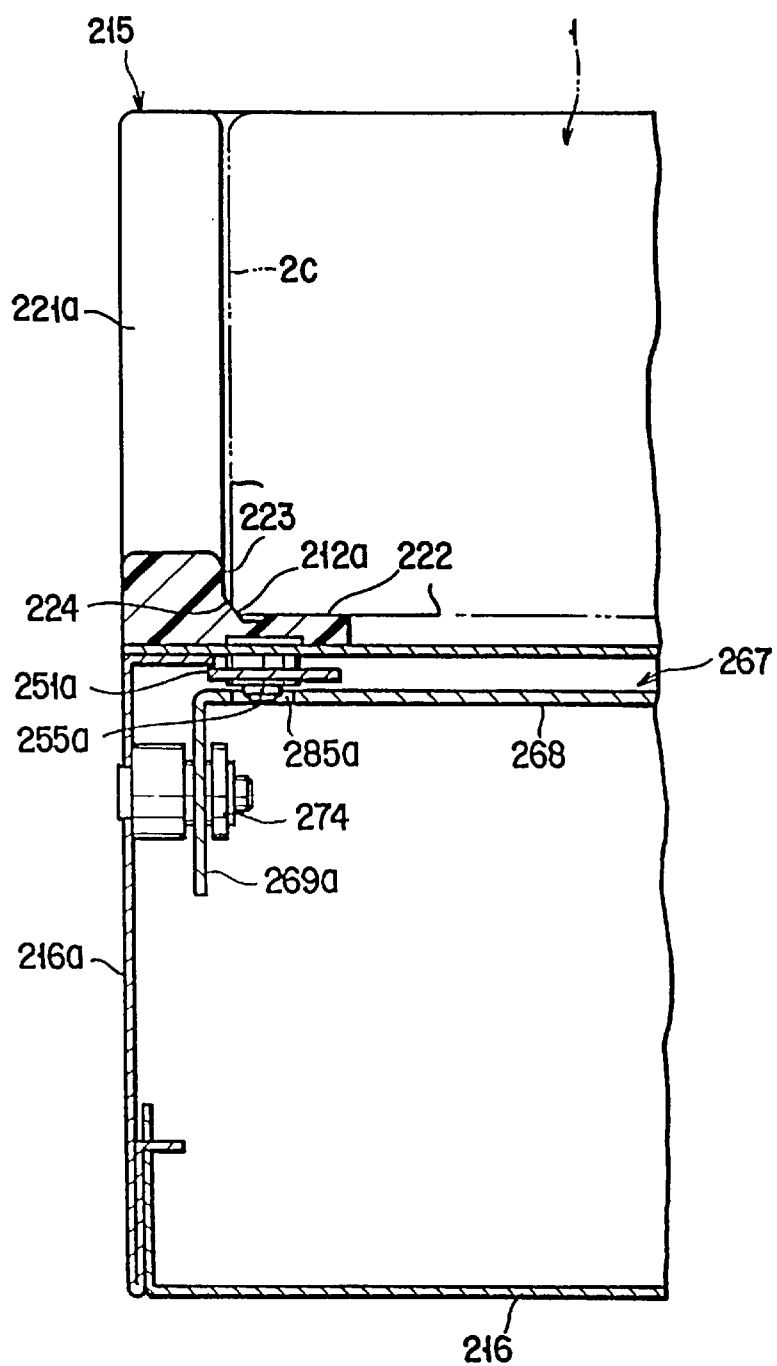
F I G. 48

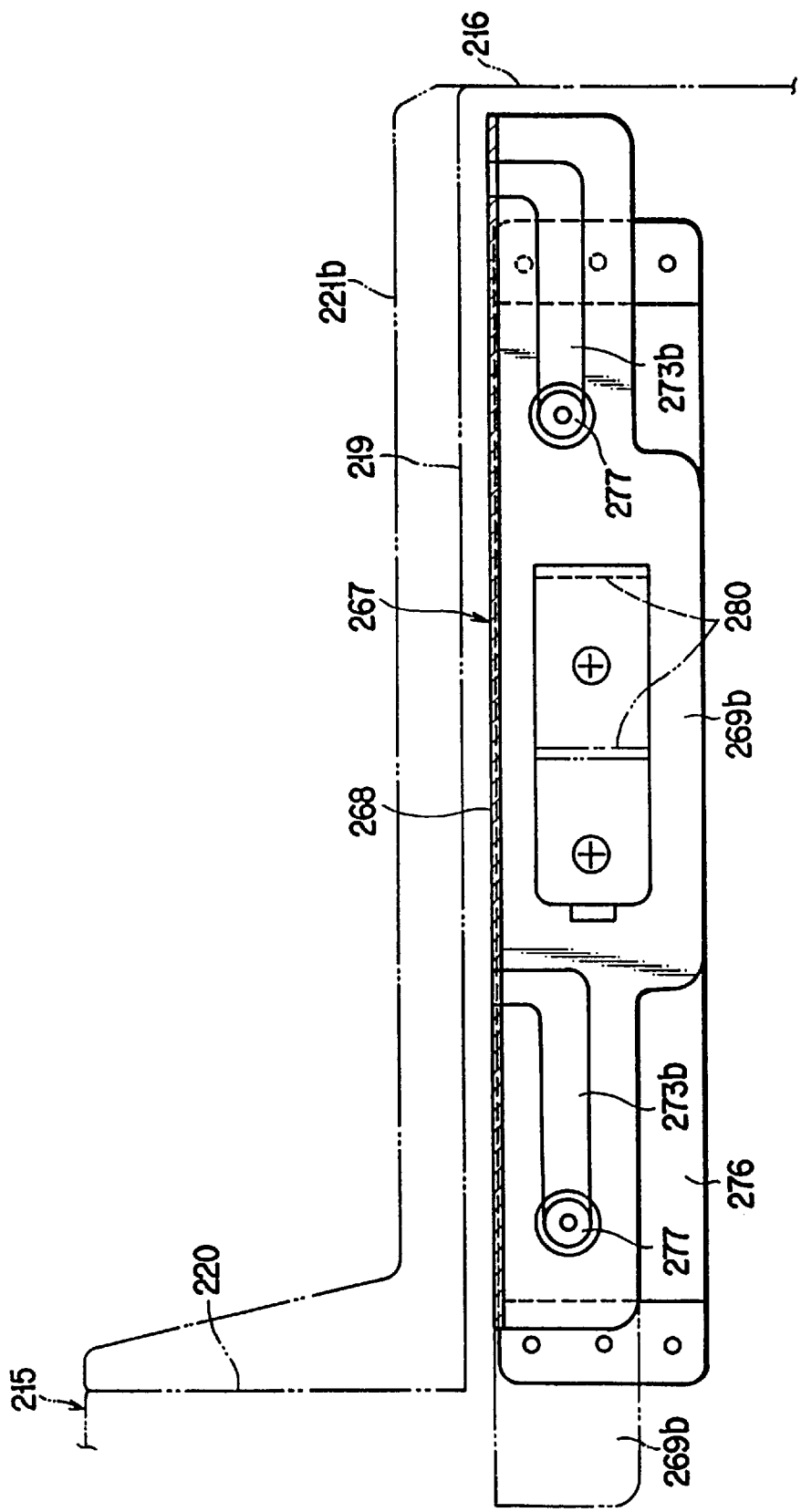
F I G. 50

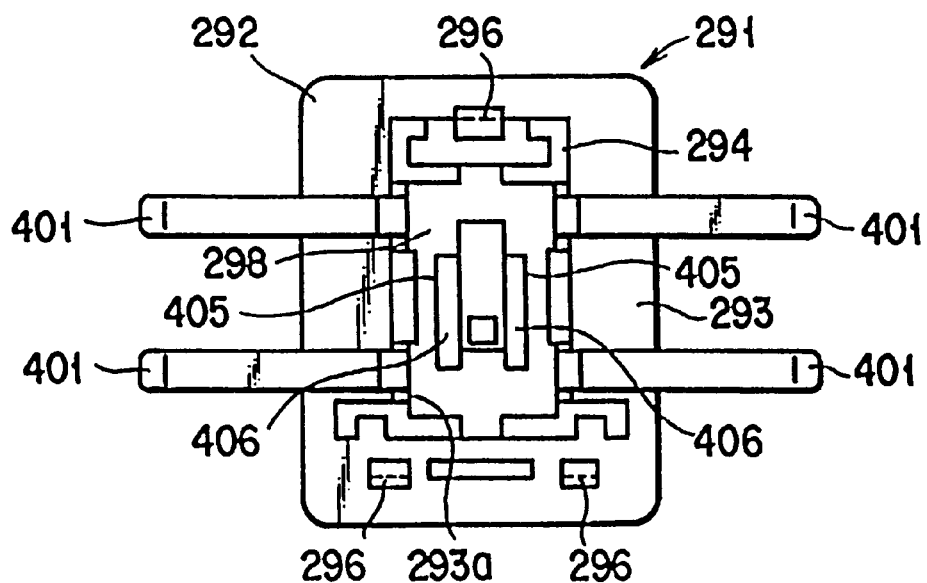
F I G. 52
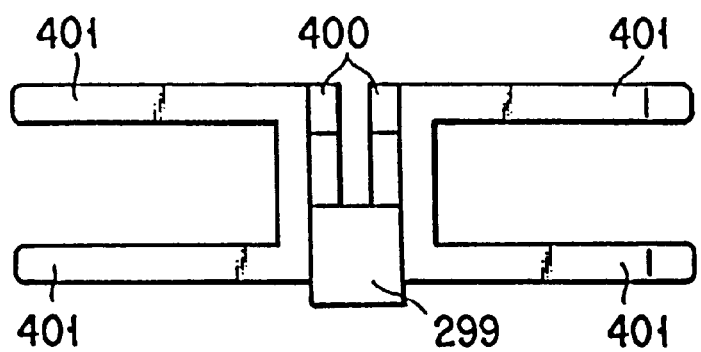
F I G. 53

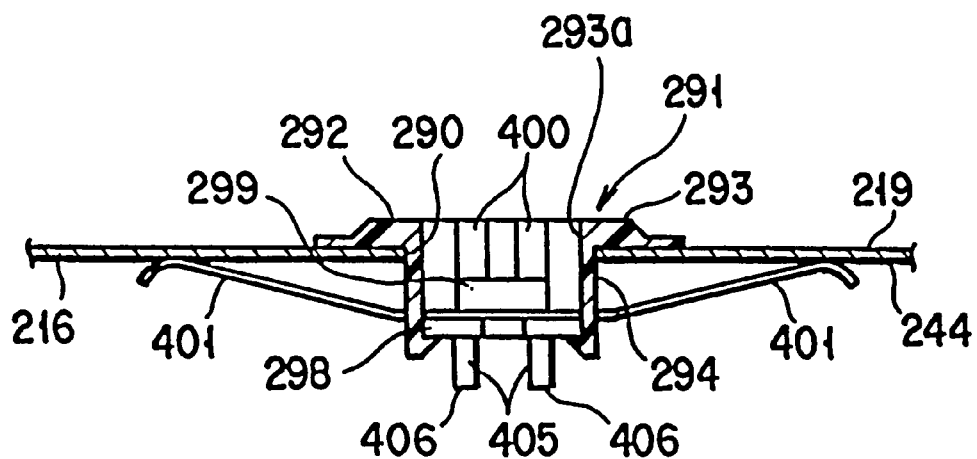
F I G. 57
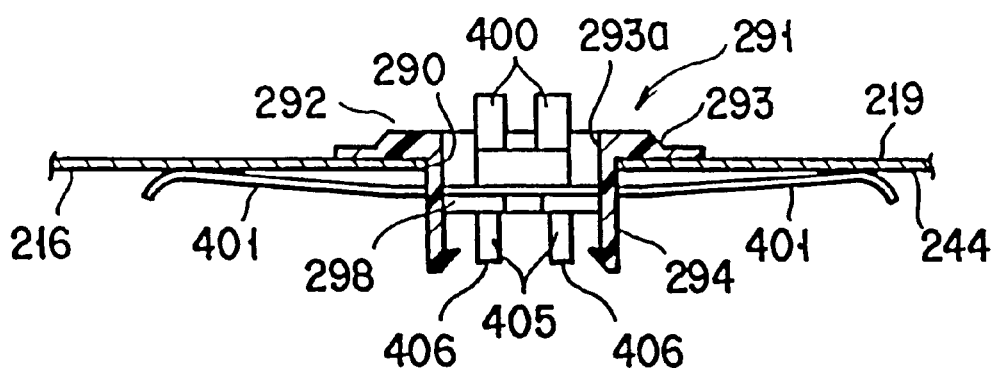
F I G. 58

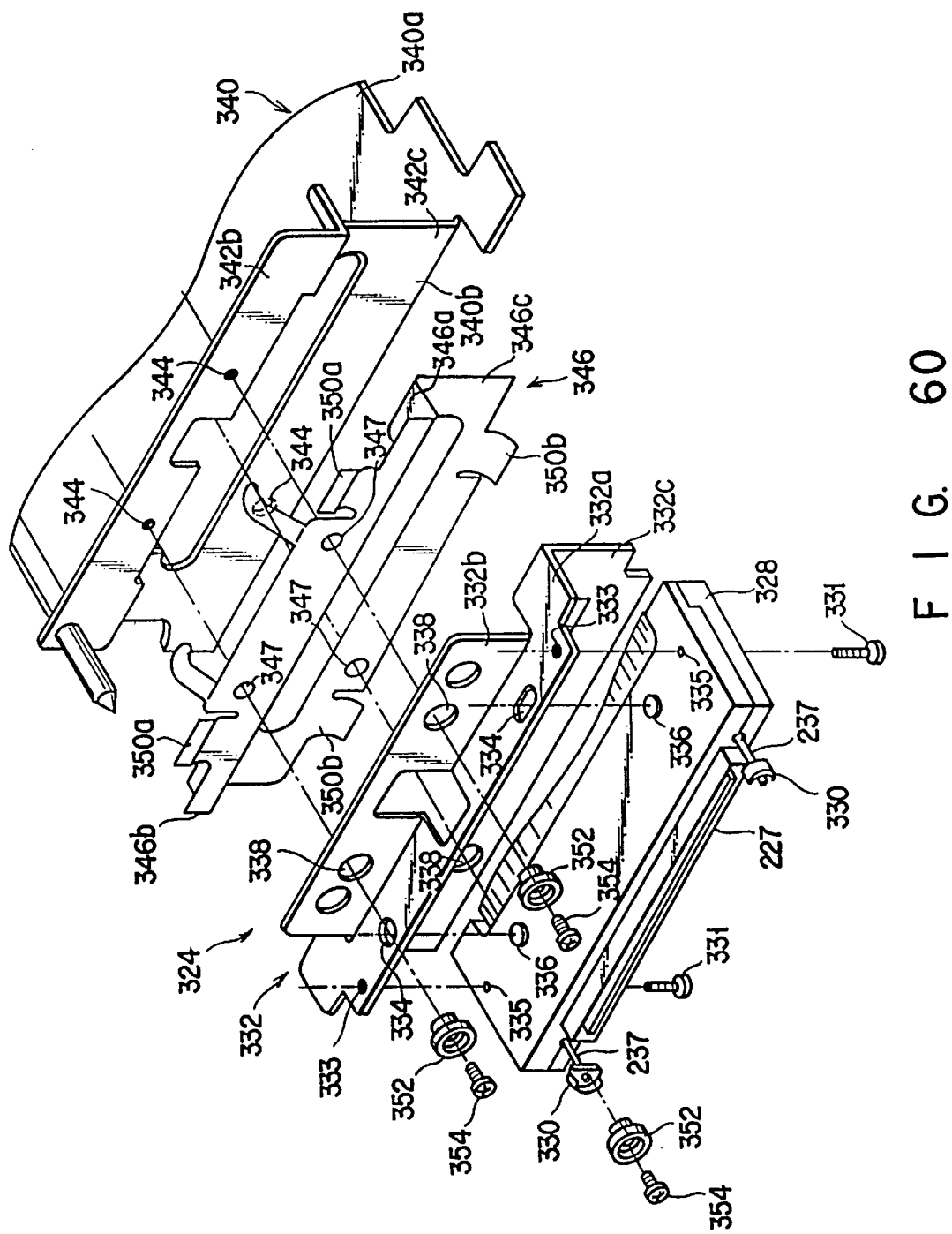
F I G. 60

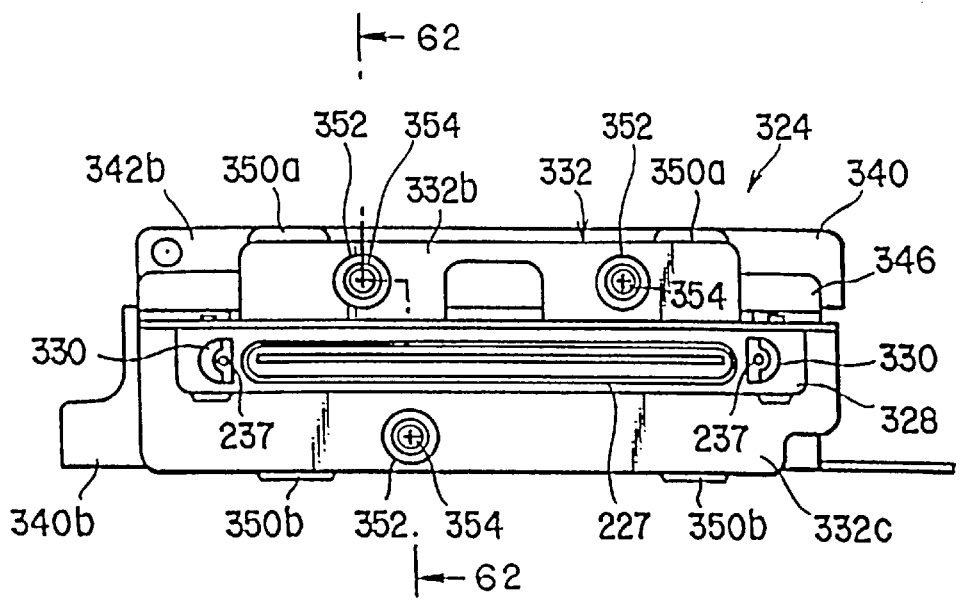
F I G. 61
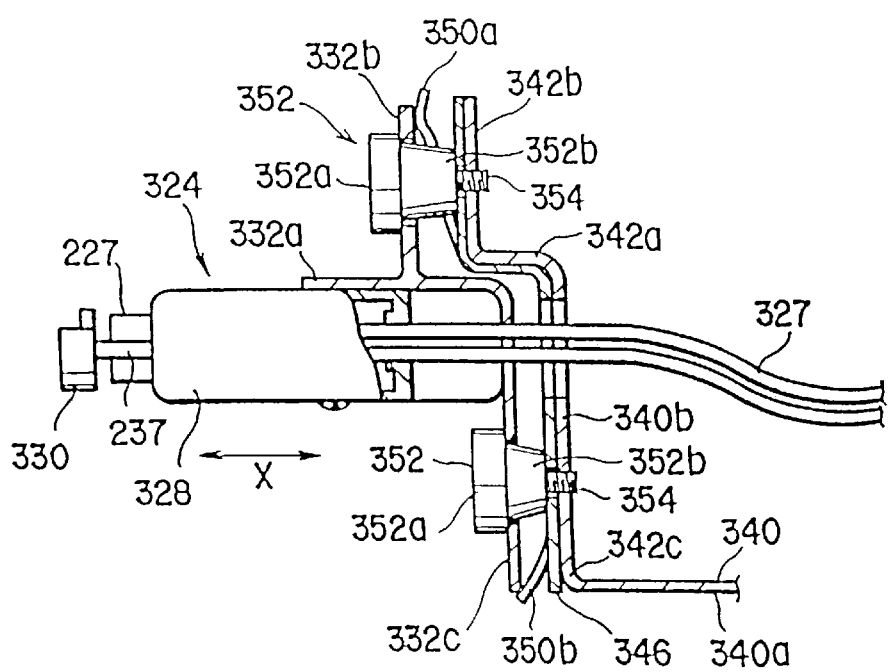
F I G. 62

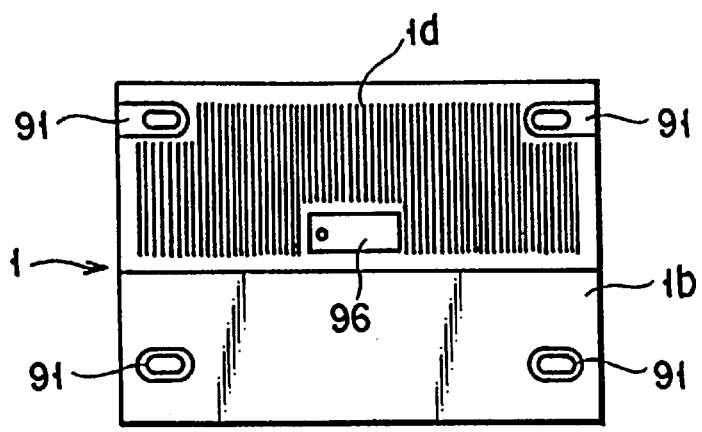
F I G. 64
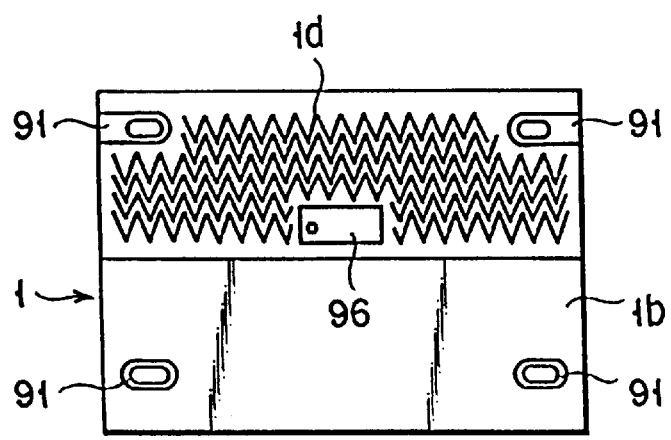
F I G. 65

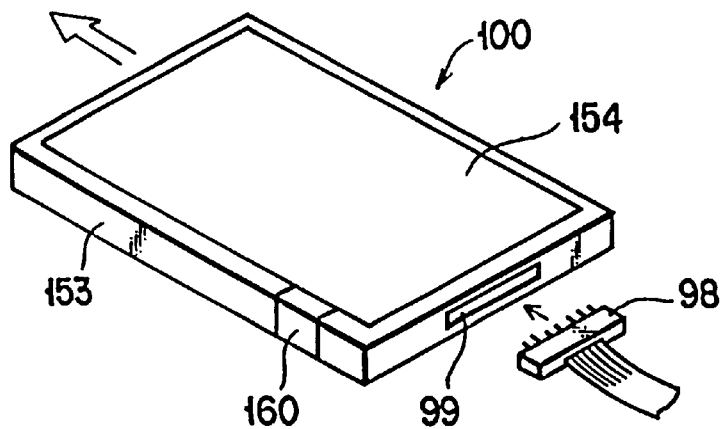
F I G. 69
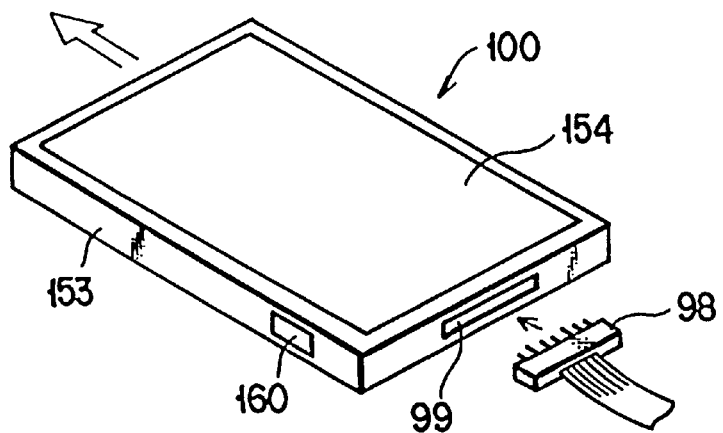
F I G. 70

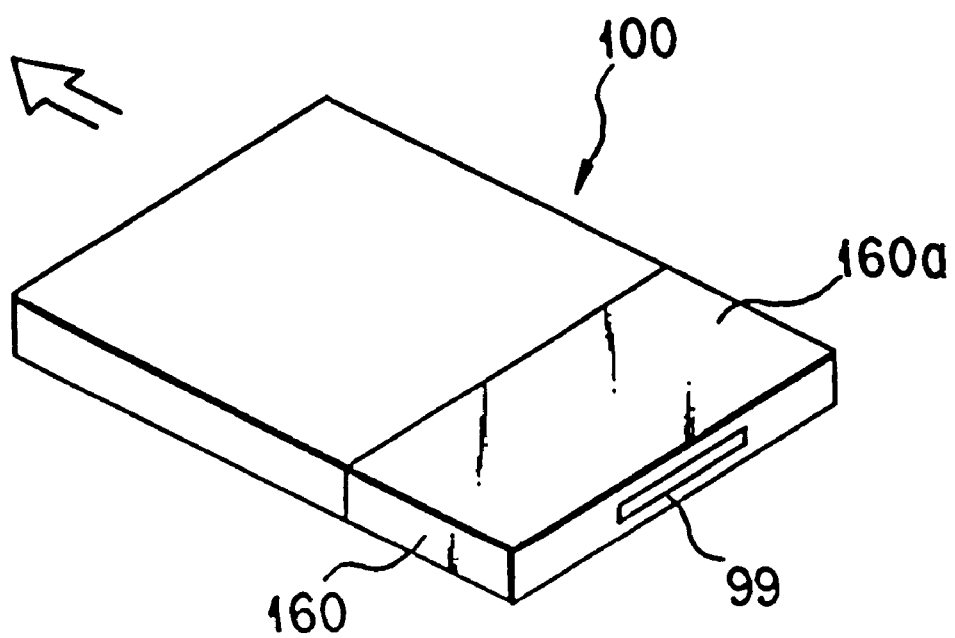
F I G. 71

ELECTRONIC APPARATUS WITH REINFORCED UPPER CASE

This is a continuation of application Ser. No. 08/394,229 filed on Feb. 24, 1995, which is a continuation of Ser. No. 08/158,888 filed on Nov. 19, 1993, which is a divisional of Ser. No. 08/118,481 filed on Sep. 8, 1993 now U.S. Pat. No. 5,316,491 which is a continuation of Ser. No. 07/900,974 filed on Jun. 18, 1992 (now abandonded).

BACKGROUND OF THE INVENTION

1. Field of the Invention

The present invention relates to electronic apparatuses, such as laptop personal computers, word processors, etc., card-type electronic components used with the electronic apparatuses, for the delivery of signals, e.g., data transmission, therewith, and electronic systems having an expanding apparatus for expanding the functions of the electronic apparatuses.

2. Description of the Related Art

Some of laptop personal computers can incorporate card-type electronic components, such as memory cards, modem cards, etc., which are adapted to be laterally inserted into the computer body, in order to expand their functions.

Generally, in the computers of this type, a card inlet slot is formed in a side face of the body, and a card storing section is formed in the body so as to communicate with the inlet slot. A card can be incorporated into the computer body by being inserted into the card storing section through the inlet slot.

The card must be taken out of the computer body when its use is finished or when it is to be replaced with another one. Cards are so thin, however, that they are not very easy to handle. Conventionally, therefore, computers use ejector mechanisms of the following three types.

Type 1: The size of the card storing section is adjusted so that incorporating the card is finished when the card is inserted to about half its length into the storing section. When the incorporation is finished, therefore, the rear portion of the card projects long outside the computer body. Thus, a user can remove the card by taking it out of the card storing section with the exposed or projecting portion of the card between his fingers.

Type 2: The card storing section formed in the computer body has a size large enough to receive the whole card. The storing section is arranged close and parallel to a side face of the computer body which extends at right angles to the body side face in which the card inlet slot is formed. Formed on this side face is a knob which is slidable in the loading direction of the card. The knob is connected with a card push-out mechanism in the card storing section. When the push-out mechanism is actuated in association with the sliding motion of the knob, the card in the storing section is pushed out of the body through the card inlet slot.

Type 3: The card storing section formed in the computer body has a size large enough to receive the whole card. Two recesses are formed individually at the opposite side face portions of the body which are adjacent to the opposite end sides of the card inlet slot of the card storing section. These recesses can receive the user's finger tips which are to hold and draw out an end portion of the card long from the storing section. Thus, the user can take out the card from the card storing section to the outside of the computer body by inserting his finger tips into the recesses, holding that portion of the card at the end portions of the inlet slot between the finger tips, and then drawing out the card from the body.

According to the card ejector mechanism of the first type described above, part of the loaded card projects long from the computer body, constituting a hindrance to the transfer of the computer. A laptop computer, which is a portable computer, may be carried with the card therein. In doing this, however, the projecting card is liable to interfere with some other parts, thus hindering the transfer of the computer.

In the card ejector mechanism of the second type, the card, which is housed in the computer body, is not a hindrance to the conveyance of the computer. Since the card is pushed out of the computer body by sliding the knob, however, the knob and the card storing section should be located adjacent to each other. According to this arrangement, therefore, the space for the incorporation of the card is inevitably restricted to the regions on either side of the computer body.

In the card ejector mechanism of the third type, as in the case of the second-type ejector mechanism, the card is not a hindrance to the conveyance of the computer. Since the recesses formed on the opposite end sides of the card inlet slot are large, however, the regions adjacent to the slot are occupied by the recesses. In the case of a laptop personal computer in which a dead space in its body is utilized for the incorporation of the card, therefore, the computer body must inevitably be increased in size.

With the progress of semiconductor technology, various card-type electronic components which are in conformity to the standards provided by, e.g., JEIDA (Japanese Electric Industry Development Association) have recently been developed and spread. The card-type electronic components include various cards, such as modem cards, which handle high-frequency signals. These components must be fully shielded. In conventional card-type electronic components, which are represented by memory cards, for example, grounding terminals are arranged only in an interface connector to be connected to the computer body. In this case, the ground contact area cannot be wide enough for satisfactorily antijamming.

Accordingly, it has been proposed that one such card-type electronic component should be designed so that flat shielding plates are arranged individually on the upper and lower surfaces of a card body, and are connected electrically to grounding contact pieces on the computer body to be loaded with the electronic component. When the electronic component is loaded into a card storing section of the computer body, the shielding plates are brought individually into direct contact with the grounding contact pieces, which are arranged above and below in the card storing section.

However, the above-described arrangement involves the following problems.

In the standardized card-type electronic components, the thickness of the card body is prescribed only with respect to its maximum value (e.g., 5.0 mm in the case of the standards Type II provided by JEIDA), so that it varies depending on the types of components, manufacturers, etc. In some of various kinds of cards, those portions which are to be in contact with the grounding contact pieces in the card holding section of the computer body are extremely different in thickness. In alternatively loading these various cards into the same card storing section, in particular, the following problems are aroused.

If a relatively thin card is used after prolonged use of a thicker card of which the thickness of the portions to be in contact with the grounding contact pieces in the card holding section is substantially equal to the prescribed maximum dimension, or if thick and thin cards are repeatedly used by turns, the grounding contact pieces fail to enjoy satisfactory contact with the shielding plates of the card, thus bringing about a non-contact or unstable contact state, due to reduction of the spring pressure of the grounding contact pieces. In such a case, the shielding effect of the card is ruined completely, or noises are liable to be produced due to unstable contact.

In loading into or unloading the card-type component from the card storing section, in the arrangement described above, moreover, the grounding contact pieces in the holding section slide individually on the upper and lower shielding plates of the card. As the contact pieces slide in this manner, the shielding plates and/or the contact pieces are shaven away to produce metallic powder. This metallic powder may possibly enter the computer body and cause wrong operation of the computer. In general, moreover, the upper and lower shielding plates of the card-type component are each in the form of a design plate bearing a coating, patterns, etc. for improved design properties, except for those conduction portions thereof which are brought into contact with the grounding contact pieces when the component is set in a predetermined position in the card storing section. When the card-type component is loaded into or unloaded from the card storing section, as mentioned before, however, design portions of the shielding plates are also brought into sliding contact with the grounding contact piece, so that removal of the coating or the like is caused. Since neither coating nor patterns are put on the conduction portions, moreover, the design properties of the card-type component may possibly be lowered.

Recently, there has been a demand for additional reduction in size of the computers of this type, for improved portability and handleability. To cope with this, each part of the housing of the computer is formed having a very thin wall. In this case, however, the strength of each part of the housing is so low that the housing wall may be deformed or distorted when it is subjected to an external force. In such a situation, the housing wall may possibly interfere with components in the housing, thereby damaging them. Display units of some computers contain an elongated fluorescent lamp with a relatively small diameter. If the wall portion of these units is deformed or distorted, however, there is a fear of the lamp being damaged.

Usually, moreover, one such computer comprises a keyboard. The dimensions of the keyboard constitute a primary factor essential to the reduction of the computer size. The keyboard comprises a rectangular printed board and a number of keys arranged lengthwise and crosswise on the printed board. Each key is in the form of a truncated pyramid. More specifically, each key has a rectangular top face, a rectangular bottom face wider than the top face, and four slanting side faces extending individually from the four side edges of the top face to their corresponding side edges of the bottom face so as to spread out downward. These keys are arranged at predetermined intervals, and constitute a key array having a rectangular outline as a whole.

The size (lengthwise and crosswise dimensions) of the key array, which determines the size of the keyboard, depends on the number of keys, the size of the key top face, and the intervals between the keys. If the ease of operation of the keyboard is taken into consideration, however, the minimum values of these dimensions are determined as a necessity, so that it is difficult to reduce the number of keys, top face size, and key intervals. Therefore, the keyboard dimensions cannot be made smaller than fixed values. Partly because of this, the size of the whole computer can be reduced only limitedly.

The personal computer of this type comprises a body, including upper and lower cases, and a display unit swingably mounted on the upper case. Usually, a driver circuit, control circuit, memory unit, etc. of the computer are arranged in the lower case of the body. In assembling these components, the upper case, fitted with the display unit, is joined to the lower case which is mounted with the driver circuit and other elements. In doing this, a signal cable led out of the display unit is connected to a connector of the control circuit mounted in the lower case.

In order to facilitate the connection of the signal cable of the display unit to the lower case, in joining the upper and lower cases together in this manner, the signal cable should be formed having some extra length. However, such an extra length portion of the cable is a hindrance to the internal arrangement of the computer body, and leading it about is a troublesome task. Therefore, an extra space for this extra length portion must be secured in the body. This entails difficult assembling operation and constitutes a hindrance to the miniaturization of the computer.

Electronic parts arranged in the computer body include high-performance integrated circuits, such as a CPU, VGA (variable gain amplifier) driver, etc., which act as superheating elements. In some cases, therefore, those wall portions of the body which are situated adjacent to these superheating electronic parts may be heated to a temperature of about 50° C. In general, the human body feels hot when exposed to a temperature of 40° C. or more. Accordingly, the personal computer is designed so that the superheating parts are arranged adjacent to the bottom wall of its body which normally is not accessible to the user's hands. In the case of a portable computer, however, the user should touch its bottom wall as he carries it about, and may harbor suspicion, feeling hot.

Heat from the superheating electronic parts may be screened by arranging a shielding plate between the parts and the body wall portions. In this case, however, the whole computer is inevitably large-sized, and its portability is low.

In general, the computer of this type enjoys a compact design which ensures higher portability and a minimized desk setting area. Therefore, the functions of the computer itself are limited. If additional functions other than standard functions are required, the computer is connected to an function expanding apparatus before use. Conventionally, the computer and the expanding apparatus are connected to each other by means of connectors for transferring data. However, the connection only by means of the connectors cannot provide a satisfactory fixing strength. The connectors may be easily disengaged due to an impact or the like produced during the operation of the computer, thus resulting in contact failure or some other trouble.

Recently, there have been provided an expanding apparatus having a mounting section on which the whole body of a computer can be mounted. Expanding apparatuses disclosed in U.S. Pat. Nos. 4,769,764 and 4,903,222, for example, comprise a housing which contains expansion means, including a hard disk drive, circuit board for storage, etc. The housing is formed having a mounting recess which corresponds to the computer in size. The computer is releasably fitted into the mounting recess from above or from the front. A plug-in connector for the connection to the expanding apparatus is disposed on the rear face of the computer. When the computer is set in the mounting recess, this connector is fitted into another plug-in connector attached to the mounting recess of the apparatus. Thus, the computer and the expanding apparatus are connected electrically to each other.

The mating force of the connectors is great enough to secure the connection between the computer and the expanding apparatus. Removing the computer from the mounting recess requires a greater force than this mating force. Accordingly, the computer cannot be easily detached from the mounting recess by hand, so that handling the system costs much labor.

The mounting recess is open to the front of the housing of the expanding apparatus, as well as to the top side. In detaching the computer, therefore, its front end portion may possibly be unexpectedly raised even though the connectors are not disengaged. In such a case, the computer is urged to rock upward around the junction between the connectors, so that the connectors are wrenched. As a result, an unreasonable force is applied to the connectors, thereby breaking them down.

Such breakdown of the connectors may be prevented by designing the connector on the mounting recess side for vertical oscillation.

According to this arrangement, however, a space for the oscillation of this oscillating connector must be secured around it, and high-frequency noises, which are produced by the expanding apparatus, leak out through this space, thereby possibly inducing communication jamming.

Further, lead wires connecting the oscillating connector and a printed board in the housing should be lengthened by a margin for the rocking motion of this connector. Accordingly, the wiring operation is troublesome, and the wire arrangement in the housing is complicated.

If the computer is displaced by an external force, with the connectors connected to each other, the connectors may possibly be damaged. Conventionally, therefore, the connector on the expanding apparatus side is arranged so as to be shiftable in the vertical and crosswise directions, that is, in the directions perpendicular to the direction of engagement between the connectors. By this arrangement, the displacement of the computer can be absorbed, so that the connectors can be prevented from being damaged. In the conventional expanding apparatus, however, the connector is immovable in the longitudinal direction or in the connector engaging direction, although it is shiftable in the vertical and crosswise directions. If the computer is subjected to a longitudinal external force while it is connected to the expanding apparatus, therefore, the connectors may possibly be disengaged from each other. In such a case, the computer behaves wrongly, so that in-process data may be destroyed, or the computer system may be damaged.

SUMMARY OF THE INVENTION

In view of these circumstances, it is therefore an object of the present invention to provide an electronic apparatus wherein a card-shaped electronic device can be stored without projecting outward and easily removed from a body of the apparatus, and wherein a card storing section can be formed any position in the body without enlarging the size of the body.

In order to achieve above object, the apparatus according to the present invention comprises: a box-shaped body; a card-shaped electronic device to be loaded in the body; an operating opening portion formed by cutting an edge of the body to a given size and externally accessible by a finger; a card storing section formed in the body and having an inlet opening open to the operating opening portion, for storing the card-shaped electronic device inserted through the inlet opening; and an ejection mechanism for ejecting the card-shaped electronic device from the card storing section; said ejection mechanism including:

a card receiver arranged within the card storing section, for receiving the card-shaped electronic device inserted through the inlet opening, the card receiver having a pressing portion for abutting against a front end of the card-shaped electronic device received by the receiver and being movable in an insertion direction of the card-shaped electronic device between a first position wherein the card-shaped electronic device received by the receiver is stored in the card storing section and a second position wherein a rear end portion of the card-shaped electronic device received by the receiver projects outward from the inlet opening and the operating opening portion; a drawer member attached to the receiver and movable in the insertion direction between a pushed-in position and a drawn-out position, the drawer member having an operating end portion allowing a finger to be hooked, the operating end portion being located within the operating opening portion when the drawer member is moved to its pushed-in position while the card receiver is in its first position and outwardly projecting through the operating opening portion when the drawer member is moved to its drawn-out position while the card receiver is in its first position; and connecting means for engaging the card receiver and the drawer member when the drawer member is moved to the drawn-out position so as to move the card receiver from the first position to the second position in accordance with the movement of the drawer member from the drawn-out position toward the inlet opening.

With the electronic apparatus having a configuration as described above, a card shaped electronic device can be set in position in the apparatus by simply holding the device with fingers, moving it into the card storing section through the inlet port thereof and pushing the rear end of the device until the entire device is received by the card storing section, when the rear end of the drawer member is found within the operating opening portion. Under this condition, the card-shaped electronic device is set in position in the body and ready for use.

For replacement of the card-shaped electronic device or otherwise when it is no longer in use, it can be moved out of the card storing section by putting a finger in the opening portion, applying it as a hook to the handle located in the opening portion and pulling the handle out of the body.

Under this condition, the drawer member is also pulled out of the body to its pulled-out position and moved away from the card storing section so that an extreme portion of the drawer member, which is now outside the body for exposure, can be held by fingers.

Then, the drawer member can be moved out of the body by holding its exposed extreme portion with fingers and pulling it away from the body. Now, the card receiver is moved to the opening portion along with the drawer member. Since the pressing members of the card receiver abut the front end of the card-shaped electronic device under this condition, the rear end of the latter is pushed out through the inlet port to the opening portion as the card receiver is pulled out. When the card-shaped electronic device is moved out to a given position where it can be held by fingers, the movement of the card receiver is suppressed so that the card-shaped electronic device may be taken out of the card storing section.

It may be needless to say that, under this condition, the card-shaped electronic device can be taken out of the card storing section by simply holding its rear end and pulling it with fingers. In other words, the rear end of the drawer member that has not been not visible from outside can be pulled out by a first pulling operation and then the rear end of the card shaped electronic device housed in the card storing section can be pulled out of the body by a second pulling operation. When a card-shaped electronic device is mounted in position in the main-body, it is completely housed in the card containing section along with the card receiver so that the rear end of the drawer member is located within the opening portion and, therefore, the card-shaped electronic device is not exposed nor visible from outside. Namely, a portable electronic apparatus according to the invention can be carried by a user with a card-shaped electronic device housed in it without any risk of being damaged. Additionally, since the ejector mechanism is not functionally related with the external control keys and knobs arranged on the portable electronic apparatus and does not require any locational selection for operation, the portable electronic apparatus is less restricted for operation in terms of placement. Finally, the fact that no space is required along the lateral sides of the access aperture to provide easy access to the inside of the card containing section allows the body of the electronic apparatus to be made very compact.

It is another object of the present invention to provide a card-shaped electronic device used with an electronic apparatus according to the invention, which can be securely shielded and protected against any adhesion of harmful metal particles and damages that may be brought forth on the surface of the device when it is moved into or away from the electronic apparatus.

According to the present invention, the above object is achieved by providing a card shaped electronic device comprising: a rectangular flat box-like main-body to be inserted into and taken out of the portable electronic apparatus in a given insertion direction, the main-body having a pair of lateral sides extending in the insertion direction; a pair of shield plates fixed to the main-body to cover the upper and lower surfaces of the main-body; and a conductive portion arranged on the lateral side of the main-body and electrically connected to the shield plates, for conducting the shield plates with the electronic apparatus when the main-body is loaded in the electronic apparatus.

In a card-shaped electronic device having a configuration as described above, since the conductive section of the device for electrically connecting the shield plates to an electronic apparatus is arranged along the lateral sides of the body, the shield plates are not touched nor abraded by the related contact terminals of the apparatus in which the card-shaped device is mounted. Therefore, generation of fine metal particles due to abrasion of the shield plates is non-existent. If the shield plates are decorated, the decoration may not be damaged nor removed because no abrasion takes place there. Even if a card-shaped electronic device is used with card main-bodies having different heights, the conductive section ensures a secure electric connection between the device and the related contact terminals of the portable electronic equipment in which the device is mounted and a reliable shield effect is provided by the shield plates.

It is still another object of the present invention to provide an electronic apparatus of the above described type which is light weight and has reduced dimensions while maintaining a required level of sturdiness.

According to the present invention, the above object is achieved by providing an electronic apparatus comprising: a flat box-like body; and a display rotatably mounted on the body. The display includes a display main-body having a substantially rectangular bottom case, and a cover attached to the bottom case with a given space therebetween and having an opening; a flat plate-like liquid crystal display section arranged within the display main-body and opposite to the opening; and an elongated fluorescent lamp for illuminating the liquid crystal display section, the fluorescent lamp being arranged within the display main-body and extending along a lateral edge of the display section. The display main-body includes a rib projecting from the inner surface of the bottom case toward the cover and extending along the fluorescent lamp to protect the fluorescent lamp, the rib having a height of projection greater than a diameter of the fluorescent lamp.

With an arrangement as described above, the fluorescent lamp is protected against any possible damages by said rib even if the bottom case and/or the cover of the display main-body is deformed by external force so that the bottom case and the cover may be made considerably thin to make the overall dimensions and weight of the portable electronic equipment rather small.

It is still another object of the present invention to provide an electronic apparatus having a keyboard with considerably reduced dimensions to make the equipment itself rather small.

According to the present invention, the above object is achieved by providing an electronic apparatus comprising a flat box-like body; and a keyboard arranged on the body. The keyboard has a number of keys arranged with predetermined intervals to constitute a key array having a substantially rectangular outline as a whole, each of the keys, except those ones which constitute the outermost lines of the key array, having a rectangular top face and four slanting faces which extend obliquely from the respective sides of the top face with a predetermined angle to the top face so as to spread downward, and each of the keys, which constitute the outermost lines, having a rectangular top face and four slanting faces obliquely extending downward from the respective sides of the top face with the predetermined angle to the top face except for the slanting surface on the outline of the key array, the tilt angle of the slanting face on the outline of the key array being greater than the predetermined angle.

With such an arrangement, the key arrangement area can be reduced for a certain number of keys without reducing the area of the top surfaces of the keys and the space separating any adjacent keys, or, in other words, without adversely affecting the operability of the key board.

It is still another object of the present invention to provide an electronic apparatus with a sufficiently short signal cable extending from a display unit so that the electronic apparatus may be set up for use with utmost ease and have a minimum requirement for space in the body of the apparatus.

According to the present invention, the above object is achieved by providing an electronic apparatus comprising: a body provided with upper and lower cases, and a display rotatably mounted on the upper case. All the electronic components such as drive circuits, control circuits and memory devices housed in the body are fixed to the upper case.

With such an arrangement, since the display and the electronic components are fitted to the upper case, the signal cable of the display unit can be connected to a corresponding control circuit to set up the equipment for use with the lower case removed from it so that the length of the signal cable may be minimized.

It is still another object of the present invention to provide an electronic apparatus which is free from uncomfortable high temperature that can be generated by heat-radiating electronic parts of the equipment so that it may not damage the feeling of comfort and reliability on the side of the user.

According to the present invention, the above object is achieved by providing an electronic apparatus provided with a number of projections arranged on the outer wall surface of the body located adjacent to those heat-radiating electronic parts, said projections being densely disposed to prevent the user from directly touching said outer wall surface.

With such an arrangement of projections, the user can touch only the top areas of the projections and is prevented from directly touching the heated outer wall surface even if said outer wall surface is heated to high temperature. Thus, the area of the hands of the user with which he or she touches the heated wall surface of the electronic apparatus is minimized and the feeling of comfort and reliability on the side of the user is ensured particularly in terms of temperature. Besides, since no partitions are required for thermal insulation within the body, the apparatus for compactness of the body can be easily met.

It is still another object of the present invention to provide an electronic system comprising an electronic apparatus and capable of securely connecting the electronic apparatus with an expanding apparatus and easily releasing the connectors used to establish such a connection.

According to the invention, the above object is achieved by providing an electronic system comprising: an electronic apparatus including a box-like body which has a rear surface provided with a first connector and a pair of lateral side faces having engaging portions, respectively; and an expanding apparatus for expanding the functions of the electronic apparatus. The expanding apparatus comprises: a body case having a bearing surface on which the electronic apparatus is placed and a connector setting surface opposing the rear surface of the electronic apparatus placed on the bearing surface; a second connector provided on the connector setting surface, for being removably connected to the first connector as the body of the electronic apparatus is slidingly moved to a predetermined connecting position on the bearing surface; expanding means disposed within the body case and connected to the second connector, for expanding the functions of the electronic apparatus; an ejection mechanism for pushing the rear surface of the body so as to disconnect the first connector from the second connector, the mechanism including a push lever which is arranged in the body case adjacent to the second connector and is movable between a pushing position where the lever projects outward from the connector setting surface and a retrieved position where the lever is retreated within the body case; a lock mechanism for locking the body of the electronic apparatus in the connecting position, the lock mechanism comprising a pair of fixing members disposed near respective lateral ends of a front end portion of the body case, each of the fixing members being movable between a locking position where the fixing member engages with the corresponding engaging portion of the body and a release position where the fixing member is disengaged from the engaging portion; and an interlocking mechanism for interlocking the operations of the ejection mechanism and the locking mechanism so that the fixing members are moved to the locking position as the push lever is moved to the retreated position and the fixing members are moved to the release position as the push lever is moved to the pushing position.

With a system having a configuration as described above, the electronic apparatus body can be mounted on the expanding apparatus by placing said electronic apparatus body on the mount plane of the function expanding apparatus and slidingly moving said electronic apparatus body rearwardly toward the second connector. As the electronic apparatus body gets to a predetermined connecting position on the mount plane, the first and second connectors come into mutual engagement to electrically connect the electronic apparatus body and the function expanding apparatus.

Once the electronic apparatus body has reached to its connection position, the anchor claws are forced to project toward the body and made to engage with the respective sections near the lateral ends of the front side of the body by operating the interlocking mechanism. Under this condition, the body is held to its predetermined proper position on the mount plane by the mutual engagement of the anchor claws and the corresponding respective sections of the front side of the body and that of the first and second connectors at the rear side of the body.

The electronic apparatus body can be removed from the function expanding apparatus by operating the interlocking mechanism to release the anchor claws from the body. The releasing movement of the anchor claws is transmitted to the pusher lever by means of the interlocking mechanism so that the pusher lever is caused to project toward the electronic apparatus body and push the body from the rear side. Thus, the body is moved forward on the mount plane until the first and second connectors are disengaged from each other without requiring any manual operation to physically separate the connectors, making the function-expanding apparatus extremely easy to operate for removing the electronic apparatus body from it. Moreover, since the front end of the body is not lifted for removing it away from the function-expanding apparatus, the connectors are free from any undesirable stress and protected against unintended damage.

With the above described arrangement, the second connector on the function-expanding apparatus does not need to be made vertically swingable for ease of connection with the first connector, meaning that no extra space is required around it to allow swinging motion of the second connector and that high frequency noises generated by the function-expanding apparatus can be effectively prevented from leaking outside.

In a preferred embodiment of the electronic system, a pair of pusher lever are provided on the respective lateral sides of the second connector. With such an arrangement, since the pusher levers pushes the rear side of the electronic apparatus body at two locations, the body can be always pushed out squarely without taking any inclined or biased posture even when the first connector is arranged off the center of the rear side of the body to ensure safe engagement and disengagement of the connectors and protect the connectors against any undesirable stress so that the electronic apparatus body can be smoothly fitted to and removed from the function-expanding apparatus at any time.

In this preferred embodiment of the electronic system, the function-expanding apparatus is provided with a metal terminal for grounding that is interlocked with the interlocking mechanism to come out from or go back under the mount plane. With such an arrangement, the metal terminal for grounding retreats under the mount plane when the electronic apparatus body is placed and slidingly moved on the mount plane so that it may not be hit nor scraped by the bottom of the body and, therefore, both the metal terminal and the bottom of the body are protected against deformation and damage while the electronic equipment is grounded by way of the electronic equipment.

An function-expanding apparatus of an electronic system according to the invention alternatively comprises a body case having a bearing surface for bearing the electronic apparatus; a second connector provided on the body case to face the rear surface of the body of the electronic apparatus, placed on the bearing surface and adapted to be releasably connected with the first connector when the body is moved to a predetermined connecting position on the bearing surface; expanding means arranged within the body case and connected to the second connector, for expanding the functions of the electronic apparatus; an fixing member arranged on the body case and movable between a projected position wherein the fixing member engages the engaging portion of the body of the electronic apparatus located at the connecting position so as to restrict the movement of the body and a retreated position wherein the fixing member is disengaged from the engaging portion of the body; urging means for urging the fixing member to the projected position; and a lock mechanism for locking the fixing member at the projected position.

It is still another object of the present invention to provide a function expanding apparatus used for an electronic apparatus according to the invention that can effectively protect the connectors of the apparatus and the electronic apparatus even when the electronic apparatus is subjected to external force while it is mounted on the function-expanding apparatus and prevent the connectors from being unintendedly disengaged from each other.

According to the present invention, the above object is achieved by providing a function-expanding apparatus comprising a main body having a bearing section for bearing the electronic apparatus and expanding means for expanding the functions of the electronic apparatus; a plug-in type connector provided on the body case and electrically connected to the expanding means, for removably receiving a matching plug-in type connector of the electronic apparatus loaded on the bearing section; and a support assembly for supporting the connector of the expanding apparatus to allow the connector of the expanding apparatus to move in a direction for engaging and disengaging from the connector of the electronic apparatus.

In a preferred embodiment of the function expanding apparatus, the support means comprises a connector holder to which the connector of the body is securely held, a support member for movably supporting said connector holder to make said connector holder move in said direction of engagement and disengagement between a stand-by position and a pushed-in position and urging means for urging the connector holder securely held by said body toward said stand-by position.

In this preferred embodiment, the support member is provided with a plurality of guide holes and a plurality of guide sleeves extending from said main body in said direction of engagement and disengagement and running through the respective guide holes. Each of said guide sleeves has a base section rigidly fitted to said main-body and a tip portion extending from said main body and is provided with a stopper for abutting the connector holder in its stand-by position to limit the movement of the latter. With a function-expanding apparatus having a configuration as described above, when the electronic equipment is subjected to external force particularly in the direction along which the connector of the electronic apparatus is released from that of the body while the electronic apparatus is mounted on the bearing section of the apparatus and the two connectors are mutually engaged with each other, the connector of the body is displaced with its counterpart of the electronic apparatus in said direction of release. Consequently even when the electronic apparatus is subjected to external force as described above, the connector of the electronic equipment would not unintendedly come out of its counterpart of the function expanding apparatus so that the systems in the electronic apparatus are protected against damage and the data being processed in the equipment would not be destroyed.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 1 through 34 show a first embodiment of a personal computer according to the present invention as well as a card-shaped electronic device and an expanding apparatus for expanding functions of the computer, in which:

FIG. 1 is a perspective view of the personal computer and the card shaped electronic device shown separately;

FIG. 2 is an exploded perspective view of the embodiment whose display cover is taken away;

FIG. 3 is an enlarged perspective view of an arrangement around a fluorescent lamp used as a back light for the display of the embodiment;

FIG. 4 is an exploded perspective view of arrangement around the fluorescent lamp of FIG. 3;

FIG. 5 is a sectional view of the arrangement around the fluorescent lamp of FIG. 3 taken along line 5—5;

FIG. 6 is an enlarged perspective view of a latch mechanism used for locking and unlocking the display;

FIG. 7 is an exploded perspective view of the latch mechanism;

FIG. 8 is a sectional view of the latch mechanism of FIG. 6 taken along line 8—8 of the sectional view of FIG. 9;

FIG. 9 is a sectional view of the latch mechanism of FIG. 6 taken along line 9—9;

FIG. 10 is a perspective view of the computer of FIG. 1 showing its bottom side;

FIG. 11 is an exploded perspective view of the computer of FIG. 1 whose lower case is removed;

FIG. 12 is an exploded perspective view of the computer of FIG. 1 whose components fitted to its upper case are moved away to show only the components disposed between an insulation sheet and the lower case;

FIG. 13 is an exploded perspective view of the computer of FIG. 1 showing the components disposed between the upper case and the insulation sheet;

FIG. 14B is a partially broken front view of the computer;

FIG. 15 is a perspective view of a memory card;

FIG. 16 is an exploded perspective view of the memory card;

FIG. 17 is an enlarged and exploded perspective view of a conductive section of the memory card;

FIG. 18 is a perspective view of an interface card;

FIG. 19 is a perspective view of a card ejector mechanism;

FIG. 20 is an exploded perspective view of the card ejector mechanism;

FIG. 21 is a perspective view of the card ejector mechanism with a card inserted therein;

FIG. 22 is a perspective view of the card ejector mechanism whose drawer member is pulled out;

FIG. 23 is a perspective view of the card ejection mechanism under a condition where the rear end of a card is pulled out of the main body of the computer as the card mount of a card receiver is moved from its proper position;

FIG. 24 is a perspective view of the expanding apparatus for expansion together with the personal computer;

FIG. 25 is an enlarged sectional view of a fixing claw of the expanding apparatus;

FIG. 26 is a perspective view of a slide lever and a key cylinder of a lock mechanism of the expanding apparatus;

FIG. 27 is a plan view of the lock mechanism with the upper case partly broken;

FIG. 28 is a schematic perspective view of the slide lever and the key cylinder of the lock mechanism showing the positional relationship between them when the key cylinder is released;

FIG. 29 is a schematic perspective view similar to FIG. 28 but showing the positional relationship between the slide lever and the key cylinder when the key cylinder is locked;

FIG. 30 is a rear view of the personal computer;

FIG. 31 is a schematic partial plan view showing a state wherein a leg of the computer is about to abut the fixing claw;

FIG. 32 is a schematic partial plan view similar to FIG. 31 but showing a condition where the leg abuts the fixing claw;

FIG. 33 is a schematic partial plan view similar to FIG. 31 but showing a condition where the leg is locked by the fixing claw; and FIG. 34 is a schematic partial front view showing a condition where the leg is locked by the fixing claw;

FIGS. 35 through 58 show an expanding apparatus according to a second embodiment of the invention and a personal computer used with the expanding apparatus, in which:

FIG. 35 is a perspective view of the expanding apparatus and the personal computer;

FIG. 36 is a rear view of the personal computer;

FIG. 37 is a view schematically showing guide faces of the personal computer;

FIG. 38 is a view schematically showing the structure of guide rails of the expanding apparatus;

FIG. 39 is a front view of the second connector of the expanding apparatus;

FIG. 40 is a sectional view of the expanding apparatus, showing pusher levers, rock arms and interlocking mechanism;

FIG. 41 is a sectional view taken along line 41—41 of FIG. 40;

FIG. 42 is a sectional view showing the positional relationship between one of the pusher lever and the corresponding rock arm when an operation plate is moved to its engaged position;

FIG. 43 is a sectional view showing the positional relationship between the other pusher lever and the corresponding rock arm when the operation plate is slidingly moved to its engaged position;

FIG. 44 is a sectional view showing the positional relationship between one of the pusher lever and the corresponding rock arm when the operation plate is slidingly moved to its released position;

FIG. 45 is a sectional view showing the positional relationship between the other pusher lever and the corresponding rock arm when the operation plate is slidingly moved to its released position;

FIG. 46 is a sectional view taken along line 46—46 of FIG. 43;

FIG. 47 is a sectional view taken along line 47—47 of FIG. 49;

FIG. 48 is a sectional view taken along line 48—48 of FIG. 43;

FIG. 49 is a lateral view of the expanding apparatus as viewed along line 49 of FIG. 40;

FIG. 50 is a sectional view taken along line 50—50 of FIG. 42;

FIG. 51 is a sectional view taken along line 51—51 of FIG. 43;

FIG. 52 is a plan view of a grounding terminal unit;

FIG. 53 is a plan view of a terminal metal fitting having a spring section;

FIG. 54 is a sectional view showing a state wherein the grounding terminal unit is fitted to the bearing plane;

FIG. 55 is a sectional view showing that the terminal metal fitting of the grounding terminal unit is retracted to the terminal hole;

FIG. 56 is a sectional view showing that the terminal metal fitting of the grounding terminal unit is projecting out of the terminal hole;

FIG. 57 is a sectional view showing that the terminal metal fitting of the grounding terminal unit is retracted to the terminal hole as viewed from an angle different from that of FIG. 55; and FIG. 58 is a sectional view showing that the terminal metal fitting is projecting out of the terminal hole as viewed from an angle different from that of FIG. 56;

FIGS. 59 through 63 show an alternative support assembly for supporting the connector of the expanding apparatus according to the invention, in which:

FIG. 59 is a perspective view showing a rear side of a personal computer and the support assembly;

FIG. 60 is an exploded perspective view of the support assembly;

FIG. 61 is a front view of the support assembly;

FIG. 62 is a sectional view taken along line 61—61 of FIG. 61; and

FIG. 63 is a sectional view of the support assembly and the personal computer connected to each other by means of the connectors;

FIG. 64 is a bottom view of a personal computer provided with projections according to a first modification of the invention;

FIG. 65 is a bottom view of a personal computer provided with projections according to a second modification according of the invention;

FIG. 69 is a perspective view of an interface card according to first modification of the invention;

FIG. 70 is a perspective view of an interface card according to a second modification of the invention; and FIG. 71 is a perspective view of an interface card according to the invention.

DETAILED DESCRIPTION OF THE PREFERRED EMBODIMENTS

Preferred embodiments of the present invention will now be described in detail with reference to the accompanying drawings.

Figure 1:
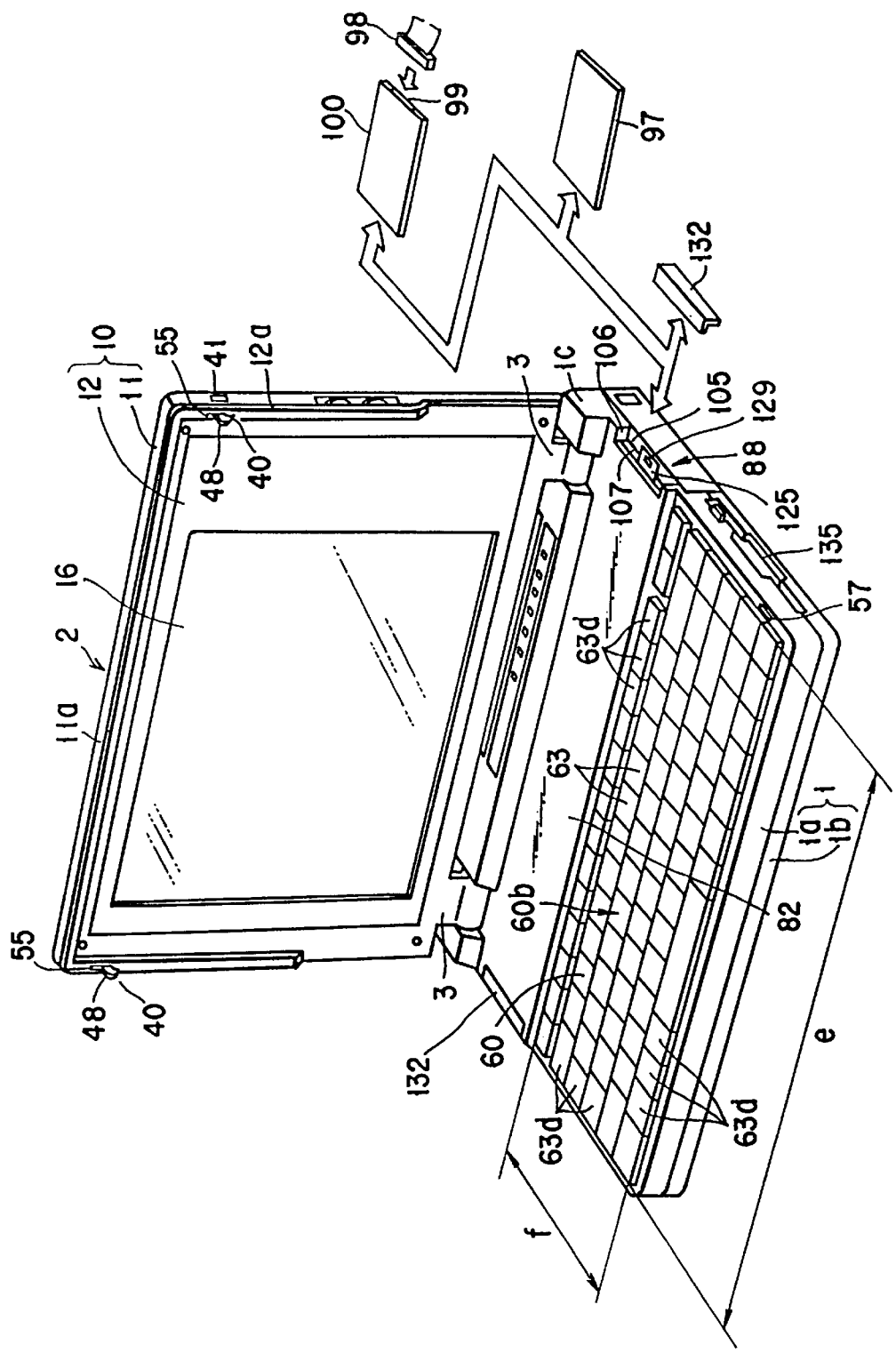
Figure 23:
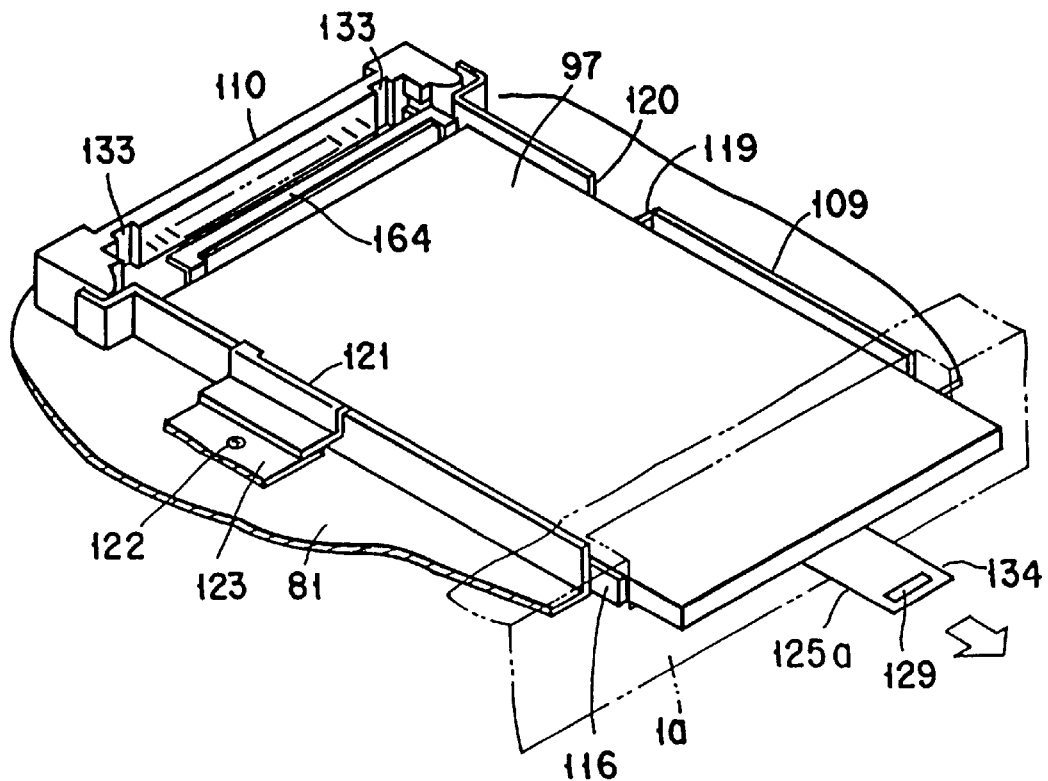

FIGS. 1 and 23 show an embodiment in which a portable electronic apparatus according to the present invention is applied to a laptop personal computer by way of example. As shown in FIG. 1, the computer comprises a body 1 in the form of a flat box and a flat display 2. The body 1 is a combination of upper and lower plastic cases 1a and 1b which are plated inside (not shown) for shielding. The display 2 is swingably mounted on a stepped portion 1c, which is formed at the rear portion of the top face of the body 1, by means of a pair of legs 3. A keyboard 60 is arranged on the front portion of the top face of the body 1.

The construction of the display 2 is illustrated in FIGS. 1 to 9. The display 2 has a very thin, rectangular body 10, which includes a plastic bottom case 11 in the form of a flat box and a plastic cover 12 in the form of a rectangular frame and fixed to an opening portion of the bottom case. Both the bottom case 11 and the cover 12 are plated inside (not shown) for shielding. An opening portion 12b of the cover 12 is biased a little to the right. A peripheral edge portion of the cover 12, which extends continuously from the middle of each side edge portion to the upper edge portion of the cover, projects forward, and constitutes a U-shaped stepped portion 12a.

Figure 13:
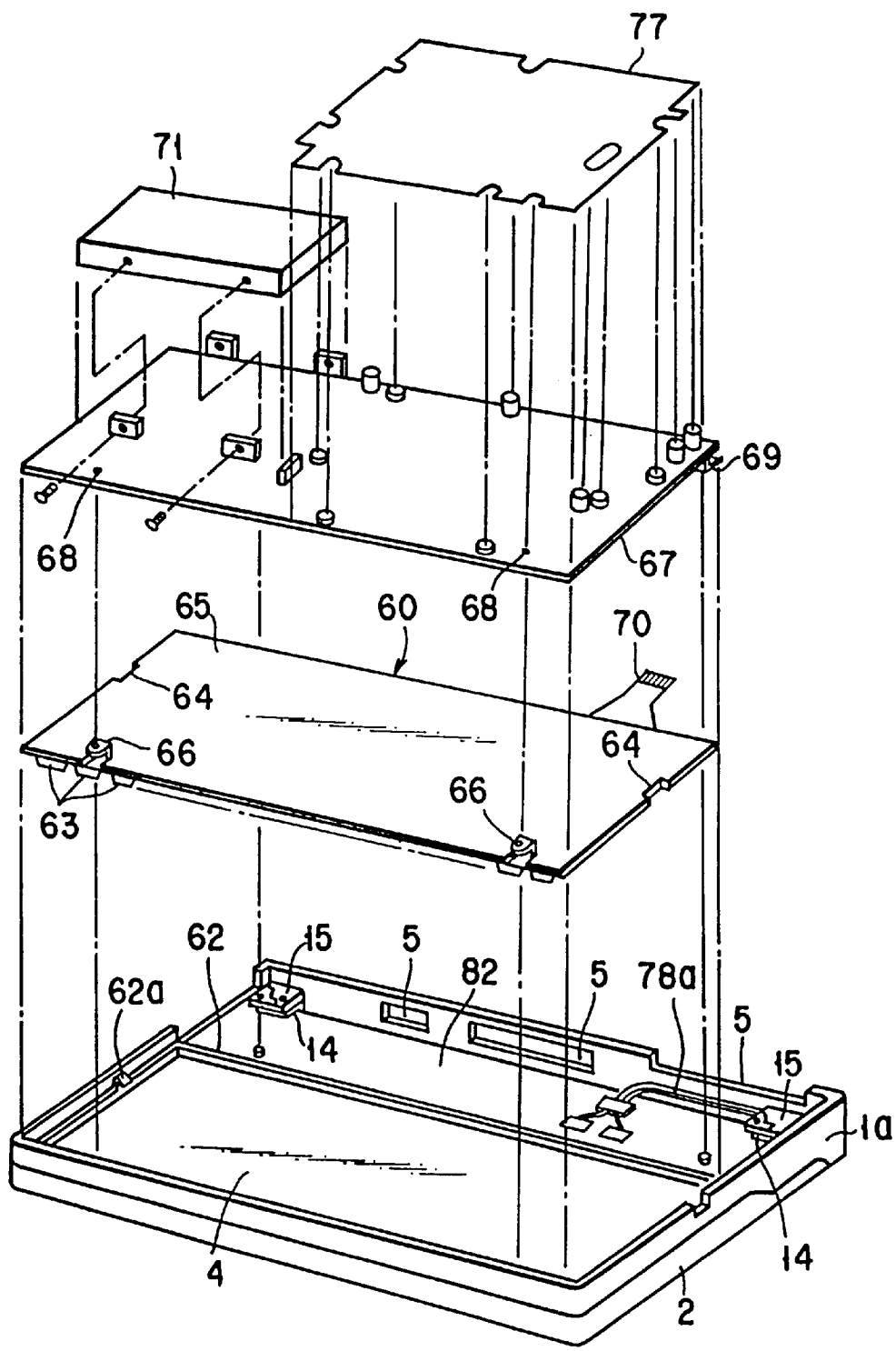

Two-piece divided casing halves 13a and 13b, which constitute each leg 3, protrude from each side of the respective lower portions of the bottom case 11 and the cover 12. Hinge members (not shown), which are contained individually in the legs 3, are connected to supporting portions 14 (shown in FIG. 13 only), which are arranged inside the stepped portion 1c of the body 1, thereby supporting the display 2 for swinging motion. In FIG. 13, numeral 15 denotes a connecting piece of each hinge member.

Figure 5:
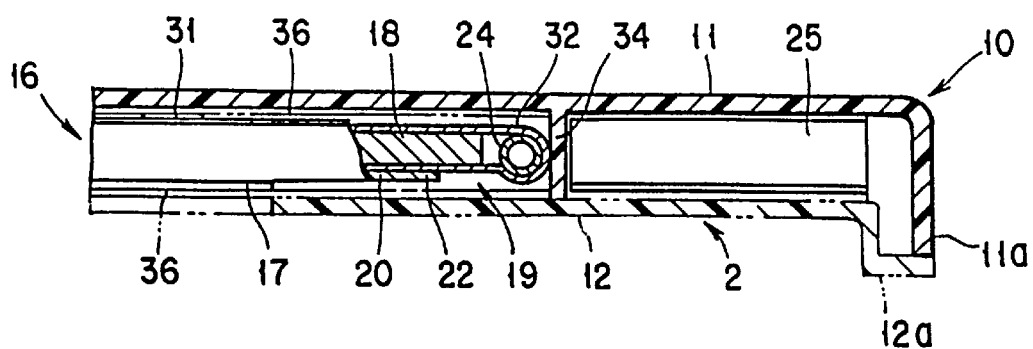
Figure 6:
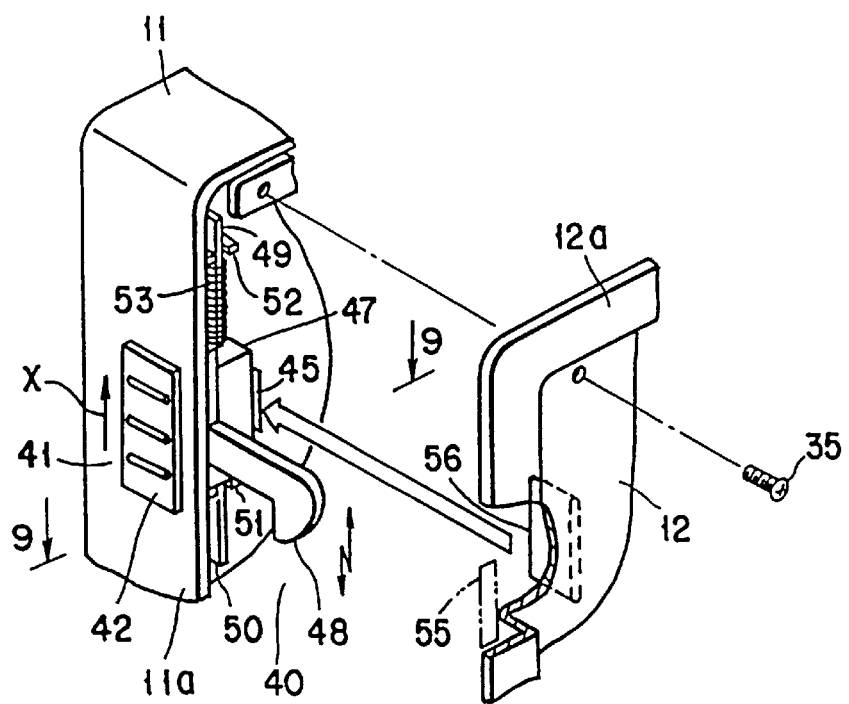

A display device 16 with a back-light is contained in the body 10 of the display 2. As shown in FIG. 4, the display device 16 includes a display unit 19, a pair of drive units 20, a pair of sockets 23, and a fluorescent lamp 24. The display unit 19 has a liquid crystal display section 17, e.g., in the form of a plate, and a plate-shaped light guide member 18 (shown in FIG. 5 only) put on the rear face of the display section 17. The drive units 20, which are each composed of a circuit substrate 22 mounted with driver circuits 21, are arranged individually in the opposite sides of the display unit 19 with respect to the width direction thereof. The sockets 23 are connected individually to the upper and lower end portions of the right-hand drive unit 20. The fluorescent lamp 24, which is connected between the sockets 23, emits illumination light to the light guide member 18. All these components constitute a panel-shaped main unit 29. A drive unit 25 for the fluorescent lamp 24 is connected to the sockets 23 of the lamp 24 by means of lead wires 26, individually, and is arranged parallel to the right-hand drive unit 20. A pair of connecting frames 27, having a U-shaped cross section, are fitted individually on the respective upper and lower end portions of the display unit 19 and the paired drive units 20, which are arranged side by side in a line, thereby connecting all these units but the drive unit 25. Numeral 28 denotes dial knobs on the drive unit 25, which are used to adjust the light quantity and display density, for example. As shown in FIG. 5, the fluorescent lamp 24 and the light guide member 18 are connected to each other by means of a shielding film 32 which covers them. Thus, the light from the lamp 24 can be guided to the incidence end of the member 18 without leakage.

Figure 3:
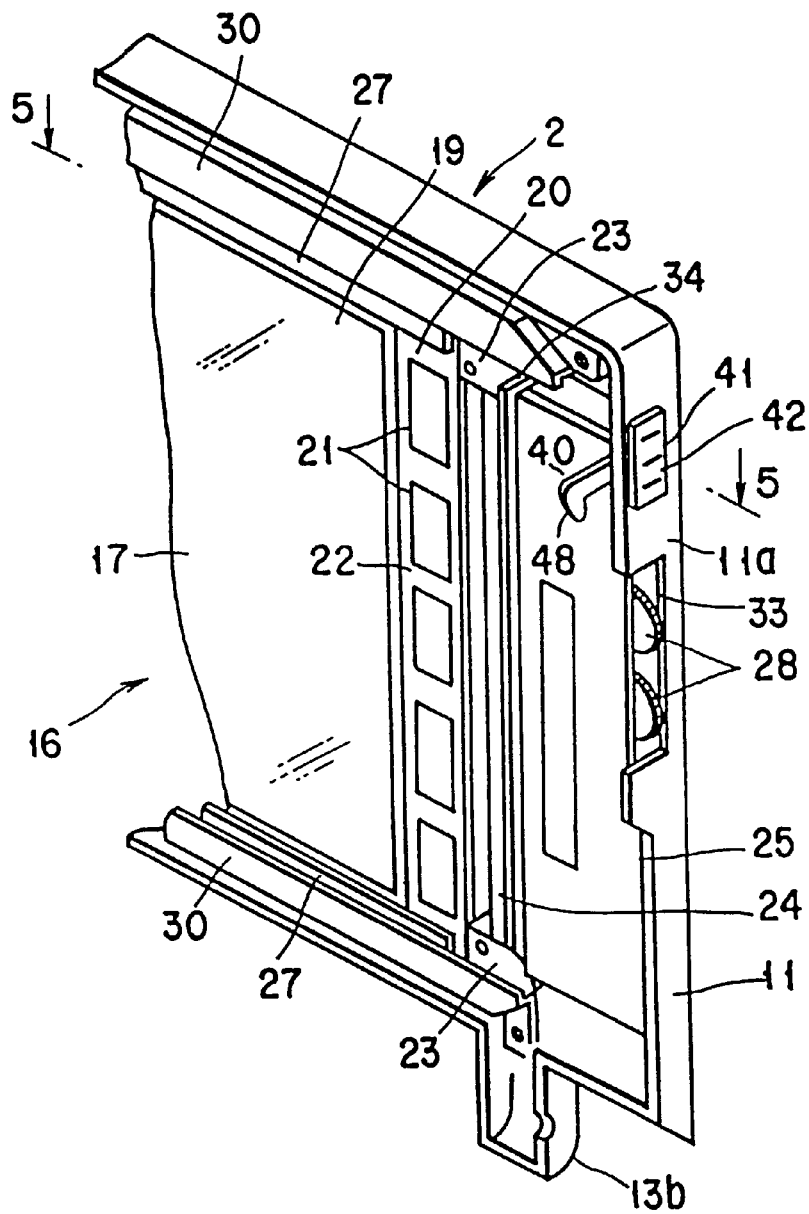

As shown in FIGS. 3 and 4, the main unit 29 is mounted on the bottom case 11 so that the display screen of the liquid crystal display section 17 faces the opening portion 12b of the cover 12. More specifically, the unit 29 is mounted on the bottom surface of the bottom case 11 in a manner such that its upper and lower edge portions are fitted individually in a pair of elongated fixing members 30 with an L-shaped cross section, which are screwed to the case 11. In this case, the display unit 19 need not be provided with tapped holes for the fixation to the bottom case 11, and the liquid crystal display section 17 can enjoy a wide display region. Spacers 31 (see FIG. 5) are previously attached to various parts of the rear face of the display unit 19 so that a gap is defined between the rear face of the unit 19 and the bottom surface of the bottom case 11 when the main unit 29 is set on the case 11.

Figure 2:
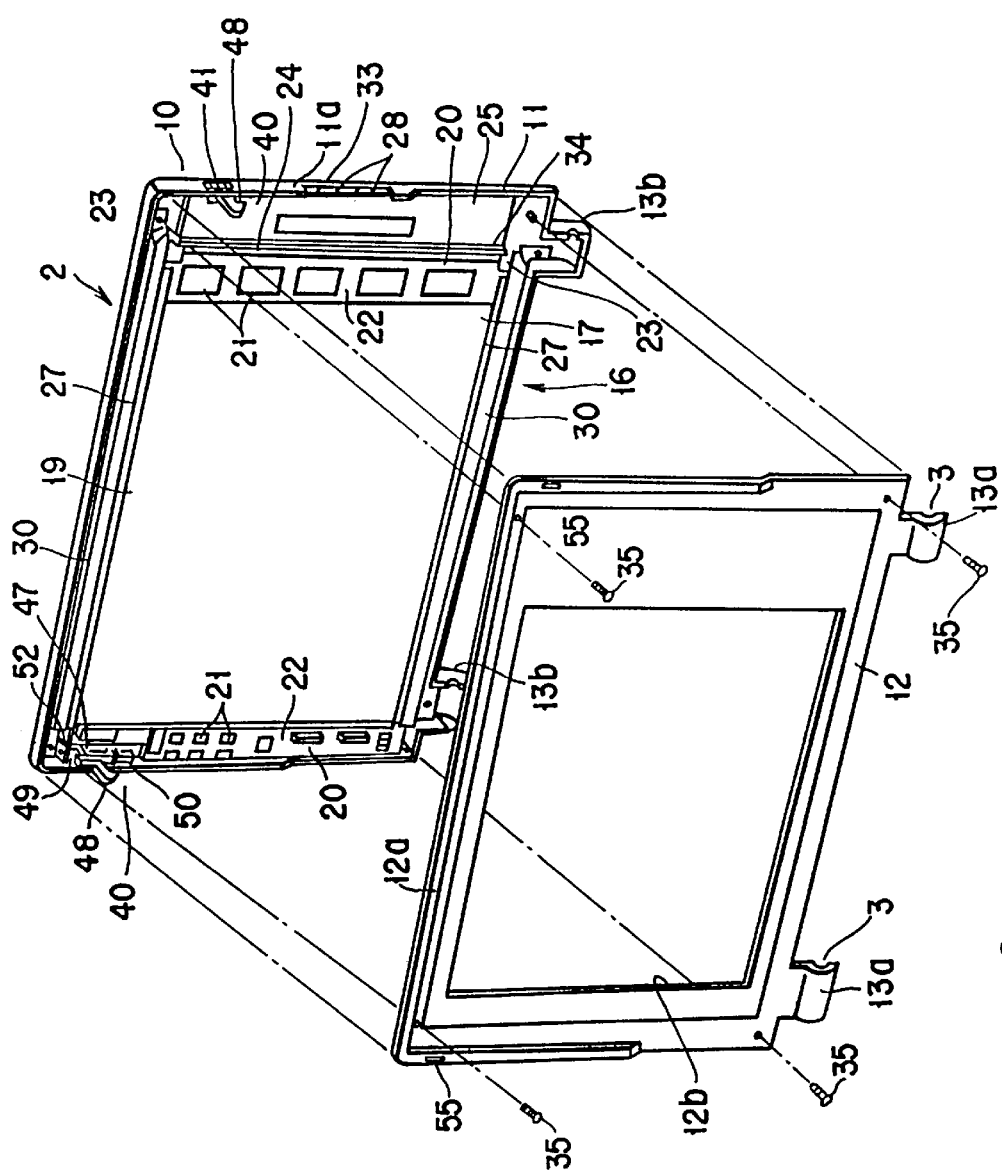

The drive unit 25 for the fluorescent lamp 24 is mounted on that portion of the bottom surface of the bottom case 11 which is situated between the lamp 24 and a peripheral wall 11a on the right-hand side of the case 11. The dial knobs 28 are exposed to the outside through a notch 33 which is formed in the wall 11a. In FIG. 2, numeral 35 denotes fixing screws for fixing the various parts. In FIG. 5, numeral 36 denotes insulating sheets arranged on the inner surfaces of the bottom case 11 and the cover 12.

A protection rib 34 is provided between the fluorescent lamp 24 and the drive unit 25. More specifically, the rib 34 is formed integrally with the bottom case 11, and protrudes from the bottom surface of the case 11, as shown in FIGS. 4 and 5. The rib 34 extends along the lamp 24 in the axial direction thereof so as to cover the overall length of the lamp. The height of projection of the rib 34 is adjusted to a dimension such that the rib projects beyond the respective top positions of the fluorescent lamp 24 (including the shielding film 32), set on the bottom case 11, and the drive unit 25, as shown in FIG. 5. Specifically, the height of the rib 34 is larger than the diameter of the fluorescent lamp 24. In this embodiment, the rib 34 is formed so that its projecting end abuts against the inner surface of the cover 12.

The rib 34 serves to protect the fluorescent lamp 24 against an external force, if any, which pushes the face of the cover 12, thereby deforming the cover, or acts in the direction to twist the body 10 of the display 2, for example. The respective walls of the bottom case 11 of the display 2 and the cover 12 are made very thin, e.g., as thin as about 1.5 mm, for reduced size and weight, so that they are easily deformable. If the cover 12, for example, can be bent by a press or twist, therefore, it may possibly interfere with the fluorescent lamp 24, thereby damaging it. Since the rib 34 is set up beside the lamp 24, however, the flexible cover 12 abuts against the distal end portion of the rib 34 before it engages the lamp 24. Thus, the lamp 24 can be protected against contact with the flexible cover 12. Naturally, the rib 12 serves to improve the rigidity of the thin, easily deformable bottom case 11, as well as to protect the lamp 24. Thus, even though the body 10 is thin-walled, necessary rigidity can be secured for the individual parts.

A pair of latch devices 40 are arranged individually on the right- and left-hand end sides of the body 10. They are used to lock the display 2 in the position where it covers the keyboard 60, or to unlock the display 2 so that the display can be opened. Conventionally, a latch device inevitably requires use of two hook means for connecting two parts in- and outside the body. According to this embodiment, however, each latch device 40 is designed having only one hook means for firm or unreleasable connection, in order to make the body 10 thinner. FIGS. 6 to 9 illustrate the construction of the left-hand latch device 40.

This latch device 40 comprises a slide knob 41 which is attached to the peripheral wall 11a of the bottom case 11 of the display 2 so as to be slidable in the direction parallel to the bottom surface of the case 11. The knob 41 is composed of a rectangular operating plate 42 and a fixing hook 43 protruding from the rear face thereof. The hook 43 includes a belt-shaped portion 44 extending parallel to the bottom surface of the bottom case 11 from the rear face of the plate 42. At claw 45 is formed on the distal end portion of the hook 43. The claw 45 has a catch surface 45a which extends in the operating direction (indicated by arrow X in FIG. 6) of the operating plate 42 and faces the peripheral wall 11a.

The claw 45 and the belt-shaped portion 44 penetrate a guide hole 46, which is formed in the peripheral wall 11a on the left-hand side of the bottom case 11 so as to extend parallel to the bottom surface of the case 11, and project into the case 11. The length of the hole 46 is greater than the width of the belt-shaped portion 44.

Figure 7:
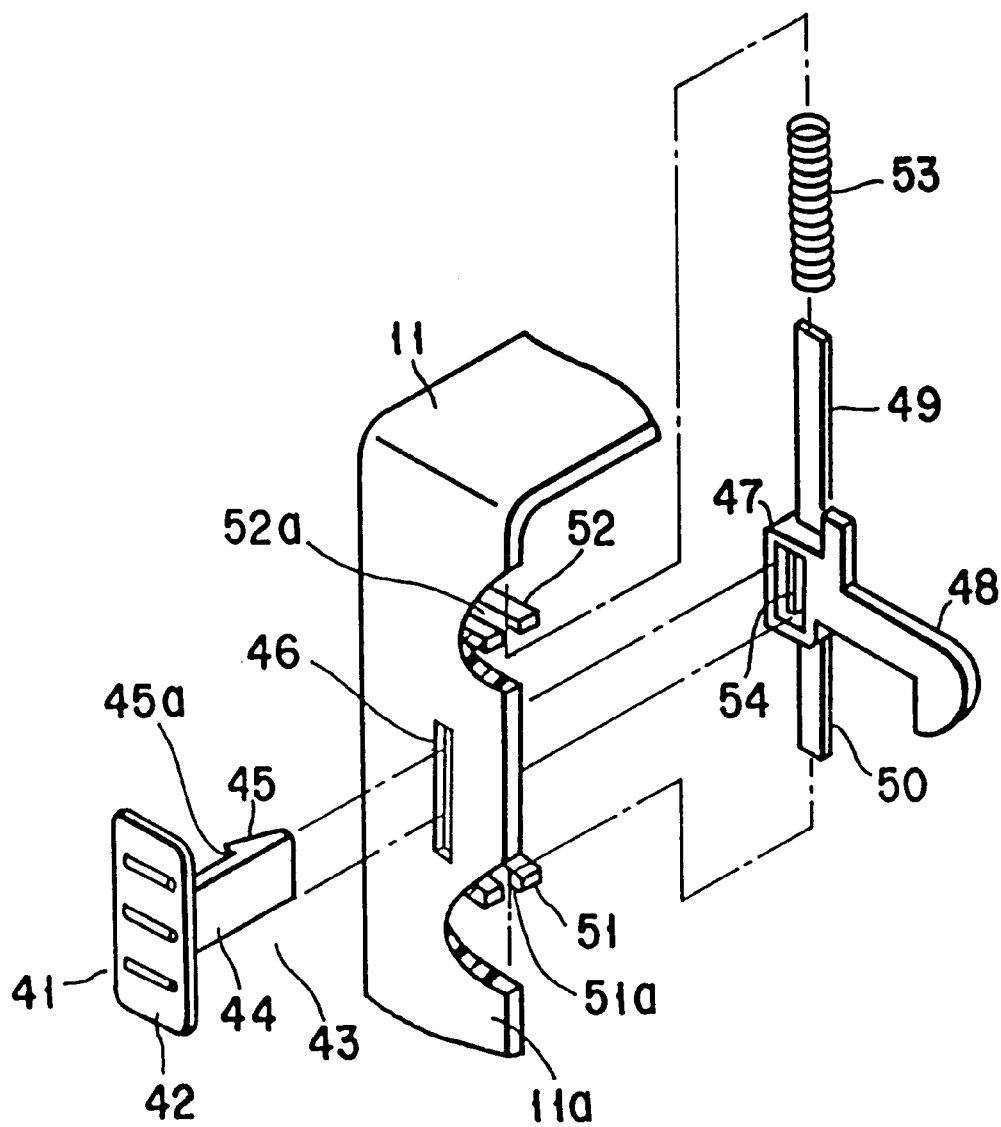

Further, the latch device 40 comprises a slider 47 located in the bottom case 11. The slider 47 is in the form of, for example, a tube having a rectangular section. As shown in FIG. 7, the slider 47 is arranged so that one end opening of its bore faces the guide hole 46, and that the lengthwise direction of the one end opening is substantially parallel to the bottom surface of the bottom case 11.

A downward latch claw 48 protrudes from the front face of the slider 47 which is directed to the cover 12. Longer and shorter guide rods 49 and 50 protrude from the upper and lower end portions, respectively, of the slider 47, and extend parallel to the peripheral wall 11a of the bottom case 11. The shorter guide rod 50 slidably penetrates a slit 51a of a U-shaped seat 51, which protrudes from that portion of the inner surface of the peripheral wall 11a situated below the lower end of the guide hole 46. The longer guide rod 49 slidably penetrates a slit 52a of a U-shaped seat 52, which protrudes from that portion of the inner surface of the wall 11a situated above the upper end of the hole 46. Thus, the slider 47 is movable between the two seats 51 and 52. The respective openings of the slits 51a and 52a of the seats 51 and 52 are directed to the cover 12 (on the front side) so that the slider 47 can be fitted and removed with ease. A compressed coil spring 53 is wound around the guide rod 49 in a manner such that it is retained between the seat 52 and the upper end portion of the slider 47. The spring 53 urges the slider 47 toward the lower end of the bottom case 11.

Formed in the bore of the slider 47 is a projection 54 which can releasably engage the claw 45 of the slide knob 41. The hook 43 is inserted into the bore of the slider 47 through the guide hole 46 in the peripheral wall 11a, and the claw 45 engages the projection 54. The position of the projection 54 is adjusted so that the catch surface 45a of the claw 45 engages the projection 54 when the claw 45 is inserted in the slider 47 in a manner such that the operating plate 42 is in contact with the outer surface of the peripheral wall 11a. Thus, the plate 42 can be positioned in a predetermined position.

The overall length of the square bore of the slider 47 (width of the slider 47) is adjusted to a dimension such that the distal end portion of the claw 45 can penetrate the bore. When the claw 45 engages the slider 47, its distal end portion projects sideways from the slider.

A vertically elongated hole 55 is formed in that flat portion of the stepped portion 12a of the cover 12 which corresponds in position to the latch claw 48. When the cover 12 is attached to the bottom case 11, the distal end portion of the latch claw 48 projects forward from the cover 12 through the hole 55.

A rib 56 for stopping the claw 45 protrudes integrally from that portion of the inner surface of the cover 12 which faces the rear face of the claw 45 projecting sideways from the slider 47. The height of the rib 56 is adjusted to a dimension such that the distal end of the rib is in sliding contact with (or in close vicinity to) the rear face of the claw 45, as shown in FIGS. 8 and 9, when the cover 12 is attached to the bottom case 11. The rib 56 continuously extends so as to cover the whole range of the sliding motion of the slide knob 41. Before the cover 12 is attached to the bottom case 11, the knob 41 engages the slider 47 only in an easily releasable manner, that is, the claw 45 is loosely in engagement with the projection 54. When the cover 12 is attached to the case 11, however, the claw 45 is pressed by the rib 56, as shown in FIGS. 8 and 9, so that the claw 45 is restrained from moving in the direction to be disengaged from the projection 54. In this manner, the claw 45 is prevented from slipping out of the slider 47. Thus, the two parts in- and outside the body 10, that is, the slide knob 41 and the slider 47, are firmly connected by means of the single hook means 43.

Square latch holes 57 are formed individually on the opposite sides of the front portion of the upper case 1a of the computer body 1, corresponding in position to the right- and left-hand latch claws 48 which project from the cover 12. When the display 2 is closed, each claw 48 engages its corresponding latch hole 57, so that the display 2 is locked in the closed position. By sliding the operating plate 42 of each slide knob 41 against the urging force of the coil spring 53, each latch claw 48 can be disengaged from its corresponding latch hole 57 to unlock the display 2.

FIGS. 10 to 14A show the general construction of the body 1 of the personal computer.

In this embodiment, the body 1 is constructed so that various devices, circuit boards, etc. are mounted in the upper case 1a which carries the keyboard 60 thereon.

Figure 14A:
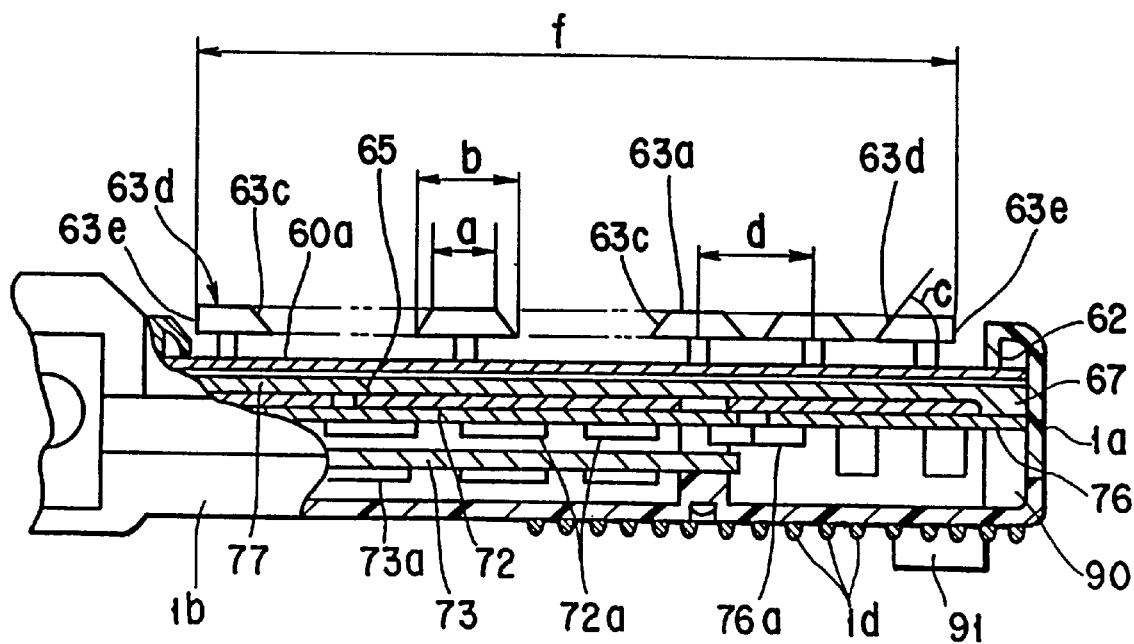
FIG. 14A is a sectional view viewed along line 14A in FIG. 11.

More specifically, a rectangular opening 4, through which keys of the keyboard 60 are exposed, is formed in the front portion of the upper surface of the upper case 1a, and a plurality of openings, through which various terminals are exposed, are formed in the rear portion of the peripheral wall of the upper case, as shown in FIGS. 13 and 14A. That portion of the upper case 1a which extends along the peripheral edge of the opening 4 is bent backward to form a rib 62, which serves to retain the keyboard 60 set in the opening 4.

The rib 62 carries thereon the edge portion of the keyboard 60, on which a large number of keys 63 are arranged. The keys 63 are exposed to the outside through the opening 4. A plurality of claws 62a protrude from the rib 62. The keyboard 60 is located in a predetermined position with these claws 62a in engagement with notches 64 in the peripheral edge portion of the keyboard. In FIG. 13, numeral 70 denotes a connecting terminal which extends from the keyboard 60. The keyboard 60 has a substrate 65 in the form of a rectangular flat plate having the notches 64. Two seat portions 66 for fixation are formed by cutting and raising parts of the peripheral edge of the substrate 65. As the key-board 60 is set on the upper case 1a, the seat portions 66 are fitted individually on boss portions (not shown) which protrude from the rear face of the upper case 1a.

A thin-walled, conductive mounting plate 67 for shielding is fixed to the upper case 1a to cover the rear face of the keyboard 60. The conductive mounting plate 67 serves as a conductive chassis and a front chassis of the present invention. Having an external shape corresponding to the size of the keyboard 60, the plate 67 shields the rear face of the keyboard. Fixing holes 68 and positioning brackets 69 are formed at the peripheral edge portion of the plate 67.

Principal electronic components are mounted on the rear face of the mounting plate 67. More specifically, a floppy disk drive 71 is mounted on the left-hand half (FIG. 13) of the rear face of the plate 67. A board unit 75, serving as a printed circuit module, and an L-shaped circuit board 76 are mounted on the right-hand half of the rear face of the plate 67 with an insulating sheet 77 between the board 76 and the plate 67. The board unit 75 includes two circuit boards 72 and 73 which carry thereon various electronic components 72a and 73a, as shown in FIG. 12, for example. These circuit boards 72 and 73 are connected to each other by means of a flexible film cable 74, and are arranged in layers, upper and lower. Further, the board 76 is connected to the board 73 by means of a connector 76a, and is mounted with various electronic components 76b. The connecting terminal 70 of the keyboard 60 is connected to the circuit board 73. A connecting cable 78a, which is led out from the display 2 on the upper case 1a, is connected to a connector (not shown) which is arranged on the circuit board 73.

Flexible film cables 78 and 79, which are led out from the circuit board 72, are connected to a battery/card unit 80. The unit 80 is also mounted in the upper case 1a. The unit 80 serves as a supporting unit and a rear chassis of the present invention.

As shown in FIGS. 11 to 13, the unit 80 has an elongated frame 81, and is removably mounted on a flat portion 82 which is situated between the opening 4 and the rear wall of the upper case 1a. The frame 81 has a pair of side walls 83 which are set up on one side, e.g., the left-hand side (FIG. 12), of its rear face. The frame 81 and the side walls 83 constitute a battery box 86. A pair of side walls 84 are set up on the right-hand side of the rear face of the frame 81. The walls 84, along with the frame 81, constitutes a board storing section. Arranged between the side walls 84 is a circuit board 85 which carries a drive units and driver circuits. Numeral 87 denotes a frame for terminal retention. A pair of card storing devices 88, right and left, each having an ejector mechanism (mentioned later), are arranged individually on the opposite sides of the surface (lower surface as in FIG. 12) of the flat portion 82 of the frame 81. The unit 80, having the aforesaid construction, is mounted on the flat portion 82 of the upper case 1a in a manner such that its side carrying the card storing devices 88 are directed to the inner surface of the upper case 1a, and that the circuit board 85 faces the opening of the case 1a. When the unit 80 is mounted in the upper case 1a, various terminals arranged on the terminal holding frame 87 are situated opposite to the openings 5 of the rear wall of the upper case 1a.

The unit 80 is screwed to the inner surface of the upper case 1a, and the board unit 75 and the circuit board 76 are screwed to the conductive mounting plate 67. By doing this, various built-in devices are mounted with high density in the upper case 1a so as to cover the entire space in the case 1a, as shown in FIG. 11.

The lower case 1b is combined with the upper case 1a, having the various devices thus mounted therein, so as to close the opening portion of the upper case. More specifically, the lower case 1b is fixed to the upper case 1a by means of a plurality of screws 89, with the internal devices between them. In this state, the board unit 75 and the circuit board 76, mounted on the rear face of the keyboard 60, are surrounded by the conductive mounting plate 67 and a plating layer (not shown) on the inner surface of the lower case 1b, as shown in FIG. 14A. Thus, the unit 75 and the board 76 are shielded by means of the conductive layers. As the various boards are arranged on the keyboard 60 with use of the mounting plate 67 for shielding the keyboard, deflection of the keyboard 60 caused by key operation (due to the thinness and low rigidity of the keyboard 60) can be restrained by utilizing the rigidity of the shielding plate 67 for reinforcement. Since all the built-in devices are mounted in the same upper case 1a, moreover, the cables connecting the parts can be reduced in length. Since the display 2 is also mounted on the upper case 1a, the connecting cable 78a for the display 2 can be easily connected to the circuit boards in the upper case, and the cable 78a can be shortened. Thus, the connecting cable 78a can be easily led about in the computer body 1, and can be housed in a relatively narrow space.

As shown in FIG. 14A, a plurality of ribs 90 are formed on the inner peripheral edge portion of the lower case 1b. They serve to support the circuit boards 72, 73 and 76, contained in the upper case 1a, and the keyboard 60 from under the same.

As shown in FIGS. 10 to 12, legs 91, each in the form of an elliptic projection, are arranged individually at the four corners of the bearing surface of the computer body 1, that is, the lower surface of the lower case 1b. Among these legs, the legs 91 on the right- and left-hand sides of the front portion of the body 1 are situated close to the opposite side faces of the body 1, individually, and have their respective end faces flush with the corresponding side faces. These two legs 91 constitute engaging portions 92 for connection, individually having engaging grooves 92a (only one of which is shown) opening to their corresponding end faces. With use of these engaging portions 92, the personal computer can be positioned with respect to a mounting portion of an expanding apparatus (mentioned later) for expanding the function of the computer.

The lower case 1b is formed having an opening 95 (see FIGS. 11 and 12) through which a chip (not shown) as an option is incorporated into the circuit board 72 from outside the body 1. Normally, the opening 95 is closed by a cover 96 which is fixed to the lower case 1b by means of a screw 96a.

The electronic components mounted on the circuit boards 72, 73 and 76 in the body 1 include superheating members which generate superheat. Accordingly, the whole area of the lower case 1b which adjoins these superheating members is heated to high temperature. As shown in FIGS. 10 and 14A, therefore, a number of elongated ridges (projections) 1d are bonded to the front portion of the lower surface of the lower case 1b, extending parallel to one another in the crosswise direction of the body 1. The ridges 1d are formed of a material with a heat transfer rate lower than that of the body 1. Each ridge 1d has a substantially semielliptic cross section, about 1 mm wide and 5 mm high. The space between the respective vertexes of each two adjacent ridges 1*d* is adjusted to about 2 mm. This key space should only be set lest a user's fingers be caught between the ridges 1*d* when the user takes hold of the body 1. The ridges 1*d* may be formed integrally with the lower case 1*b* from the same material therewith.

With use of the numerous ridges 1*d* thus arranged on the lower surface of the lower case 1*b*, that is, on that portion of the body 1 which will be heated to high temperature during the operation of the computer, the user's fingers can touch only the vertexes of the ridges 1*d*, and can never directly touch the lower surface of the lower case 1*b*, even when the user touches the lower portion of the lower case as he carries the computer. Although the difference in temperature between the ridges 1*d* and the surface of the lower case 1*b* is about 1° C., the user will actually feel a temperature difference of 5° C. or thereabout. Also, the area of contact of the user's fingers with the lower case 1*b* is much smaller than in the case where the lower case is not provided with the ridges 1*d*. If the user touches the underside of the body 1, therefore, he will feel a temperature of only about 40° C. to 45° C. Thus, the user can be prevented from harboring suspicion attributable to heat from the body 1, that is, from misguidedly guessing the occurrence of trouble of or damage to the computer. The ridges 1*d* functions also as antiskid means.

As shown in FIGS. 1, 14A and 14B, the keyboard 60 has a number of keys 63 arranged on a circuit board 60*a*. These keys 63, which are arranged lengthwise and crosswise, constitute a key array 60*b* having a substantially rectangular outline as a whole. All the keys 63 except those ones which constitute the outermost lines of the array 60*b* are each in the form of a truncated pyramid. More specifically, each square key 63 has a rectangular top face 63*a* and slanting faces 63*b* which extend obliquely from the individual sides of the top face so as to spread out downward. Thus, each key 63 has a trapezoidal profile. The width a of the top face 63*a*, width b of the bottom face of the key, tilt angle c of the slanting faces 63*c* with respect to the top face, and the space d between each two adjacent keys are set at predetermined values for ease of the user's operation.

Those keys 63*d* which constitute the outermost lines of the key array 60*b*, that is, the right- and left-end lines and the top and bottom lines, have substantially the same shape as the other keys described above. In the keys 63*d*, however, the tilt angle c of a slanting face 63*e* on the outline of the array 60*b* is greater (approximately 90° C.) than that of other slanting faces 63*c*. Accordingly, the outward projection of the keys 63*d* on the outermost lines from the key array 60*b* is small, although the area of contact with the user's finger, i.e., the area of the top face 63*a*, and the space d between the adjacent keys are kept equal to those for the other keys 63. In this case, the width e and depth f of the key array 60*b* can be made shorter than in the conventional case by (b–a) without changing the size of the key top face and the key space.

Thus, the size of the keyboard 60 can be reduced without affecting the ease of use at all. Correspondingly, the whole personal computer can be reduced in size. Since the keyboard size constitutes a primary factor to determine the computer size, in particular, its reduction produces a great effect.

The following is a description of the pair of card storing devices 88 arranged in the unit 80. These devices 88, right and left, have the same construction, and FIGS. 15 to 23 show an arrangement of the right-hand device 88.

Before explaining the card storing device 88, card-type electronic components to be incorporated into the storing device will be described.

Available card-type electronic components include, for example, a memory card 97 stored with specific information and an interface card 100 which functions as an interface between the computer and some other external apparatus.

Figure 17:
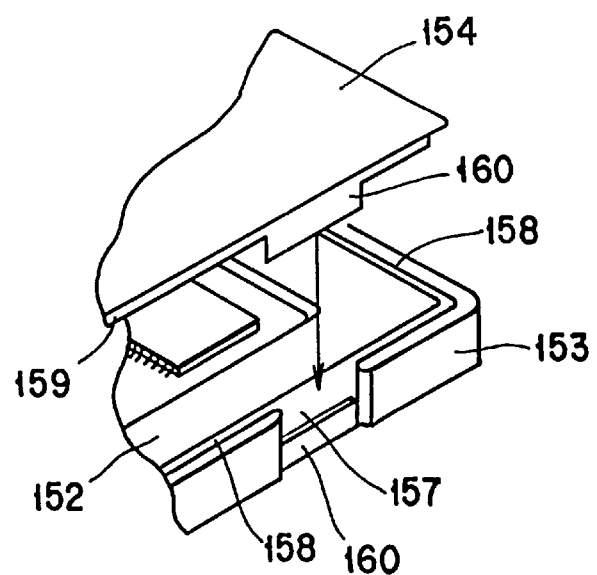

As shown in FIGS. 15 to 17, the memory card 97 comprises a rectangular circuit board 152, mounted with a plurality of semiconductor elements 150, and a plastic mold frame 153 fitted with the circuit board 152 so as to surround its peripheral edge portion. Rectangular design plates 154, which are formed of conductive metal and serve as a shielding plate each, are mounted on the mold frame 153 so as to cover the upper and lower surfaces of the circuit board 152, individually. Various designs, such as a design coating, are put on the surface of each design plate 154. The memory card 97 is adapted to be inserted into the card storing device 88 of the computer in the direction of arrow A. A connector 156 for electrical connection between the card 97 and the computer is provided at the leading end portion of the card 97 with respect to the card loading direction. The connector 156 constitutes part of the mold frame 153.

An engaging recess 157 is formed at a predetermined region of each of two side faces of the mold frame 153 extending in the card loading direction A, at the rear end portion with respect to the loading direction. Engaging grooves 158 are formed individually on the upper and lower surfaces of the frame 153. Each groove 158 extends along the peripheral edge of the mold frame 153 with a narrow space between them. All the peripheral edge portion of each design plate 154 except its front end edge is bent at right angles, thus constituting a retaining portion 159. Those parts of the retaining portion 159 which correspond to the recesses 157 project longer than the other parts, and constitute conductive portions 160 for grounding. Each design plate 154 is formed integrally by press or the like, and each conductive portion 160 is in an exposed ground metal form without any decorative coating.

Each design plate 154, constructed in this manner, is fixed to the mold frame 153 in a manner such that the retaining portion 159 is fitted in the retaining groove 158, and the conductive portions 160 in their corresponding recesses 157. Each plate 154 is connected electrically to the ground of the circuit substrate 152 by means of a grounding spring 161 which is fixed to the substrate.

The dimensions of the individual parts of the memory card 97 are in conformity to the standards Type II provided by JEIDA. More specifically, the card width is 54.0±0.1 mm, the thickness of the peripheral edge portion (at least 3 mm distant from the edge) of the card is 3.3 mm, and the thickness of the central portion of the card including the design plates 154 is 5.0 mm at the maximum.

Figure 18:
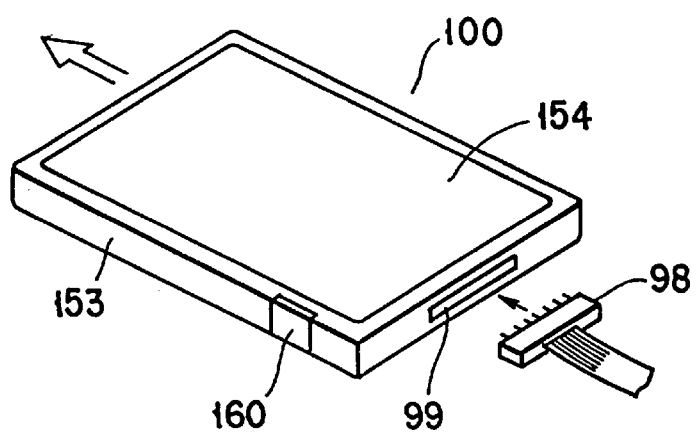

The interface card 100, like the memory card described above, comprises a circuit board, a mold frame 153 fitted on the periphery of the circuit board, and design plates 154 for use as shielding plates, fixed to the mold frame so as to cover the upper and lower surfaces of the circuit board, individually, as shown in FIG. 18. A connector for electrical connection between the card 100 and the computer is provided at the leading end of the mold frame 153. In the case of the interface card 100, a contact 99 for connection with a connector 98 of an external apparatus, e.g., expanding apparatus (not shown), is arranged at the trailing end with respect to the card loading direction.

Further, a metal piece having a substantially U-shaped section is fixed to each side face of the mold frame 153, at the trailing end portion with respect to the loading direction of the card 100, thus constituting a conductive portion 160 for grounding. This metal piece is fixed to the frame 153 in a manner such that it is buried to the depth equivalent to its wall thickness in the frame. The outer surface of the metal piece is flush with the side faces and the upper and lower surfaces of the mold frame 153. The conductive portions 160 and the design plates 154 are connected individually to the ground of the circuit board 152.

Figure 20:
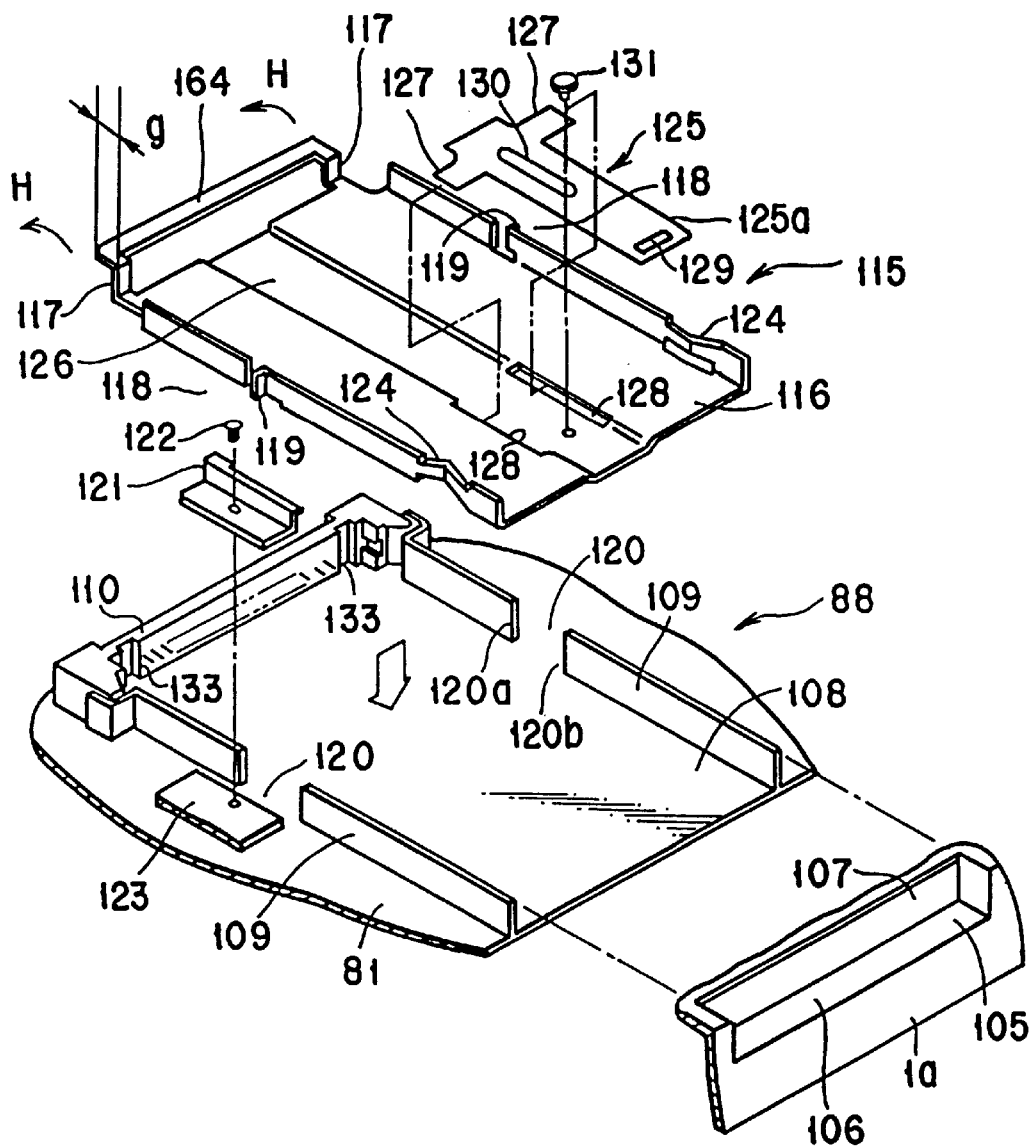

The following is a description of the card storing device 88. As shown in FIGS. 1, 19 and 20, an L-shaped stepped portion 105 is formed in the right-hand corner of the flat portion 82 of the upper case 1a of the computer body 1, which is situated between the keyboard 60 and the rear end portion of the case 1a on which the legs 3 of the display 2 are pivotally mounted. The stepped portion 105 is formed by cutting a predetermined length of the corner portion of the upper case 1a along its ridge-line. A space defined by the stepped portion 105 constitutes an operating opening portion 106 which is externally accessible by a finger tip.

A vertical wall of the stepped portion 105, which is continuous with a horizontal wall thereof, has an opening, which defines an elongated inlet slot 107 for the insertion and removal of the memory card 97 or the interface card 100. The slot 107 communicates with a card storing section 108 in the computer body 1.

As shown in FIGS. 19 and 20, the card storing section 108 is defined by the frame 81, which constitutes the aforementioned unit 80, and the flat portion 82 of the upper case 1a. More specifically, a pair of elongated wall portions 109 are set up parallel to each other on the upper surface of an end portion of the frame 81, so as to be continuous with the opposite crosswise end portions of the inlet slot 107, individually. Each wall portion 109 has a length corresponding to the overall length of the card 97 (or interface card 100). A region surrounded by the wall portions 109, the upper surface of the frame 81, and the inside of the flat portion 82 facing the frame 81 constitutes the flat card storing section 108 which can receive the whole card. The storing section 108 extends from a side face of the upper case 1a toward substantially the crosswise center of the case 1a. When the card 97 (or interface card 100) is received, a connector 110, which can be connected to the connector 156 (see FIG. 15) fixed to the leading end portion of the card 97, is fixed to the flat portion of the frame 81 which corresponds in position to the leading end portion of the card. Thus, when the card 97 or 100 is stored in position in the storing section 108, the connector 156 of the card 97 or 100 is connected to the connector 110. The connector 110 is connected to the board unit 75 by means of a flexible film cable (not shown).

The card storing section 108 is provided with a card ejector mechanism 115 of a two-stage drawer type.

The card ejector mechanism 115 comprises a card receiver 116, which is arranged in the card storing section 108 and slidable in the card loading direction. As shown in FIG. 20, the receiver 116 is a tray-shaped structure which is formed by, for example, bending a thin metal plate along the lines of the wall portions 109 and the upper surface of the frame 81 between these wall portions. A belt-shaped recess 126 is formed in the center of the bottom wall of the receiver 116, extending in the card loading direction. The receiver 116 can receive the card 97 or 100 inserted through the inlet slot 107. The overall length of the card receiver 116 with respect to the card loading direction is a little shorter than that of the card storing section 108.

A pair of L-shaped lugs 117, for use as pressing portions, are cut and raised up individually on the opposite sides of that end of the card receiver 116 on the side of the connector 110. When the card 97 or 100 is inserted into the receiver 116 through the inlet slot 107, the leading end portion of the card with respect to its loading direction abuts against the lugs 117. Thus, when the card is received, the receiver 116 is pushed thereby and together therewith into the inner part of the card storing section 108.

The respective extreme ends of the paired lugs 117 are connected to each other by means of a flat connecting piece 164. The piece 164 is bent forward with respect to the card loading direction, and extends substantially parallel to the bottom wall of the card receiver 116. When the receiver 116 is pushed deep into the storing section 108, the connecting piece 164 gets onto and then slides on the upper surface of the connector 110. The width g of the piece 164 in the card loading direction is substantially equal to or a little longer than the stroke of connection between the connector 110 and the connector 156 of the card, that is, the moved distance of the connector 156 covered during the time interval between the contact between the connectors and the completion of the connection.

A pair of stopper mechanisms 118 (regulating means) for regulating the advance and retreat of the card receiver 116 are arranged individually on the opposite crosswise sides of the receiver 116.

As shown in FIG. 20, each stopper mechanism 118 includes a projection 119, which is formed by raising part of each side wall of the card receiver 116 outward, and a notch 120 formed in part of each wall portion 109 of the card storing section 108 and receiving its corresponding projection 119. The card receiver 116 is slidable between a first position, where each projection 119 abuts against an end edge 120a of its corresponding notch 120 on the side of the connector 110, and a second position, where each projection abuts against an end portion 120b of the notch 120 on the side of the inlet slot 107. The end edge 120a of each notch 120 is positioned so that the whole card in the card receiver 116 can be housed in the card storing section 108 and connected to the connector 110 when the receiver 116 is pushed into the first position where each projection 119 engages the end edge 120a. The end edge 120b of each notch 120 is positioned so that the trailing end portion of the card 97 or 100 in the card receiver 116 projects outward for a predetermined distance from the operating opening portion 106 when the receiver 116 is drawn out to the second position where each projection 119 engages the end edge 120b. In this manner, the movement of the card receiver 116 is restricted within a predetermined range.

A conductive metal cover 121 having an L-shaped section is fixed to the frame 81 so as to cover the notch 120 of one of the stopper mechanisms 118, e.g., the left-hand stopper mechanism, from the outside. Thus, the corresponding projection 119 is prevented from slipping out of the notch 120, whereby the card receiver 116 is prevented from being disengaged from the card storing section 108. The distal end of the projection 119 is in sliding contact with the inner surface of the cover 121. The cover 121 is fixed to the frame 81 by means of a screw 122 with the aid of a mount portion 123 formed on the frame 81. The screw 122 connects electrically with the respective plating layers of the upper and lower cases 1a and 1b through the mount portion 122, frame 81, etc.

A pair of card conduction portions 124 are formed individually on the respective end portions of the right- and left-hand wall portions of the card receiver 116 on the side of the inlet slot 107. Each conduction portion 124 is formed by bending part of each wall portion into a substantially V-shaped inward projection. When the memory card 97 or the interface card 100 is inserted into a predetermined position in the card receiver 116, the conductive portions 160 on the opposite side faces of the card come into contact with the respective top portions of their corresponding card conduction portions 124, so that the receiver 116 and the card are connected electrically. Thus, when the card 97 or 100 is set in the predetermined position in the receiver 116, it is connected electrically to the computer body 1 to be grounded through the receiver.

A drawer piece 125 is provided on that end portion of the bottom wall of the card receiver 116 on the side of the inlet slot 107 so as to be drawable along the card loading direction. As shown in FIG. 20, the piece 125 is formed of a plastic sheet having a substantially T-shaped external configuration. The longitudinally extending portion of the sheet constitutes an operating portion 125a, while a pair of transversely projecting portions constitute retaining portions 127. The operating portion 125a has a slot 130 extending in the card loading direction.

The retaining portions 127 of the drawer plate 125 are slidably fitted in a pair of slits 128 (regulating means and connecting means) formed individually in angle portions of the card receiver 116, which define the opening-side ridgelines of the recess 126, individually. The drawer piece 125 is slidably fixed by means of a guide pin 131, which penetrates the slot 130 and is attached to the bottom wall of the receiver 116. The operating portion 125a is fitted in the recess 126, and extends toward the operating opening portion 106, guided by the recess 126. Thus, the drawer piece 125 is slidable relatively to the card receiver 116 within the range of the length of the slits 128 or the slot 130. More specifically, the piece 125 is slidable between a pushed-in position, where the retaining portions 127 and the guide pin 131 engage the respective connector-side end edges of the slits 128 and the inlet-side end edge of the slot 130, respectively, and a drawn-out position, where the portions 127 and the pin 131 engage the respective inlet-side end edges of the slits 128 and the connector-side end edge of the slot 130, respectively.

The slits 128, the slot 130, and the guide pin 131 are positioned so that the end portion (with respect to the drawing direction) of the operating portion 125a is situated in the operating opening portion 106 when the drawer piece 125 is pushed into the pushed-in position, with the card receiver 116 in the first position and the connector 156 of the card connected to the connector 110. Thus, the end portion of the operating portion 125a is located in a position easily accessible by a finger tip inserted in the opening portion 106.

Further, the slits 128, the slot 130, and the guide pin 131 are arranged so that the end portion of the operating portion 125a projects long enough from the operating opening portion 106 to enable the user's fingers to seize it with ease when the drawer piece 125 is drawn out to the drawn-out position with the card receiver 116 in the first position. When the drawer piece 125 is drawn out to the drawn-out position so that it is ready for the draw-out of the card 97 or 100, the card receiver 116 and the piece 125 are connected to each other.

As shown in FIG. 20, an opening portion 129 (finger catch portion), e.g., rectangular in shape, is formed at that end portion of the operating portion 125a, which is to be located in the operating opening portion 106, so that a finger tip inserted in the opening portion 106 can be hooked to the opening portion 129. By hooking the finger tip in this manner, the user can draw out the end portion of the operating portion 125a from the opening portion 106 to the outside of the upper case 1a or the body 1.

As shown in FIG. 1, each operating opening portion 106 is removably fitted with a cover 132 having, e.g., an L-shaped section corresponding to the external shape of the stepped portion 105. The cover 132 is used to close the opening portion 106 so that the card 97 or 100 therein and the end portion of the drawer piece 125 is unseeable from outside the computer after the card is loaded.

In FIG. 20, numeral 133 denotes each of grooves formed individually on the opposite sides of the front face of the connector 110. These grooves 133 receive their corresponding lugs 117 of the card receiver 116 when the receiver 116 is moved to the first position. In FIG. 1, moreover, numeral 135 denotes a floppy inlet slot which is formed in a crosswise side portion of the body 1. A floppy disk can be loaded into a floppy disk drive 71 (see FIGS. 11 and 13) in the body 1 through the slot 135.

In incorporating the memory card 97 into, for example, the right-hand card storing section 108 of the personal computer constructed in this manner, the cover 132 is first removed from the operating opening portion 106. Then, the card 97 is put into the inlet slot 107, with its leading end side forward and the trailing end side seized by fingers. As a result, the card 97 is inserted deep into the card receiver 116 to be received thereby.

If the card receiver 116 is situated in the second position on the side of the inlet slot 107, at this point of time, the leading end of the inserted card 97 abuts against the lugs 117, so that the receiver 116, pushed by the card, moves along with the card toward the first position.

When the card 97 is put into the inlet slot 107, the greater part of it is swallowed by the body 1, leaving the seized trailing end portion outside the body 1. Thereafter, the trailing end portion of the card 97, projecting outward from the operating opening portion 106, is pressed so that the whole card 97 is inserted into the card storing section 108 through the slot 107. When the card 97 is pushed in to be stopped by the stopper mechanisms 118, it is held, along with the card receiver 116, in the storing section 108, so that the receiver 116 is situated in the first position. At the same time, the connector 156 at the leading end of the card 97 is connected to the connector 110 on the computer side. In this state, the lugs 117 of the card receiver 116 are in the grooves 133 of the connector 110, and the connecting piece 164 is on the upper surface of the connector 110. Further, the paired conductive portions 160 of the card 97 are individually in contact with the card conduction portions 124 of the receiver 116. Thus, the card 97 connects electrically with the body 1 by means of the card receiver 116 and the frame 81, and also by means of the projections 119 of the receiver, the cover 121, and the screw 122. Accordingly, the design plates 154 of the card 97, which serve as shielding plates, are connected to the ground circuit of the body 1.

When the end portion of the drawer piece 125 is projecting from the body 1 through the operating opening portion 106, it is pushed into the pushed-in position by a finger tip, so that it is located in the opening portion 106.

Thereafter, when the cover 132 is put on the operating opening portion 106 to close it, the card 97 is incorporated in the body 1 in a manner such that the card 97 and the drawer piece 125 are unseeable from the outside, that is, in an attractive manner.

FIG. 21 shows the card in the incorporated state. In incorporating the interface card 100 in place of the memory card 97, the connector 98 of the external apparatus must be connected to the card, so that the cover 132 should not be put on.

In taking out the card 97 from the body 1, after finishing the use of the card incorporated in this manner or in order to replace it with another card, the cover 132 is first removed from the operating opening portion 106, as indicated by the arrow in FIG. 22. Then, a finger tip is inserted into the opening portion 106, and hooked to the edge of the opening portion 129 of the drawer piece 125 in the opening portion 106 to pull the piece 125 to the drawn-out position. Thereupon, the end portion of the drawer piece 125 is drawn out from the body 1.

Thus, a finger pull portion 134 is formed by drawing out the end portion of the drawer piece 125 long enough for a nip.

Subsequently, the drawer piece 125 is drawn out from the body 1 in a manner such that the exposed pull portion 134 is seized by fingers. In doing this, only the piece 125 can be drawn out until the retaining portions 127 of the piece 125 engage their corresponding slits 128, that is, before the piece 125 reaches the drawn-out position. When the retaining portions 127 abut against the respective ends of the slits 128, individually, the drawer piece 125 and the card receiver 116 are connected to each other, and the receiver 116 then also moves toward the inlet slot 107.

Since the lugs 117 of the card receiver 116 are in contact with the leading end face of the card 97, the card is pushed and disengaged from the connector 110 as the receiver 116 moves, as shown in FIG. 23. When the receiver 116 is drawn out to the second position, the trailing end portion of the card 97 is led out from the operating opening portion 106 through the inlet slot 107. During this operation, the lugs 117 of the card receiver 116 is subjected to a force from the card 97 such that they are urged to bend in the direction of arrow H in FIG. 20. Since disengaging the connector 156 from the connector 110 requires a great force, in particular, the lugs 117 are also subjected to a great bending force in the direction of arrow H during the disengaging operation. If the lugs 117 are bent in the direction of arrow H, they cannot push the leading end face of the card 97, so that the card cannot be taken out thereafter. In the present embodiment, however, the paired lugs 117 are connected to each other and reinforced by means of the connecting piece 164, which is located on the upper surface of the connector 110. Further, the width q of the piece 164 is longer than the stroke of connection between the connectors 156 and 110. Accordingly, the connecting piece 164 is situated on the upper surface of the connector 110 during the time interval between the start of the operation for disengaging the connector 156 and entire disengagement of the connector 156 from the connector 110. If the lugs 117 are urged to bend in the direction of arrow H, therefore, the connecting piece 164 engages the upper surface of the connector 110, so that the lugs can be prevented from being deformed.

When the card 97 is led out, by the above-described operation, to a predetermined position such that the trailing end portion of the card 97 can be seized by fingers, the card 97 is ready to be removed.

When the card receiver 116, during the operation for taking out the card, moves to the second position where the trailing end portion of the card 97 is led out for the predetermined distance, it is restrained from further moving by the stopper mechanisms 118, lest it slip out of the card storing section 108.

If the trailing end portion of the card 97, projecting to the right from the body 1, is then pulled by fingers, the card 97 can be taken out from the card storing section 108.

After the card 97 is removed in this manner, an alternative card 97 or 100 is inserted (in the case of replacement), or the end portion of the drawer piece 125 is pushed so that the card receiver 116 and the piece 125 are restored to their respective original positions, and thereafter, the cover 132 is put on the operating opening portion 106 (if the use is to be discontinued).

According to the card ejector mechanism 115, which is constructed so that the hidden end portion of the drawer piece 125 is drawn out in a first drawing stage and the end portion of the card 97 in the card holding section 108 is drawn out and ejected from the body 1 in a second drawing stage, the incorporated card 97, along with the card receiver 116, is housed in the card storing section 108, and the end portion of the drawer piece 125, with respect to the drawing direction, is located in the operating opening portion 106. Thus, the card 97 does not project from the body 1 when it is incorporated therein. Accordingly, the personal computer can be carried with the card therein without hindrance.

Since the card ejector mechanism 115 is not linked to any external operating component which requires a specific place for installation, moreover, the installation space for the ejector mechanism is restricted little.

Since the paired lugs 117 of the card receiver 116 are connected by means of the connecting piece 164, which is slidable on the upper surface of the connector 110, furthermore, they are improved in mechanical strength, and can be prevented from being deformed. Thus, reliable card ejection can be ensured for a long period of time.

When the memory card 97 or the interface card 100 is loaded into the card storing section 108, it is connected to the ground circuit of the body in a low-impedance state through the conductive portions 160 and the card conduction portions 124. Therefore, the computer and the card can be kept at the same ground potential, so that wrong operation of the card attributable to a potential difference can be restrained. Also, the design plates 154 of the card 97 or 100 can be securely connected to the ground, and a satisfactory shielding effect against electromagnetic radiation can be obtained.

The conductive portions 160 of each card 97 or 100 are provided individually on the side faces of the card, and their corresponding card conduction portions 124 on the computer side are arranged so as to face these side faces. When the card is loaded into or unloaded from the card storing section 108, therefore, the card conduction portions 124 cannot slide on the upper and lower surfaces of the card, that is, on the design plates 154, so that metallic powder can be prevented from being produced by such sliding motion. Thus, there is no possibility of metallic powder entering the computer body and causing wrong operation of the computer. Further, the coating on the design plates 154 cannot be removed by sliding contact with the card conduction portions 124, and the conductive portions 160 are arranged on the side faces of the card, so that the design plates can be improved in design properties.

In the arrangement for the memory card 97, the conductive portions 160 are fitted individually in the recesses in the side faces of the card. When the card 97 is loaded into the card receiver 116, therefore, the card conduction portions 124 are situated in the recesses, and serve to prevent the card from slipping out of the card receiver. Thus, the card 97 can be prevented from being unexpectedly removed from the card receiver 116.

As mentioned before, moreover, the conductive portions 160 of each card 97 or 100 are provided individually on the side faces of the card, and their corresponding card conduction portions 124 on the computer side are arranged so as to face these side faces. Even though various cards of different thicknesses are loaded into the card storing section 108, therefore, the conductive portions and the card conduction portions never fail to be brought stably into contact with one another within a predetermined error range (e.g., 0.1 mm). Thus, the card can be securely connected to the ground circuit of the computer body 1, so that a highly reliable shielding effect can be obtained.

The paired card storing sections 108 are arranged individually at the opposite end portions of the flat portion 82 which is situated between the keyboard and the rear portion of the computer body 1 on which the legs 3 of the display 2 are mounted. In the body 1, the region under the flat portion 82 is liable to become a dead space. The space in the body 1 can be effectively used, however, by utilizing this region for the formation of the card storing sections 108.

The following is a description of the expanding apparatus for expanding the function of the personal computer constructed in this manner.

Figure 30:
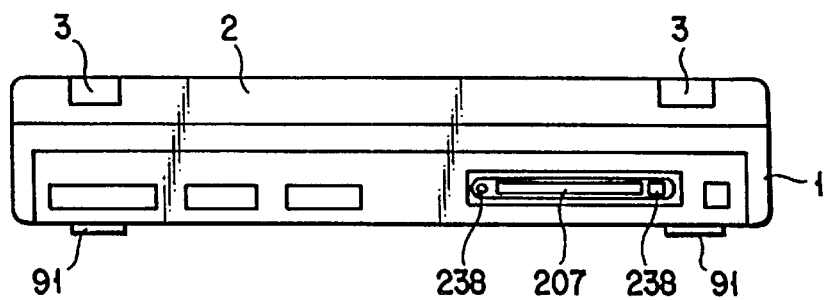

FIG. 24 shows a state immediately before the computer is attached to the expanding apparatus 215. In this state, the computer, having its display 2 closed, is in the form of a flat box as a whole. As shown in FIG. 30, a first plug-in connector 207 having a number of pin holes is provided on the rear face of the computer body 1. A fixing nut 238 having a positioning hole is arranged on each end side of the connector 207. The first connector 207 is connected to a circuit board 73 (see FIG. 12) in the body 1, and is located in a one-sided position deviated from the crosswise center of the body 1. When the computer is attached to the expanding apparatus 215, the first connector 207 is connected to a second plug-in connector 227 having a number of pins on the side of the apparatus 215, and the computer and the apparatus 215 are connected electrically to each other.

As shown in FIG. 24, the expanding apparatus 215 comprises a body case 216 in the form of a rectangular box. The case 216 contains an expanding unit 217 for expanding the functions of the computer, including, for example, a hard disk drive unit, FDD drive unit, circuit board for communication for use with a telephone circuit, circuit board for storage, etc., and a power supply unit (not shown) used to drive the unit 217.

The body case 216 includes a front portion 218a and a rear portion 218b. The top face of the front portion 218a constitutes a flat bearing surface 219 for carrying the computer thereon. The surface 219 is wider than the plane configuration of the computer body 1. The rear portion 218b projects above the level of the front portion 218a. A vertical connector setting surface 220 is formed at the boundary between the front and rear portions 218a and 218b. The surface 220 is continuous with the rear end of the bearing surface 219. Thus, the surface 219 is open to the top, front, and both sides of the body case 216.

A pair of guide rails 221a and 221b for sliding the computer back and forth along the bearing surface 219 are mounted individually on the opposite side portions, right and left, of the surface 219. Each of the rails 221a and 221b, formed of a plastic material, includes a first slide guide surface 222, raised above the bearing surface 219 and extending substantially parallel thereto, and a second slide guide surface 223 perpendicular to the surface 219. The first slide guide surface 22 is composed of a first portion 222a, situated on the front end side of the bearing surface 219, and a second portion 222b raised above the first portion 222a and extending to the connector setting surface 220. The first portion 222a of the first guide surface 222 guides its corresponding front leg 91 of the computer, while the second portion 222b guides its corresponding side edge portion of the bottom surface of the lower case 1b. The second guide surface 223 guides the lower part of its corresponding side face of the lower case 1b. Thus, when the computer is set 0 the bearing surface 219, it is guided between the respective second slide guide surfaces 223 of the guide rails 221a and 221b.

The connector setting surface 220 is provided with a second connector 227, which is connected to the expanding unit 217. The second connector 227 has a number of pin terminals to be inserted individually into the pin holes of the first connector 207 and a pair of positioning pins 237 for guiding the connectors in connection.

A fixing claw 170 is provided on the front end portion of each of the guide rails 221a and 221b. The claws 170 serve to fix the computer in a predetermined position on the expanding apparatus 215 when the computer is mounted on this predetermined position so that the first connector 207 is connected to the second connector 227. As shown in FIGS. 24 and 25, each fixing claw 170 is arranged for projection and retraction in an opening 171 in the second slide guide surface 223, and is situated over the first portion 222a of the first slide guide surface 222. The claws 170 can be fitted in the engaging grooves 92a formed in the front legs 91 of the computer.

Each fixing claw 170 is substantially in the form of a prism. Both angle portions of the distal end portion of the claw 170 is cut off so that the distal end portion is tapered. The proximal end portion of the claw 170 projects into the interior of the guide rail 221a or 221b through the opening 171. The fixing claw 170 is urged to project from the second slide guide surface 223 toward the bearing surface 219 by a compression spring 172, which is arranged between the proximal end of the claw 170 and the inner surface of its corresponding side wall of the body case 216. A flange 173 is formed around the proximal end portion of the claw 170. As the flange 173 engages the inner surface of the guide rail 221a or 221b, the claw 170 is prevented from slipping out of the opening 171, and is held in its projected position shown in FIG. 25. When the fixing claw 170 is pressed toward the rail 221a against the urging force of the spring 172, it is moved to its retreated position inside the opening 171.

Each fixing claw 170 is formed of an electrically conductive material, and connects electrically with the body case 216 by means of the compression spring 172.

The expanding apparatus 215 comprises a lock mechanism 174 for locking the paired fixing claws 170 in their respective projected positions. As shown in FIGS. 24 to 27, the lock mechanism 174 includes a lock plate 175 at the back of the bearing surface 219, a rocking lever 176, a slide lever 177 inside the right-hand side wall of the body case 216, and a lock key 178 for operating these members. The lock plate 175 extends so as substantially to cover the overall length of the case 216 in the crosswise direction. The plate 175 has three slots 180 extending in the longitudinal direction of the case 216. The slots 180 are penetrated individually by guide pins 180, which protrude from the inner surface of the case 216. Thus, the lock plate 175 is slidable in the longitudinal direction of the body case 216.

Two opposite end portions of the lock plate 174 are bent upward, and project individually into the guide rails 221a and 221b, thus individually forming lock pieces 181 which can engage their corresponding fixing claws 170.

The middle portion of the rocking lever 176 is rockably supported by means of a pivot 176a, which protrudes from the inner surface of the body case 216. One end of the lever 176 is rockably connected to the lock plate 175 by means of a pivot pin 182a. The other end of the lever 176 is rockably connected to one end of the slide lever 177 by means of a pivot pin 182b.

The slide lever 177 has a pair of slots 177a extending in the longitudinal direction of the body case 216, and is slidably supported on the inner surface of the case 216 by means of guide pins 183, which penetrate the slots 177a, individually. A projection 184a and an arcuate cam face 184b continuous therewith are formed on the other end portion of the lever 177.

The lock key 178 includes a key cylinder 185 fixed to the right-hand side wall of the body case 216, and a keyhole 185a of the cylinder 185 is exposed to the right-hand side face of the case 216. The key cylinder 185 is located in the vicinity of the other end portion of the slide lever 177. A push arm 186 is fixed on the outer circumferential surface of the cylinder 185, and a push pin 187 is attached to the distal end portion of the arm 186. One side of the arm 186 is in contact with the projection 184a of the slide lever 177, and the pin 187 is in engagement with the cam face 184b.

Figure 27:
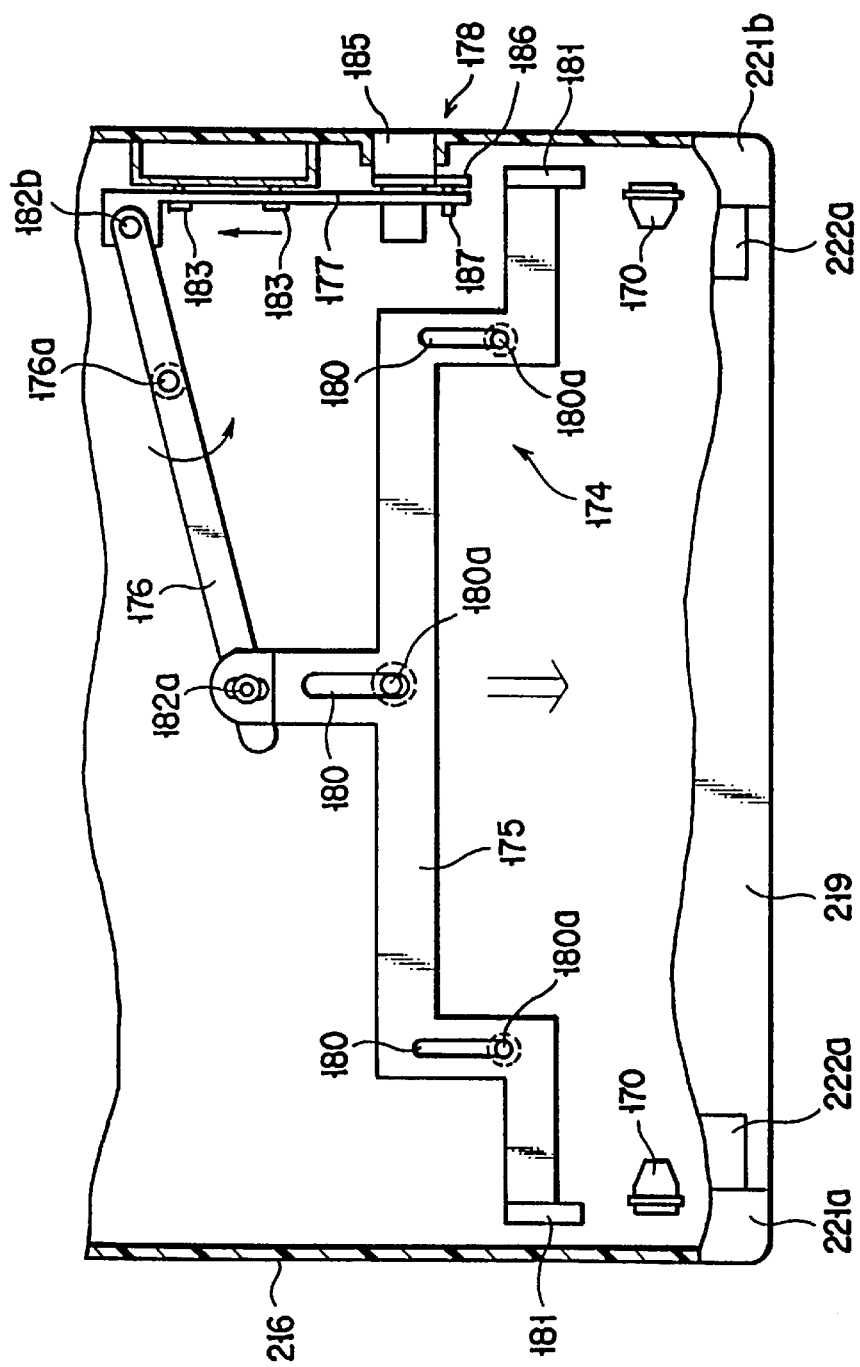
Figure 28:
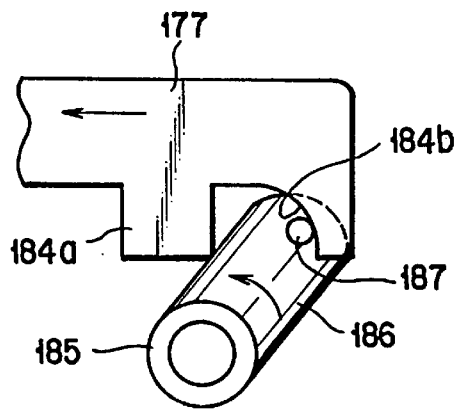
Figure 29:
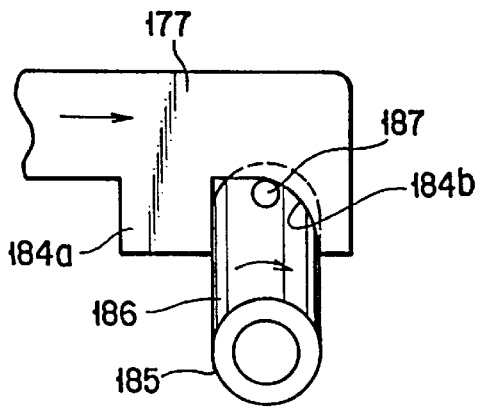

According to the expanding apparatus constructed in this manner, each fixing claw 170 projects over the first slide guide surface 222, and the lock plate 175 is kept in its retreated position shown in FIG. 27, where the lock pieces 181 are disengaged from their corresponding fixing claws 170, before the computer is fitted to the apparatus 215. In this state, the key cylinder 185 is kept in its release position shown in FIG. 28. When the cylinder 185 is rotated from the release position shown in FIG. 28 to its lock position shown in FIG. 29 by means of a key 188 inserted in the keyhole 185a, the projection 184a of the slide lever 177 is pressed by a side face of the push arm 186 so that the lever 177 is moved toward the rear side of the body case 216. In response to this, the rocking lever 176 is rotated in the counterclockwise direction of FIG. 27 around the pivot 176a, whereupon the lock plate 175 is moved forward with respect to the body case 216, from the retreated position to its engaging position. When the plate 175 is in the engaging position, each lock piece 181 engages its corresponding fixing claw 170, as indicated by two-dot chain line in FIG. 25, thereby locking the claw 170 in the projected position.

When the key cylinder 185 is rocked from the lock position to the release position, the slide lever 177 is moved toward the front side of the body case 216 by the push pin 187, which is in engagement with the cam face 184b. As a result, the lock plate 175 is restored to the retreated position, and the fixing claws 170 are unlocked.

The expanding apparatus 215 further comprises an ejector mechanism for ejecting the computer in the predetermined position on the bearing surface 219. As shown in FIG. 24, this ejector mechanism includes an operating knob 280 slidably arranged adjacent to the key cylinder 185, on the right-hand side wall of the body case 216, and a pair of pushers 242a and 242b which can project over the bearing surface 219 from a pair of openings 240a and 240b in the connector setting surface 220. As the knob 280 is slid in the direction of the arrow of FIG. 24 with the computer mounted in place, the pushers 242a and 242b push the rear face of the computer body 1, whereby the first connector 207 of the computer and the second connector 227 of the expanding apparatus 215 are disconnected from each other. The construction of the ejector mechanism will be described in detail later.

In attaching the computer to the expanding apparatus 215, the computer is mounted between the guide rails 221a and 221b in a manner such that the opposite end portions of the bottom face of the rear portion of the computer body 1 are situated individually on the respective second portions 222b of the first slide guide surfaces 222, and that the front legs 91 of the body 1 are situated individually on the respective first portions 222a of the surfaces 222. In doing this, each fixing claw 170 is kept in the projected position where it projects over its corresponding first portion 222a, as shown in FIG. 31.

Figure 33:
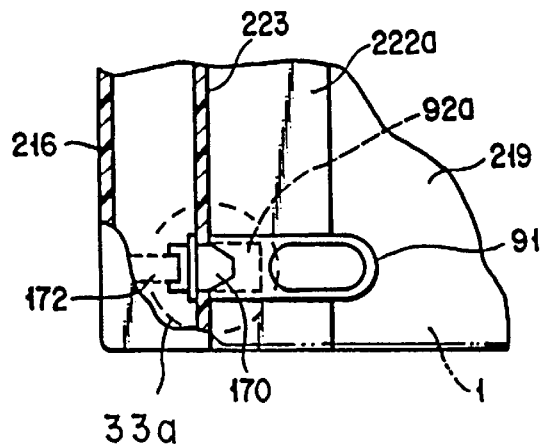
Figure 33A:
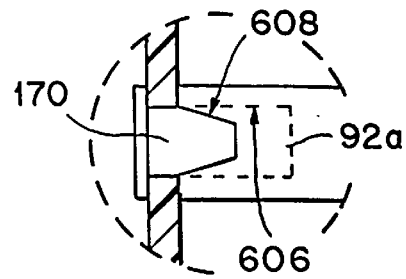
Figure 34:
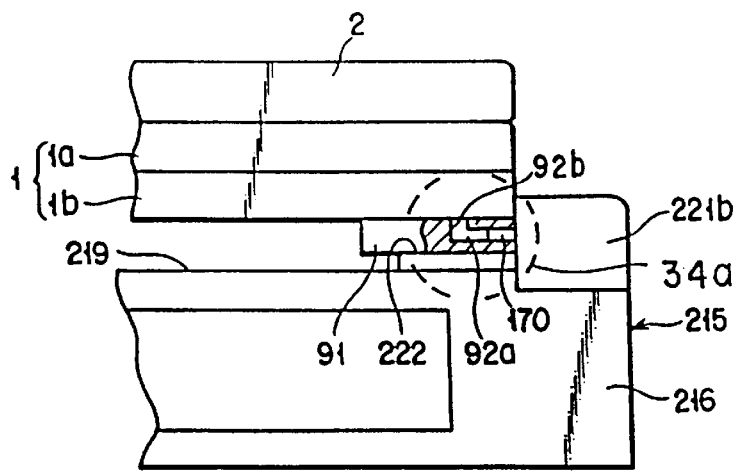
Figure 34A:
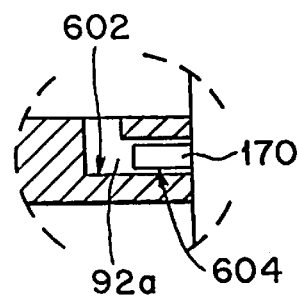

When the computer is slid toward the connector setting surface 220 of the body case 216, in this state, each fixing claw 170 is pushed into the retreated position by its corresponding leg 91, as shown in FIG. 32. When the computer is slid further backward, the first connector 207 of the computer is connected to the second connector 227 of the expanding apparatus 215. At the same time, the engaging groove 92a of each leg 91 reaches a position where it faces its corresponding fixing claw 170. Thereupon, the claw 170 moves again to the projected position, and is fitted in the groove 92a of its corresponding leg 91, as shown in FIGS. 33 and 34. Accordingly, the computer is securely connected to the expanding apparatus 215 as it is positioned. Thereafter, the fixing claws 170 are locked in their respective projected positions by shifting the lock mechanism to the lock position by means of the key 188. Thus, the computer cannot be unexpectedly disconnected from the apparatus 215 during the operation, so that data destruction or the like can be prevented. Further, the rear end portion of the computer body 1 cannot be unexpectedly lifted while the connectors 207 and 227 are connected to each other, so that the connectors can be securely prevented from being damaged.

Furthermore, each fixing claw 170 is formed of an electrically conductive material, and the inner surface of the engaging groove 92a of each leg 91 of the computer body 1 is covered by a conductive film, which connects electrically with the body 1. Accordingly, the computer body 1 is groundedly connected to the body case 216 of the expanding apparatus 215 by means of the legs 91, fixing claws 170, and the compression springs 172. Thus, the computer can be prevented from being adversely affected by electromagnetic waves from the apparatus 215.

Figure 35:
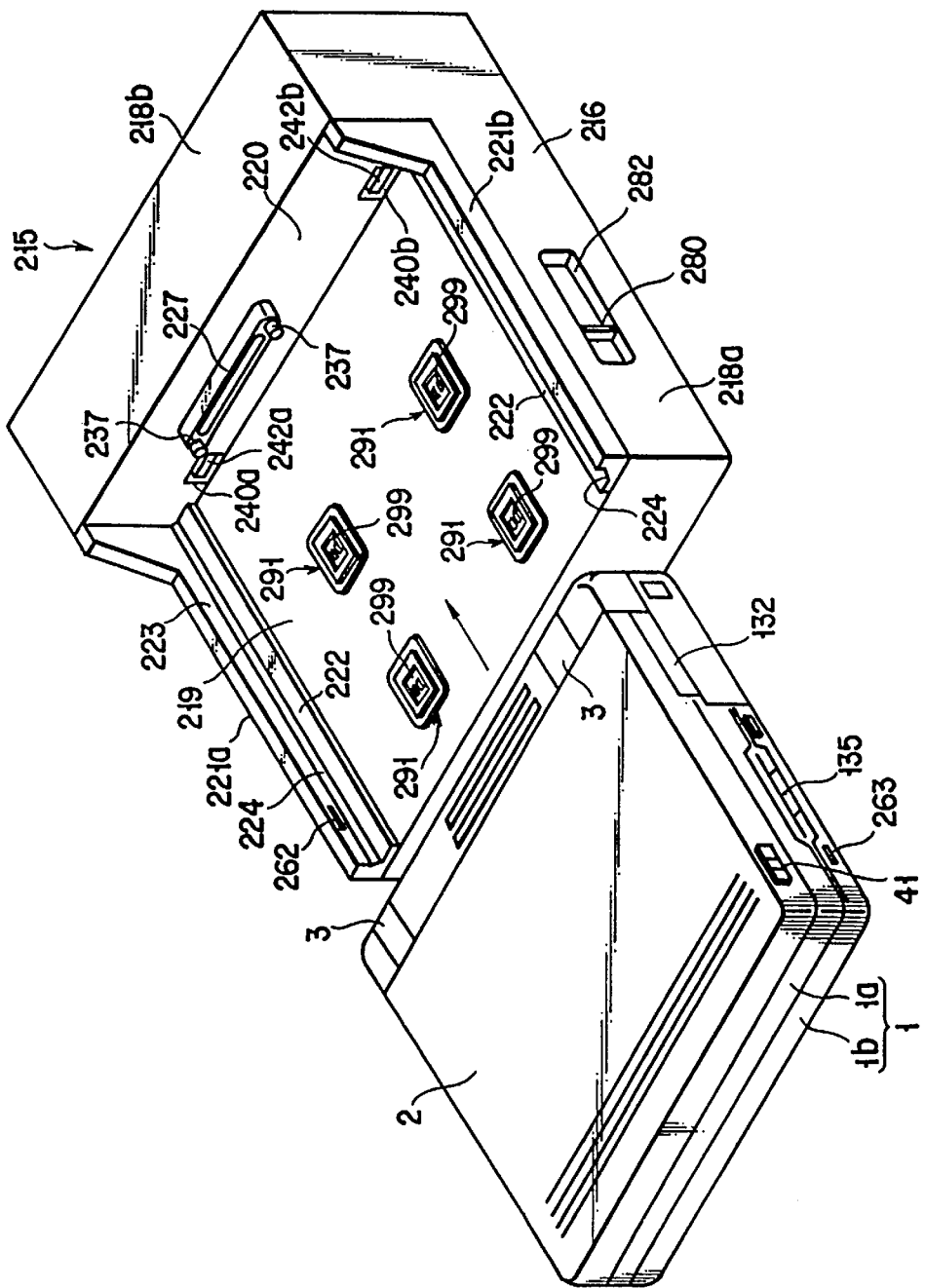

The following is a description an expanding apparatus according to a second embodiment used with a personal computer. As shown in FIG. 35, the expanding apparatus 215 according to the second embodiment differs from the foregoing apparatus in the structure of the fixing claws to engage the computer and in the grounding arrangement for electrically connecting the computer and the expanding apparatus.

As shown in FIGS. 35 to 37, moreover, the personal computer combined with the expanding apparatus 215 is constructed substantially in the same manner as the foregoing computer. According to the second embodiment, however, the angle portions between the bottom face and opposite side faces of a computer body 1 are chamfered throughout the length. This chamfering provides a pair of guide surfaces 212a and 212b individually on the opposite sides, left and right, of the bottom of the body 1, declined toward the crosswise center of the body 1. Extensions Xl of these guide surfaces 212a cross each other on a center line O1 of the computer body 1.

Right- and left-hand front legs 91 of the body 1 are arranged at short distances from their corresponding side faces of the body. Each front leg 91 has no engaging groove, and instead, an engaging groove 263 to be fitted with each corresponding fixing claw (mentioned later) of the expanding apparatus 215 is formed at the front portion of each side face of the body 1.

The expanding apparatus 215 will now be described in detail.

Figure 41:
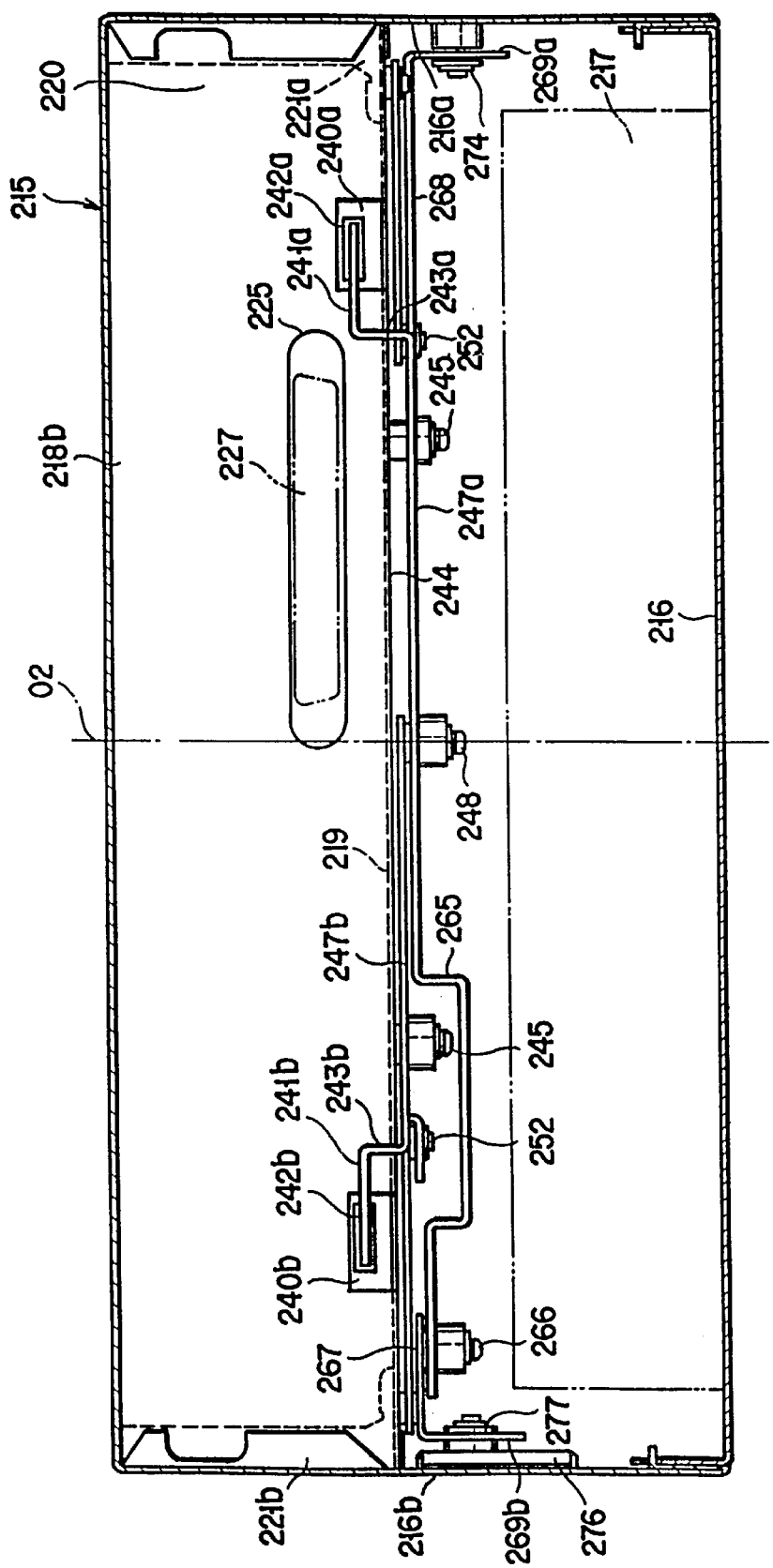

As shown in FIG. 35, the expanding apparatus 215 comprises a body case 216 in the form of a rectangular box. The case 216 contains an expansion unit 217 for expanding the functions of the computer, including, for example, a hard disk drive unit, FDD drive unit, circuit substrate for communication for use with a telephone circuit, circuit substrate for storage, etc., and a power supply unit (not shown) used to drive the unit 217, as shown in FIGS. 41, 46, etc.

The body case 216 includes a front portion 218a and a rear portion 218b. The top face of the front portion 218a constitutes a flat bearing surface 219 for carrying the computer thereon. The surface 219 is a little wider than the plane configuration of the computer body 1. The rear portion 218b projects above the level of the front portion 218a. A vertical connector setting surface 220 is formed at the boundary between the front and rear portions 218a and 218b. The surface 220 is continuous with the rear end of the bearing surface 219. Thus, the surface 219 is open to the top, front, and both side of the body case 216.

A pair of guide rails 221a and 221b for sliding the computer back and forth along the bearing surface 219 are mounted individually on the opposite side portions, left and right, of the surface 219. Each of the rails 221a and 221b, formed of a plastic material, includes a first slide guide surface 222, adapted to be in sliding contact with each corresponding side portion of the bottom face of the computer body 1, a second slide guide surface 223, adapted to be in sliding contact with each corresponding side face of the body 1, and a third slide guide surface 224, adapted to be in sliding contact with each corresponding guide surface 212a or 212b of the body 1. The third slide guide 224 is inclined toward the the crosswise center of the bearing surface 219 with distance from the second slide guide surface 223. The angle of inclination of the surface 224 is equal to that of the guide surfaces 212a and 212b. As shown in FIG. 38, extensions X2 of the third slide guide surfaces 224 cross each other on a center line O2 which passes the crosswise center of the bearing surface 219.

Thus, when the computer is set on the bearing surface 219, it is held between the respective second slide guide surfaces 223 of the guide rails 221a and 221b, and the guide surfaces 212a and 212b of the body 1 come into their corresponding third slide guide surfaces 224. As this is done, the center line O2 of the surface 219 is aligned with the center line O1 of the body 1, whereupon the computer is positioned in the crosswise direction thereof with respect to the bearing surface 219.

Figure 39:
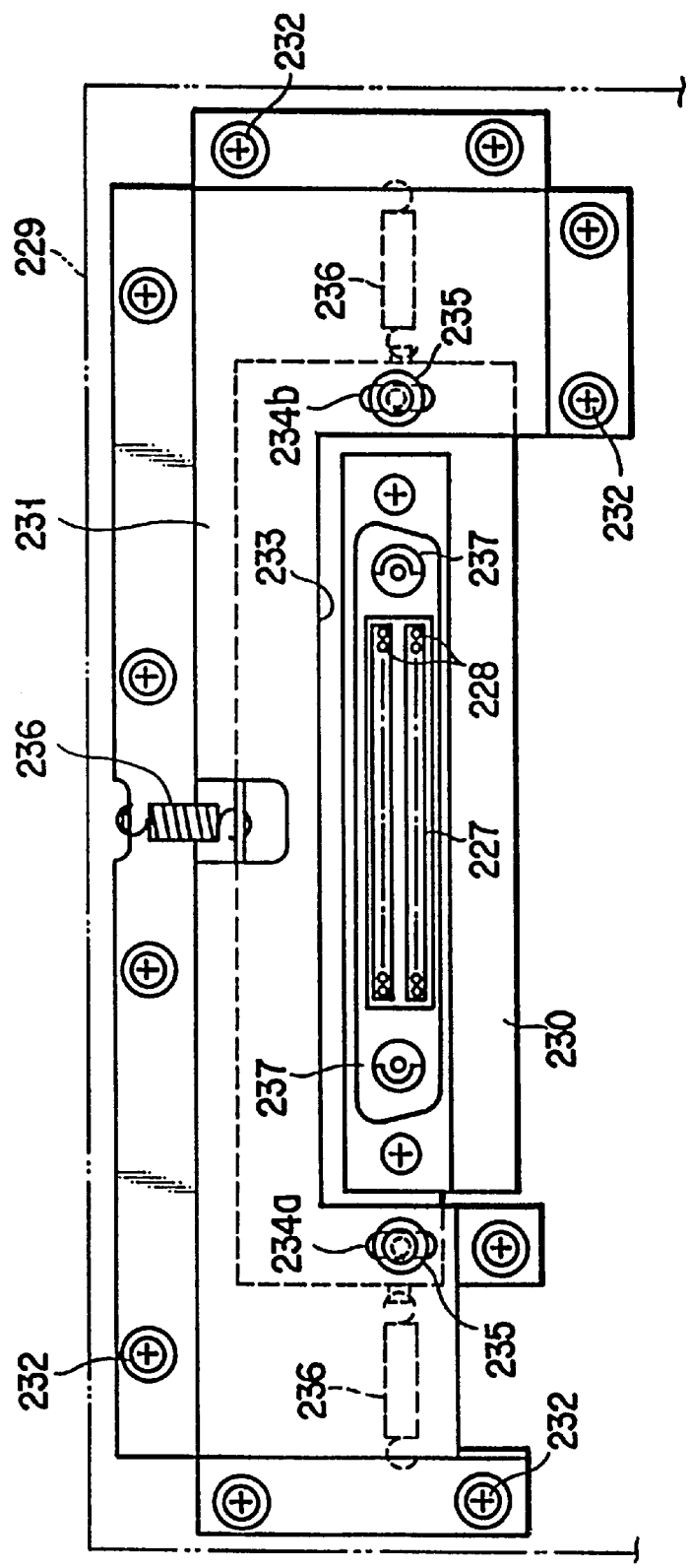
Figure 40:
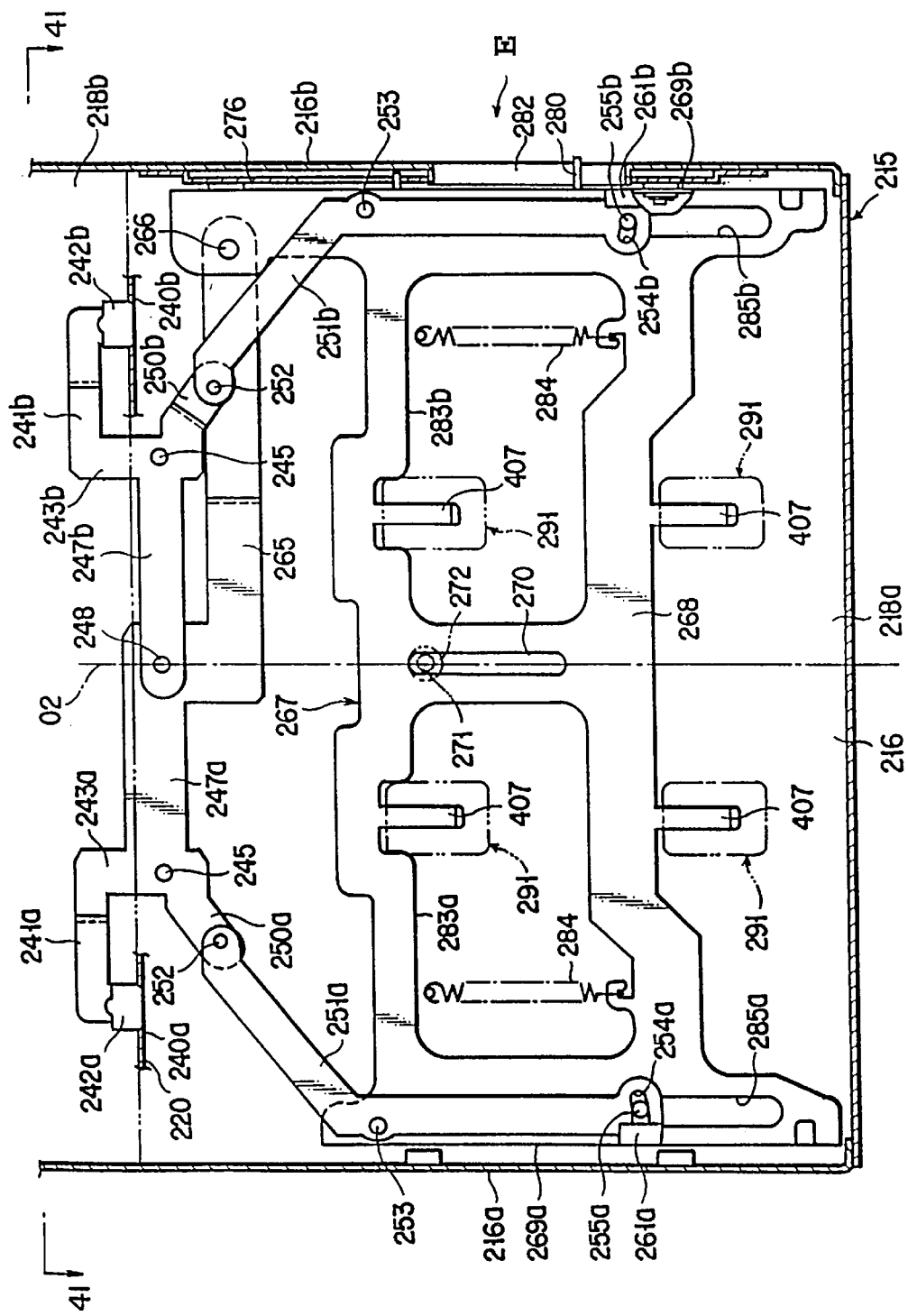

A second connector 227, which is connected to the expansion unit 217, is provided on the rear portion 218b of the body case 216. As shown in FIG. 39, the second connector 227 has a number of pin terminals 228 to be inserted individually into the pin holes of the first connector 207 of the computer. As shown in FIG. 41, the connector 227 projects from an aperture 225, which opens on the connector setting surface 220. The second connector 227 is located in a one-sided position on the surface 220, which is deviated from the center line O2 of the bearing surface 219, and is supported afloat by a frame 229 in the body case 216.

The following is a description of this supporting structure. As shown in FIG. 39, the second connector 227 is screwed to a connector holder 230. The holder 230 is supported on a bracket 231 for movement in the vertical and crosswise directions. The bracket 231 is fixed to the frame 229 by means of screws 232, and the connector holder 230 is interposed between the bracket 231 and a frame 229. The bracket 231 is formed having a notch 233 through which the second connector 227 is exposed to the outside. Vertically extending slots 234a and 234b are formed in the bracket 231 on the left- and right-hand sides of the notch 233, respectively. A screw 235 is passed through each of the slots 234a and 234b. The screw 235 is loosely fitted in each slot with play in the vertical and crosswise directions. The inserted end of each screw 235 is screwed into the connector holder 230. Thus, the holder 230 is movable relatively to the bracket 231, for distances corresponding to the play between the slots 234a and 234b and their corresponding screws 235, in the vertical and crosswise directions.

Tension coil springs 236 are stretched individually between the respective opposite side portions and top central portions of the bracket 231 and the connector holder 230. The springs 236 pull the holder 230 from side to side and upward, and the holder 230 is elastically held in a position such that the respective tensile forces of the springs 236 are balanced.

Positioning pins 237 protrude individually from the opposite side portions of the second connector 227. Before the pin holes of the first connector 207 and the pin terminals 228 of the second connector 227 are connected, the positioning pins 237 get individually into aligning holes 238a (see FIG. 36) of fixing nuts, which are situated individually on the opposite sides of the front face of the first connector 207. Thereupon, the second connector 227, supported afloat, is moved, and the pin holes and the pin terminals 228 can be accurately aligned with one another.

More specifically, the computer placed on the bearing surface 219 is slid toward the connector setting surface 220, and is pushed into a predetermined position such that the rear face of the computer body 1 touches or approaches the surface 220. Thereupon, the positioning pins 237 first get into their corresponding holes 238a, thereby aligning the first and second connectors 207 and 227 with each other. Then, the first and second connectors 207 and 227 are fitted with each other, whereby the computer and the expanding apparatus 215 are connected electrically with each other.

The body case 216 contains a fixing mechanism for maintaining the connection of the computer connected in the aforesaid manner, a grounding mechanism for groundedly connecting the computer to the expanding apparatus 215, and an ejector mechanism for ejecting the computer from the apparatus 215. These mechanisms are arranged for interlocked operation.

The ejector mechanism will be described first. A pair of opening portions 240a and 240b are formed at the angle portion between the connector setting surface 220 and the bearing surface 219 of the body case 216. The opening portions 240a and 240b open into the rear portion 218b of the case 216, on the left- and right-hand sides of the second connector 227, respectively. As shown in FIGS. 40 to 43, a pair of push levers 241a and 241b are arranged in the rear portion 218b. The levers 241a and 241b are used to push out the computer body 1 from the predetermined position on the bearing surface 219. Plastic pushers 242a and 242b, which cover the respective one-side ends of the levers 241a and 241b, face the opening portions 240a and 240b, respectively. The respective other ends of the push levers 241a and 241b constitute pivotal portions 243a and 243b, respectively, which extend under the bearing surface 219, inside the body case 216. Each of the pivotal portions 243a and 243b is rotatably supported on a supporting surface 244 inside the bearing surface 219 by means of a pivot 245.

The pivotal portions 243a and 243b are continuous with interlocking arms 247a and 247b, respectively, which extend toward each other. The respective distal ends of the arms 247a and 247b, which overlap each other on the center line O2 of the bearing surface 219, are rotatably connected to each other by means of a pivot 248. The pivotal portions 243a and 243b are formed integrally with connecting pieces 250a and 250b, respectively, which extend opposite to their corresponding interlocking arms 247a and 247b. One-side ends of a pair of rocking arms 251a and 251b are pivotally supported on the pieces 250a and 250b, respectively, by means of pivots 252.

The rocking arms 251a and 251b extend in the longitudinal direction along the guide rails 221a and 221b, at the left- and right-hand side portions of the bearing surface 219, respectively. The intermediate portion of each of the arms 251a and 251b is rotatably supported on the supporting surface 244 by means of a pivot shaft 253. Guide holes 254a and 254b are formed in the respective other end portions of the arms 251a and 251b, which extend close to the front end portion of the supporting surface 244. The guide holes 254a and 254b are each in the form of a slot extending along a circular arc around the pivot shaft 253. Guide shafts 255a and 255b are slidably fitted in the guide holes 254a and 254b, respectively. The shafts 255a and 255b protrude downward from the supporting surface 244. The rocking angle of the rocking arms 251a and 251b is determined as the shafts 255a and 255b are fitted in their corresponding holes 254a and 254b.

Figure 47:
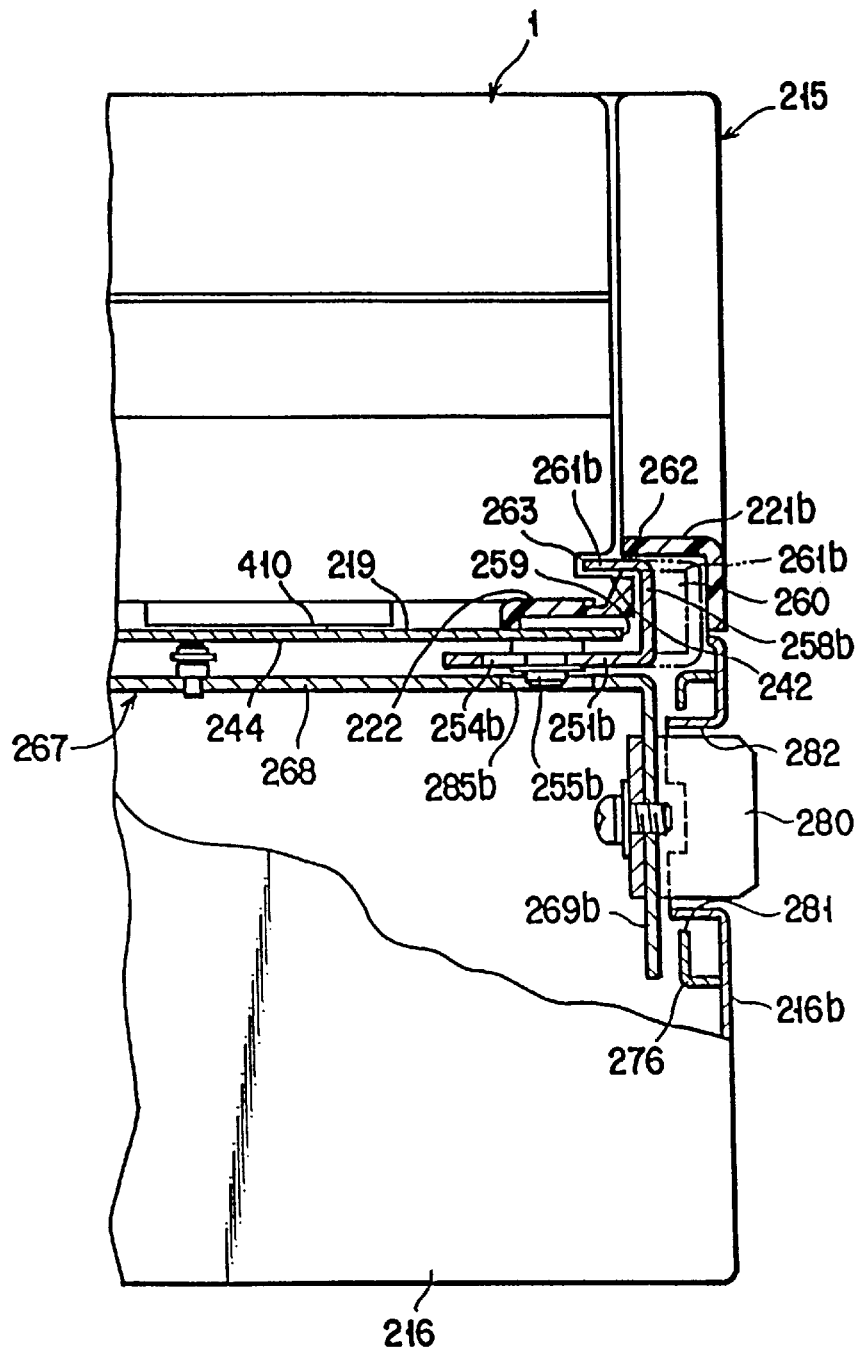
Figure 49:
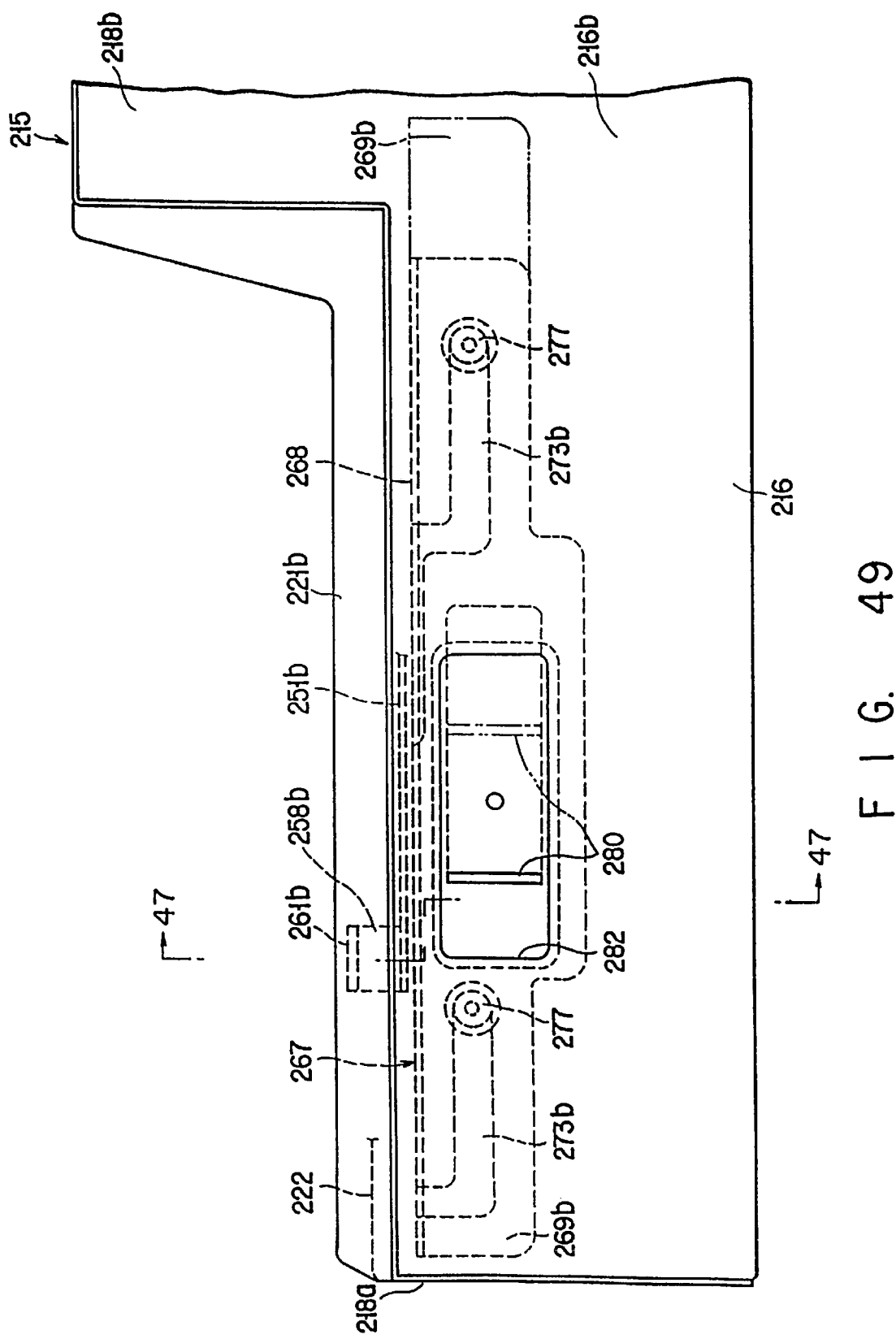
Figure 51:
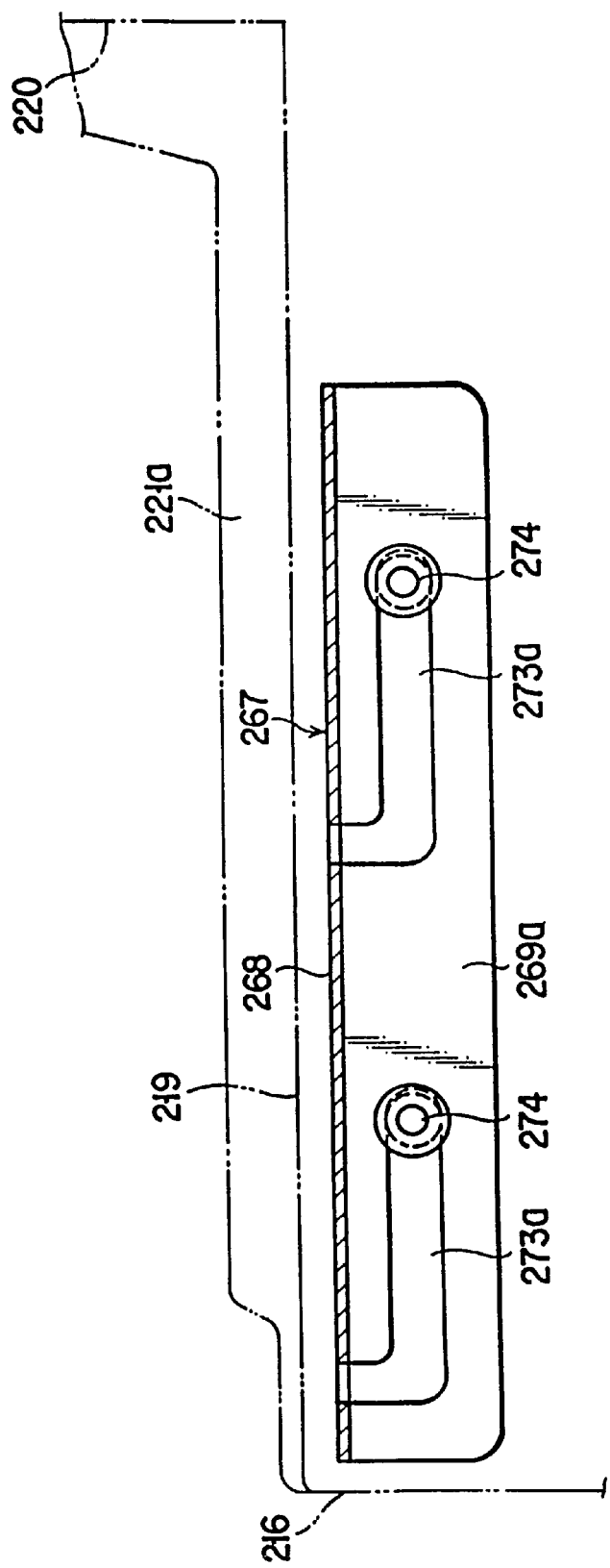

As shown in FIGS. 46 and 47, upwardly bent pieces 258a and 258b are formed on the other ends of the rocking arms 251a and 251b, respectively. Apertures 259 are bored individually through the opposite side portions of the bearing surface 219, corresponding in position to these bent pieces 258a and 258b, and the guide rails 221a and 221b are formed individually having compartments 260, which communicate individually with the apertures 259. Thus, the bent pieces 258a and 258b are introduced into their corresponding compartments 260 through the apertures 259. Fixing claws 261a and 261b are formed on the respective distal ends of the pieces 258a and 258b, respectively, so as to extend toward each other. The claws 261a and 261b individually face access holes 262 which open on the respective second slide guide surfaces 223 of their corresponding guide rails 221a and 221b. When the rocking arms 251a and 251b are rocked, the claws 261a and 261b project over the guide surfaces 223 through the holes 262, individually. As shown in FIGS. 35 and 47, moreover, the engaging grooves 263, which can be releasably engaged with their corresponding fixing claws 261a and 261b, are formed individually at the respective front portions of the side faces of the computer body 1 which are in sliding contact with the second slide guide surfaces 223, individually. Thus, the arms 251a and 251b and the claws 261a and 261b constitute the fixing mechanism.

The fixing claws 261a and 261b are linked to the push levers 241a and 241b by means of the rocking arms 251a and 251b and the connecting pieces 250a and 250b, respectively. In the present embodiment, the arms 251a and 251b and the pieces 250a and 250b constitute an interlocking mechanism for interlocking the push levers 241a and 241b of the ejector mechanism and the fixing claws 261a and 261b of the fixing mechanism.

As shown in FIGS. 40 to 43, an operating arm 265 is formed integrally with the interlocking arm 247a of the one push lever 241a. The arm 265 extends on the opposite side of the pivot position of the lever 241a with respect to the center line O2 of the bearing surface 219. The distal end of the arm 265 is rockably connected to an operating plate 267, which constitutes an operating mechanism, by means of a pivot 266. The plate 267, which serves to rotate the push levers 241a and 241b and the rocking arms 251a and 251, includes a base portion 268, arranged along the supporting surface 244, and a pair of slide portions 269a and 269b, left and right, bent downward from the left- and right-hand side portions of the base portion 268. A longitudinally extending guide hole 270 is formed in the central portion of the base portion. The hole 270 is penetrated by a pivot 271 which protrudes from the supporting surface 244. A push member 272, which is in sliding contact with the underside of the peripheral edge portion of the opening of the guide hole 270, is arranged at the lower end of the pivot 271. The slide portions 269a and 269b of the operating plate 267 are arranged inside and in close vicinity left- and right-hand side walls 216a and 216b of the body case 216, respectively. As shown in FIGS. 47 to 51, each of the slide portions 269a and 269b has longitudinally extending slide holes 273a or 273b at two positions spaced in the longitudinal direction. Guide rollers 274 are slidably fitted in the slide holes 273a of the one slide portion 269a, individually. These rollers 274 are supported on the one side wall 216a of the body case 216. Also, a roller holder 276 is attached to the other side wall 216b of the case 216. The holder 276 is located close to the other slide portion 269 of the operating plate 267, and guide rollers 277, which are slidably fitted in the slide holes 273b, are supported individually on the front and rear end portions of the holder 276. Thus, the operating plate 267 is supported for longitudinal sliding motion with the guide rollers 274 and 277 in the slide holes 273a and 273b.

An operating knob 280 is mounted on the other slide portion 269b of the operating plate 267. The knob 280 is led out of the body case 216 through a relief 281 in the roller holder 276 and a longitudinally extending through hole 282 in the side wall 216b of the body case 216. The knob 280 can be externally nipped between finger tips.

Figure 42:
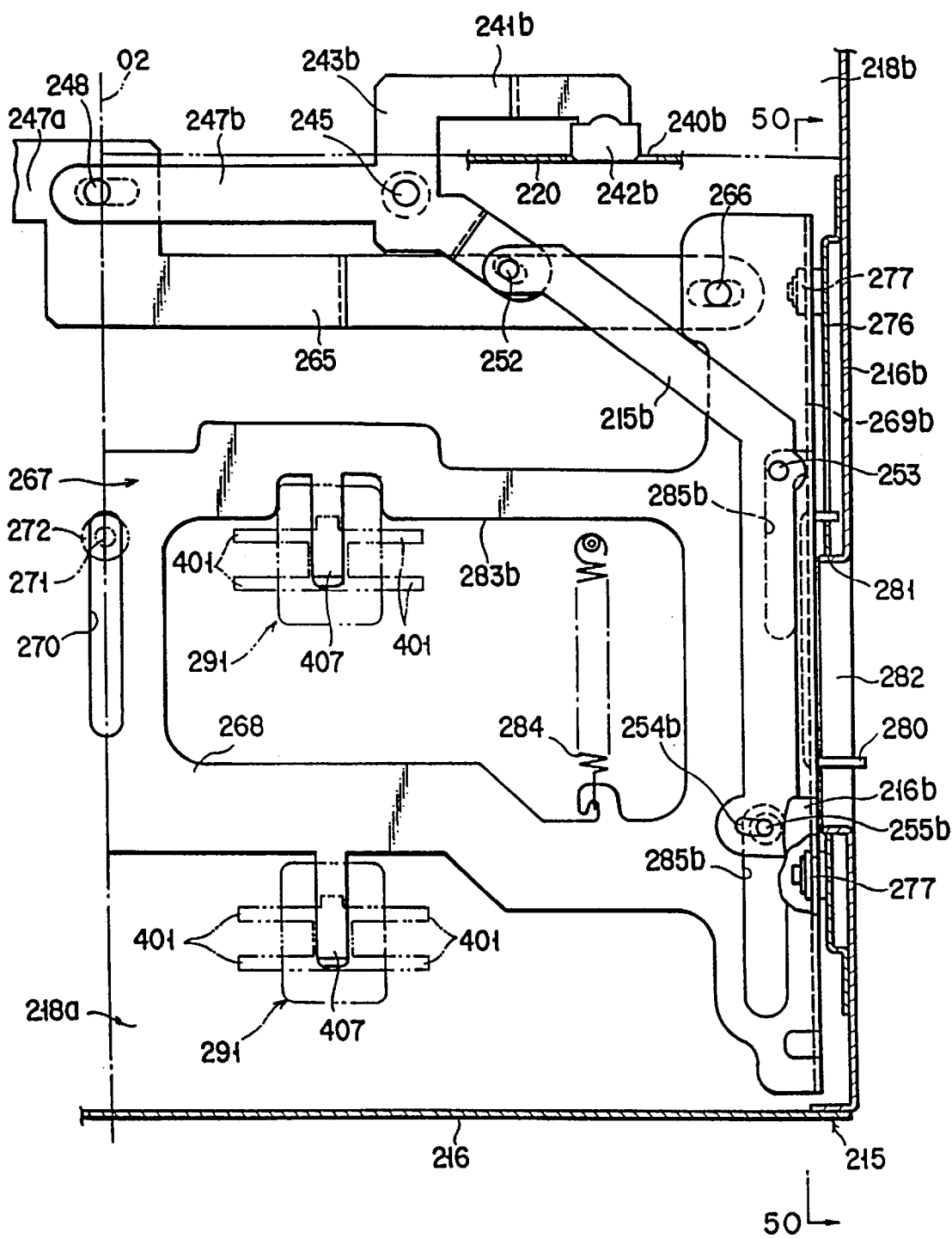
Figure 43:
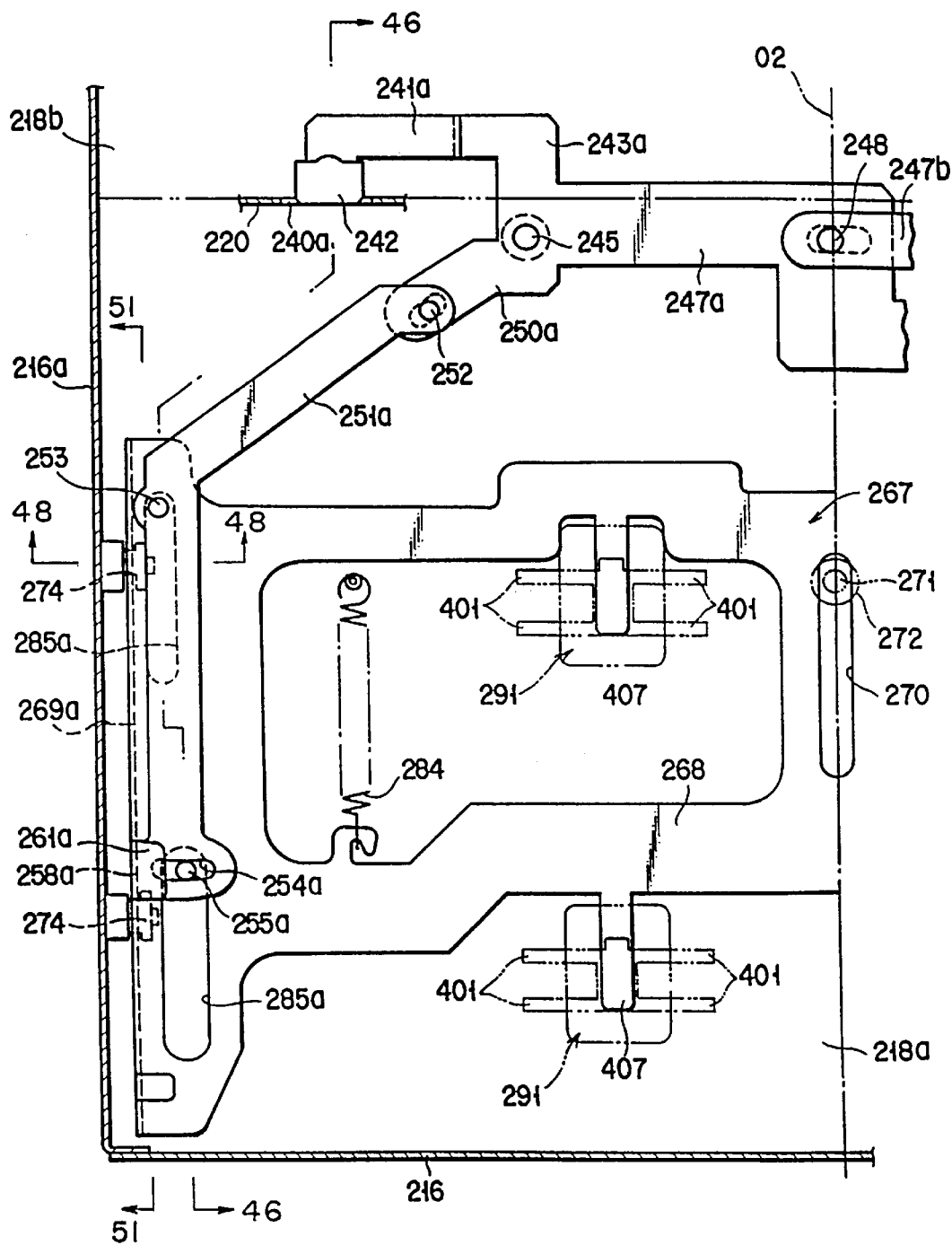
Figure 44:
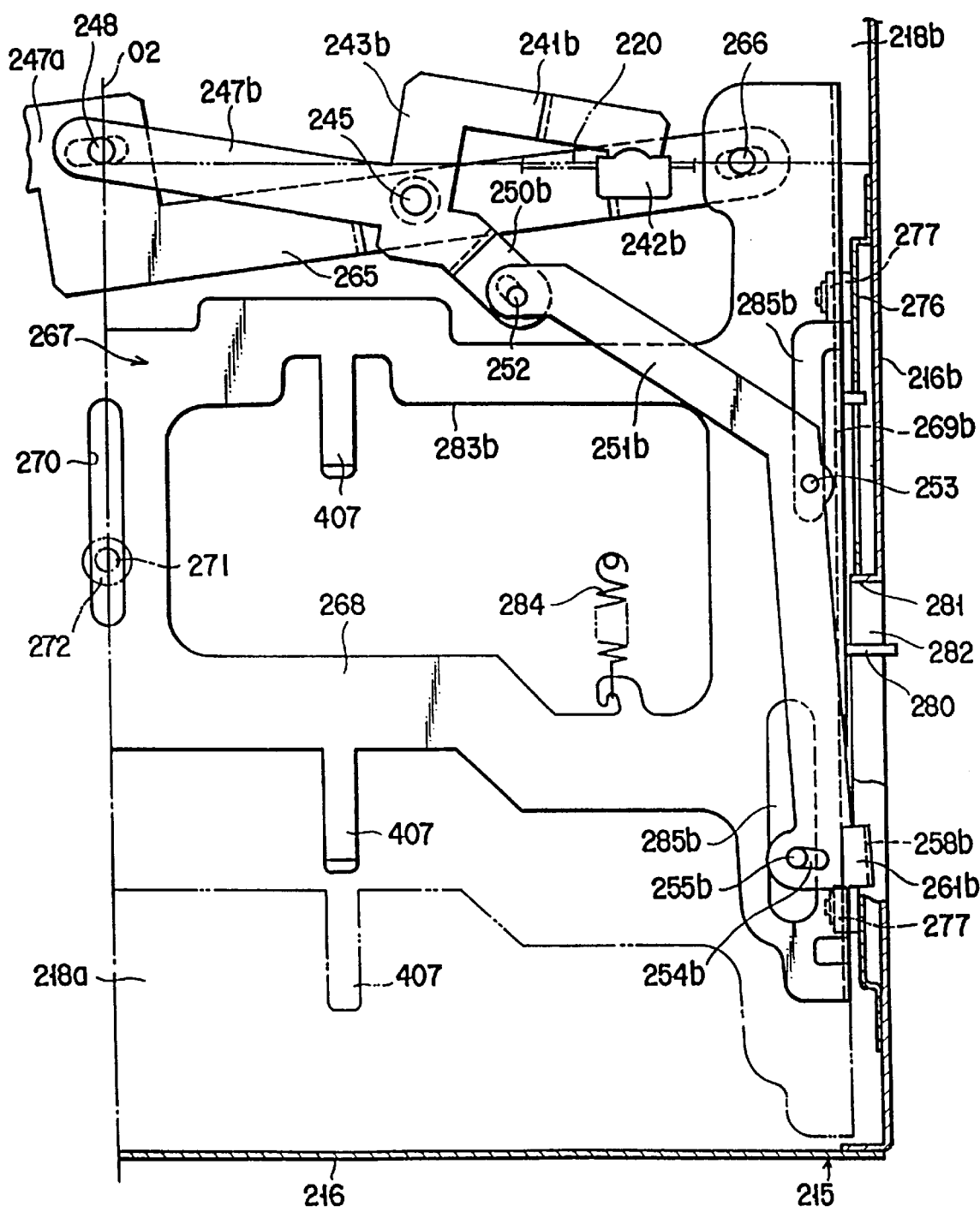
Figure 45:
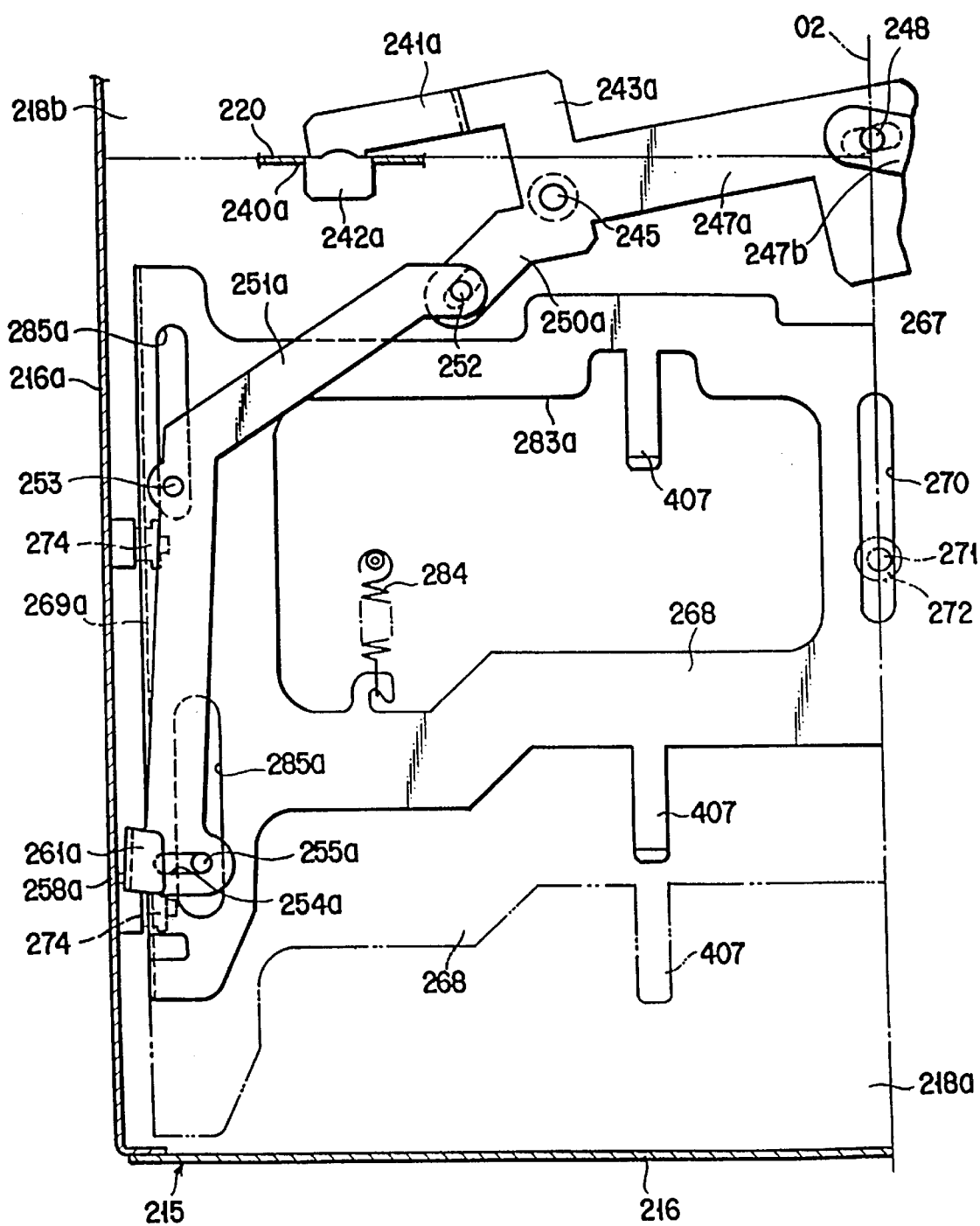

By moving the operating knob 280 back and forth, the operating plate 267 can be reciprocated between an engaged position at the front portion of the bearing surface 219, as shown in FIGS. 42 and 43, and a disengaged position at the rear portion of the surface 219, as shown in FIGS. 44 and 45. The reciprocation of the plate 267 is converted into a rocking motion by means of the operating arm 265, and the rocking motion is transmitted to the interlocking arms 247a and 247b. When the operating plate 267 is slid to the engaged position, the push levers 241a and 241b rock so that the arms 247a and 247b are arranged in a straight line, and the respective pushers 242a and 242b of the push levers withdraw into the opening portions 240a and 240b without projecting over the connector setting surface 220. As the levers 241a and 241b rock in this manner, moreover, the rocking arms 251a an. 251b rock toward each other around their corresponding pivots 253, and the fixing claws 261a and 261b project individually from the respective access holes 262 of the guide rails 221a and 221b.

When the operating plate 267 is slid to the disengaged position, as shown in FIGS. 44 and 45, on the other hand, the one interlocking arm 247a rotates counterclockwise around its corresponding pivot 245 through the medium of the operating arm 265, so that the pivot 248, which connects the interlocking arms 247a and 247b, is pushed out backward. As a result, the other interlocking arm 247b rotates clockwise around its corresponding pivot 245. As this is done, the pushers 242a and 242b of the push levers 241a and 241b project forward from the connector setting surface 220 through the opening portions 240a and 240b, respectively. As the levers 241a and 241b rotate, moreover, the rocking arms 251a and 251b rock away from each other around their corresponding pivots 253, and the fixing claws 261a and 261b are pulled into the compartments 260 in the guide rails 221a and 221b, respectively, through their corresponding apertures 259.

Hollows 283a and 283b for weight reduction are formed in the base portion 268 of the operating plate 267, on the left and right sides of the guide hole 270, respectively. A pair of return springs 284, tension coil springs, are arranged in the hollows 283a and 283b and stretched between the supporting surface 244 and the operating plate 267, respectively. These springs 284 continually urge the operating plate 267 toward the disengaged position.

Since the rocking arms 251a and 251b are located in the narrow gap between the base portion 268 of the operating plate 267 and the supporting surface 244 of the body case 216, as shown in FIGS. 47 and 48, reliefs 285a and 285b for preventing interference with the pivots 253 and the guide shafts 255a and 255b are formed individually at the left- and right-hand side portions of the base portion 268, respectively.

Figure 54:
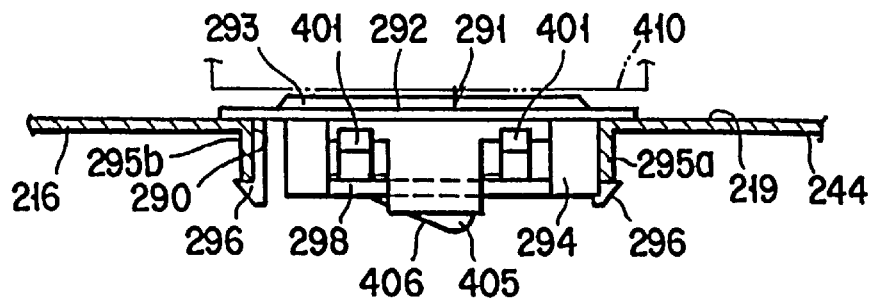

As shown in FIGS. 35 and 54, four terminal mounting holes 290 are formed in the bearing surface 219 of the body case 216. The holes 290 are fitted individually with four grounding terminal units 291, which constitute the grounding mechanism. Since all these terminal units 291 are constructed in the same manner, only one unit will now be described in behalf of them.

As shown in FIGS. 52 to 58, the grounding terminal unit 291 comprises a plastic terminal holder 292. The holder 292 includes a base portion 293, which has a terminal hole 293a opening on the bearing surface 219, and a fitting wall portion 294 protruding from the base portion 293 and fitted in the terminal mounting hole 290. Flange portions 295a and 295b, which are bent toward the interior of the body case 216, are formed on the front-and rear-end opening edge portions of the hole 290, respectively. The terminal holder 292 is fixed on the bearing surface 219 in a manner such that claw portion 296 at the distal end portion of the fitting wall portion 294 are hooked to the respective distal ends of the flange portions 295a and 295b. The holder 292 is situated above the base portion 268 of the operating plate 267. Without regard to the position of the plate 267, engaged or disengaged, moreover, the holder 292 is located ahead of the base portion 268 and inside its corresponding hollow 283a or 283b.

A plastic lift plate 298 is held in position inside the fitting wall portion 294 for vertical sliding motion. A terminal piece 299 is supported on the upper surface of the lift plate 298. The piece 299 is an elastically deformable structure formed by bending a thin metal sheet. Contact portions 400 of the piece 299 face the terminal hole 293a. Four belt-shaped spring portions 401 are formed integrally with the opposite side portions, left and right, of the terminal piece 299. Each spring portion 401 extends toward each corresponding side portion of the terminal holder 292, and is bent so that it gets nearer to the inside of the bearing surface 219, that is, the supporting surface 244, with distance from its proximal end. The distal end of each spring portion 401 is in contact with the surface 244. Thus, the lift plate 298 and the terminal piece 299 are continually pressed and urged downward by the spring portions 401, and the contact portions 400 of the piece 299 are depressed below the open end of the terminal hole 293a.

Figure 55:
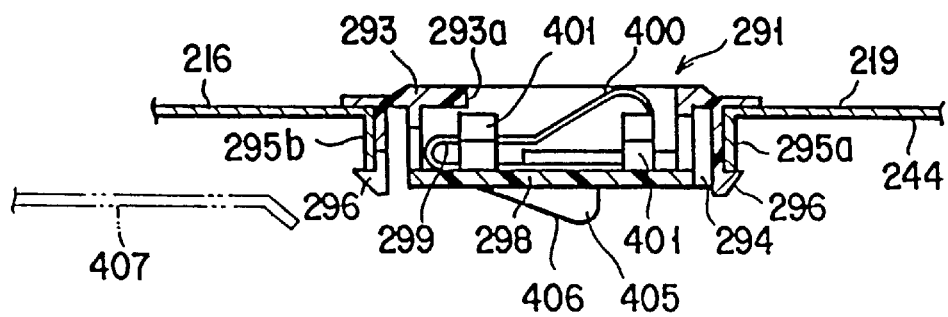
Figure 56:
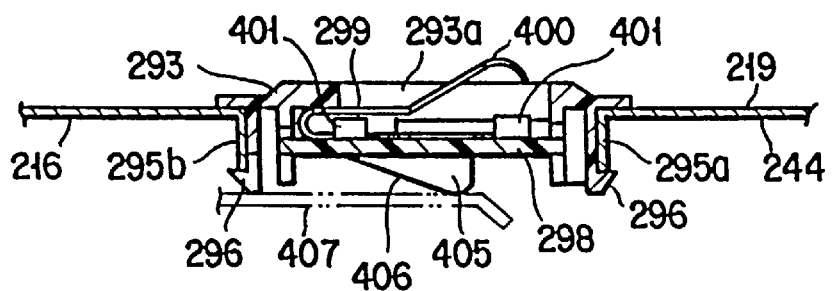

Wall portions 405 protrude downward from the lower surface of the lift plate 298. The lower end edge portion of each wall portion constitutes a cam portion 406 which ascends backward. Push tongues 407 integrally protrude forward from the front edge of the base portion 268 of the operating plate 267 and the respective rear edge portions of the hollows 283a and 283b. The cam portion 406 of each wall portion 405 is situated on the path of transfer of each corresponding tongue 407. These push tongues 407 switch their corresponding grounding terminal units 291 between operating and nonoperating states in association with the movement of the operating plate 267. When the plate 267 is in the disengaged position, each push tongue 407 is kept apart from the cam portion 406 of the wall portion 405, as shown in FIG. 55. As the operating plate 267 is slid from the disengaged position to the engaged position, the tongue 407 abuts against the cam portion 406. When the tongue 407 abuts against the cam portion 406, the lift plate 298 is pushed up, and the contact portions 400 of the terminal piece 299 are exposed through the terminal hole 293a and situated above the bearing surface 219. Thus, the contact portions 400 are brought into contact with their corresponding one of grounding pieces 410, which are provided on the bottom face of the computer body 1.

The length of projection of the push tongue 407 for moving the terminal piece 299 up and down, from the operating plate 267, is adjusted so that the contact portions 400 of the terminal piece 299 project from the terminal hole 293a after the fixing claws 261a and 261b are hooked to their corresponding engaging grooves 263 of the computer body 1, with the pushers 242a and 242b confined to the opening portions 240a and 240b, respectively.

The above-mentioned arrangement of the ejector mechanism, apart from the grounding mechanism and the fixing mechanism, is also applied to the expanding apparatus 215 according to the first embodiment.

The following is a description of steps of procedure for attaching to and detaching the computer from the expanding apparatus 215 with the aforementioned construction.

First, the operating knob 280 is pushed in backward to slide the operating plate 267 to the disengaged position. Thereupon, the pivot 248, which connects the paired interlocking arms 247a and 247b, is pushed out backward, so that the push levers 241a and 241b rotate in opposite directions around their corresponding pivots 245. As a result, the pushers 242a and 242b of the levers project from the connector setting surface 220 through the opening portions 240a and 240b, respectively. As the push levers 241a and 241b rotate in this manner, moreover, the rocking arms 251a and 251b rock away from each other around their corresponding pivots 253, so that the fixing claws 261a withdraw into the compartments 260 in the guide rails 221a and 221b, respectively.

Then, the computer to be connected to the expanding apparatus 215 is placed on the bearing surface 219 so that it is situated between the guide rails 221a and 221b. In this case, the slanting guide surfaces 212a and 212b are formed individually on the opposite sides of the bottom portion of the computer body 1, and also, the third slide guide surfaces 224, inclined so as to extend along their corresponding guide surfaces 212a and 212b, are formed individually on the guide rails. When the computer body 1 is situated between the guide rails 221a and 221b, therefore, the guide surfaces 212a and 212b come into contact with their corresponding third slide guide surfaces 224. Thus, the computer is positioned with respect to the bearing surface 219 in a manner such that the center line O2 of the surface 219 is aligned with the center line O1 of the computer.

In this state, the computer is pushed along the guide rails 212a and 212b toward the connector setting surface 220. As this is done, the rear face of the computer body 1 approaches the surface 220, so that the positioning pins 237 of the second connector 227 get into their corresponding holes 238a of the first connector 207. Since the second connector 227 is supported afloat on the connector setting surface 220, it is moved corresponding to the position of the first connector 207 under the guidance of the pins 237. Even if the two connectors 207 and 227 are somewhat dislocated, therefore, this dislocation is absorbed, and these connectors can be accurately connected to each other.

When the connection of the connectors 207 and 227 is completed, the computer is pushed into the predetermined position where the rear face of the body 1 approaches or touches the connector setting surface 220. Thereupon, the rear face of the body 1 comes into contact with the pushers 242a and 242b of the push levers 241a and 241b, so that the pushers 242a and 242b are pushed into the opening portions 240a and 240b, respectively. Accordingly, the levers 241a and 241b are rocked to a position such that their corresponding interlocking arms 247a and 247b are arranged substantially in a straight line.

When the push levers 241a and 241b are rocked so that the interlocking arms 247a and 247b are arranged in a straight line, the operating plate 267, along with the operating knob 280, slides forward to reach the engaged position. As the arms 247a and 247b rock in this manner, moreover, the rocking arms 251a and 251b rock toward each other around their corresponding pivots 253. As a result, the fixing claws 261a and 261b, having so far been confined to the respective compartments 260 of the guide rails 221a and 221b, project form the second slide guide surfaces 223 through their corresponding access holes 262, and are hooked to the engaging grooves 263 in the left- and right-hand side faces of the computer body 1, respectively. Thus, the front end portion of the computer can be prevented from being unexpectedly raised.

When the operating plate 267 is slid to the engaged position, each push tongue 407 extending from the plate 267 advances to the region under its corresponding grounding terminal unit 291. Then, the tongue 407 abuts against the cam portions 406 of the lift plate 298 supporting its corresponding terminal piece 299, thereby pushing up the plate 298 against the urging force of the spring portions 401. Thus, after the fixing claws 261a and 261b are hooked to the computer body 1, the contact portions 400 of each terminal piece 299 project from each corresponding terminal hole 293a above the bearing surface 219, and come into contact with their corresponding grounding piece 410 on the bottom face of the body 1. Thereupon, the electrical and mechanical connection between the computer and the expanding apparatus 215 is completed.

In detaching the computer from the expanding apparatus 215, on the other hand, the operating knob 280 is pushed in backward to slide the operating plate 267 from the engaged position toward the disengaged position. Thereupon, the push tongues 407 of the plate 267 are disengaged individually from the cam portions 406 of their corresponding grounding terminal units 291, so that the terminal pieces 299 withdraw into their corresponding terminal holes 293a. Consequently, the contact portions 400 of the terminal pieces 299 are disengaged from their corresponding grounding pieces 410 on the bottom face of the computer body 1.

When the operating plate 267 is slid to the disengaged position after the terminal pieces 299 are confined to the terminal holes 293a, the push levers 241a and 241b rock in the opposite directions around their corresponding pivots 245, and their pushers 242a and 242b project forward from the connector setting surface 220 through the opening portions 240a and 240b, respectively, as mentioned before. As the pushers 242a and 242b then push the rear face of the computer body 1, the computer is forced out forward or away from the connector setting surface 220, whereupon the first and second connectors 207 and 227 are disconnected from each other.

As the push levers 241a and 241b rock in the aforesaid manner, moreover, the fixing claws 261a and 261b withdraw into the compartments 260 in the guide rails 221a and 221b, respectively, so that they are disengaged from the engaging grooves 263 of the computer body 1. Thus, when the computer is pushed out away from the connector setting surface 220 in the aforesaid manner, both side portions of the front end of the computer are freed.

When the operating knob 280 is slid to the disengaged position, in the expanding apparatus constructed in this manner, the computer is forced out away from the connector setting surface 220, whereupon the first and second connectors 207 and 227 are disconnected from each other. In a first stage of removing the computer from the predetermined position on the bearing surface 219, therefore, the operator need not manually pull the computer toward him. Correspondingly, the operating efficiency of the system is improved, and the computer can be detached with ease.

Since the first and second connectors 207 and 227 are disengaged from each other by sliding the operating knob 280, moreover, the front portion of the computer cannot be unexpectedly lifted up during this operation, so that no unreasonable forces can be applied to the connectors. When the computer is set in the predetermined position on the bearing surface 219, furthermore, the fixing claws 261a and 261b are hooked individually to the engaging grooves 263 in their corresponding front-end side faces of the computer, so that the front end portion of the computer can be prevented from being unexpectedly raised. When the computer is set in the predetermined position, therefore, its front end portion cannot be raised by mistake, so that the connectors 207 and 227 can be protected against unreasonable forces.

Thus, the connectors 207 and 227 can be prevented from being damaged, and the second connector 227 on the side of the expanding apparatus 215 need not be designed for vertical oscillation. Accordingly, the clearance between the second connector 227 and the aperture 225 for its exposure can be narrowed, and high-frequency noises from the expansion unit 217 can be prevented from leaking out.

The push levers 241a and 241b for pushing out the computer from the bearing surface 219 are arranged on the left- and right-hand sides of the second connector 227, respectively, and individually press two spots, left and right, on the rear face of the computer body 1. Thus, even though the second connector 227 is located in the one-sided position deviated from the center line O2 of the bearing surface 219, as in the present embodiment, the computer can be pushed out straight forward without a skew. Accordingly, the first and second connectors 207 and 227 can be securely disengaged from each other without being wrenched, and the computer can be smoothly pushed out with a small force.

According to the arranged described above, moreover, when the operating plate 267 slides to the engaged position, after the computer is pushed into the predetermined position on the bearing surface 219, the terminal pieces 299 project from their corresponding terminal holes 293a in the surface 219, and their contact portions 400 come into contact with their corresponding grounding pieces 410 on the bottom face of the computer body 1. Thus, the computer can be grounded the moment it finishes being connected to the expanding apparatus 215. Accordingly, there is no need of any special grounding operation, so that handling the system is easier.

In sliding the computer, placed on the bearing surface 219, along the guide rails 221a and 221b, or in pushing it out from the predetermined position on the surface 219 by means of the pushers 242a and 242b, there is not possibility of the terminal pieces 299 being caught by or rubbing on the bottom face of the computer body 1, since the pieces 299 are confined to their corresponding terminal holes 293a during this operation. Naturally, therefore, the computer can be slid without any hindrance, and besides, deformation of the terminal pieces 299 and damaging the bottom face of the body 1 can be prevented.

FIGS. 59 through 63 show an alternative support assembly 324 for supporting the second connector 227 of the function expanding apparatus 215. While the second connector 227 is supported to be movable in lateral and horizontal directions in the above described second embodiment, the connector 227 can additionally be displaced longitudinally when it is used with this alternative support assembly.

More specifically, the second connector 227 is a plug in type connector having a large number of terminal pins and can be connected with the first connector 207 of a personal computer of the type under consideration. The second connector 227 projects forward through an opening portion 225 formed in the connector setting surface 220 of the body case 216 of the expanding apparatus. The connector 227 is located to face the first connector of the computer placed on the bearing surface 219 of the body case 216. The second connector 227 is connected to the expansion unit 217 disposed in the body case 216 by means of a signal cable 325.

Figure 59:
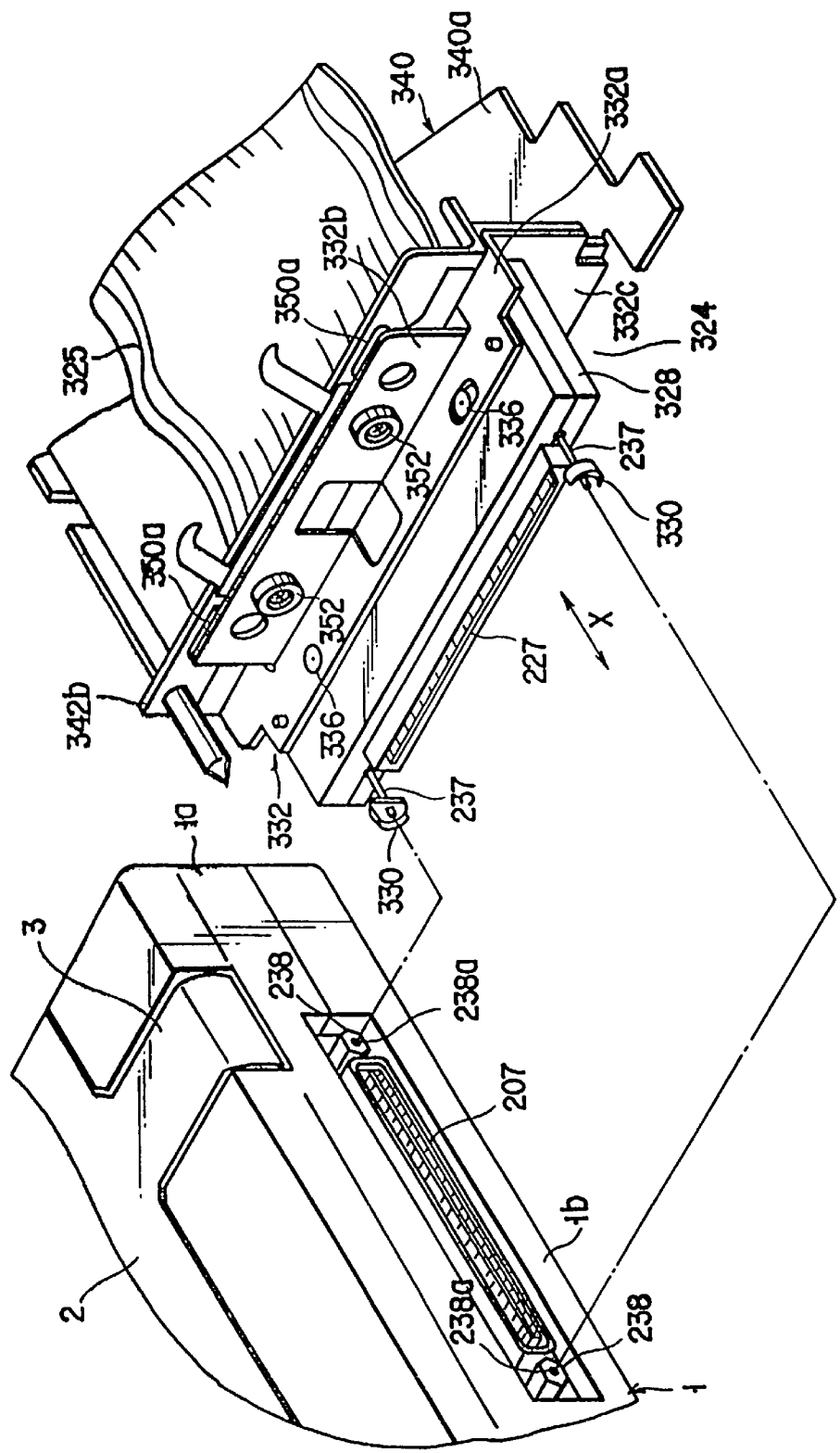
Figure 63:
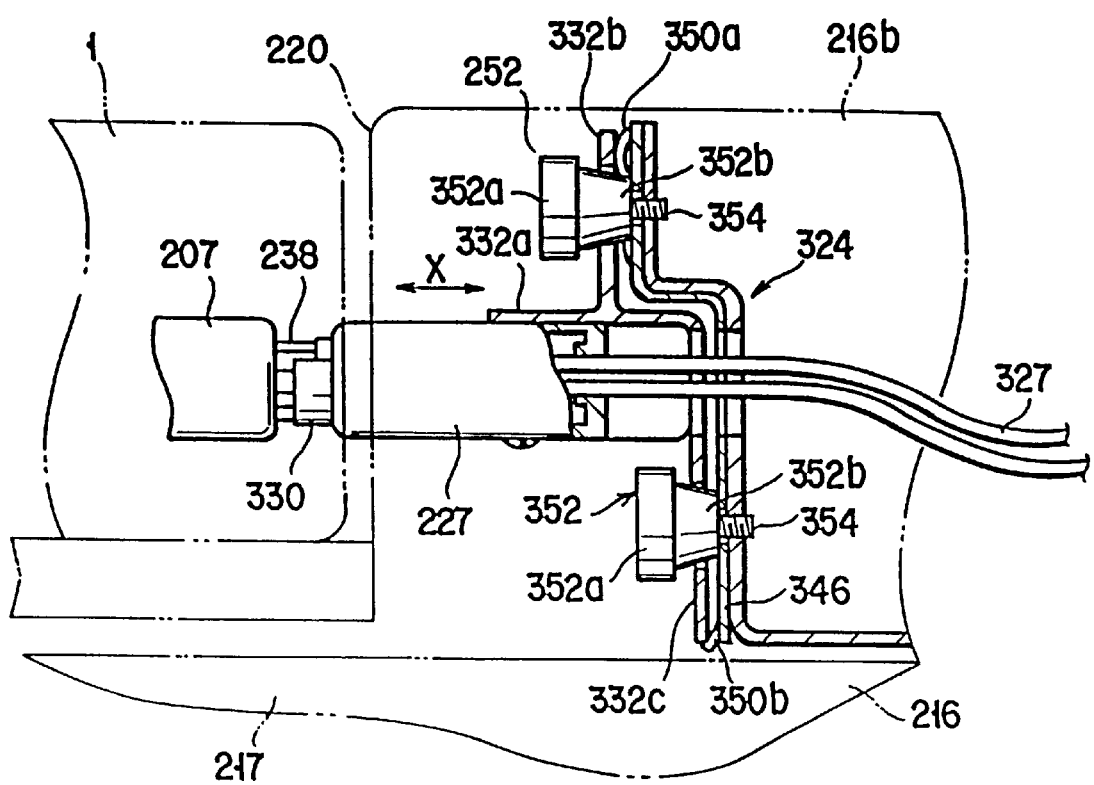

As shown in FIGS. 59 through 61, the connector 227 is held by a box-like connector holder 328 which is provided with a pair of positioning pins 237 arranged at the respective lateral sides of the connector 227. These positioning pins 237 are retractable in the X direction as shown in FIGS. 59, 62 and 63, in which the computer is movable on the body case 216 of the expanding apparatus 215, and can be driven into the respective aligning holes 238a of the anchoring nuts 238 for engagement. Each of the positioning pins 327 is provided at its front end with a aligning member 330 which engages the corresponding anchoring nut 238.

The connector holder 328 is securely fixed to a support bracket 332 by means of a pair of screws 331. The support bracket 332 is realized by cranking a flat metal plate and comprises a horizontally extending fitting section 332a and first and second vertically extending sections 332b and 332c. The fitting section 332a is provided with a pair of tapped holes 333 and a pair of positioning holes 334 disposed between the tapped holes 333, one of the positioning holes 334 being horizontally elongated along the front edge of the support bracket 332. The screws 331 are screwed into the respective tapped holes 331 via through holes 335 formed in the connector holder 328. A pair of positioning projections 336 are formed on the upper surface of the connector holder 328 and fitted in the respective positioning holes 334 of the fitting section 332a.

The first vertically extending section 332b is provided with a pair of guide holes 338 arranged on a same level and separated from each other by a given distance, whereas the second vertically extending section 332c is provided with a single guide hole 338.

The support assembly 324 also comprises a support frame 340 which constitutes part of the body case 216 of the function expanding apparatus 215. The frame 340 includes a horizontally extending bottom wall 340a and a front wall 340b arranged opposite to the support bracket 332. The front wall 340b is cranked to conform to the shape of the corresponding area of the support bracket 332 and includes a horizontal section 342a and first and second vertical sections 342b, 342c which extend respectively upward and downward from the horizontal section 342a. The first vertical section 342b is provided with a pair of tapped holes 344, whereas the second vertical section is provided with a single tapped hole 344.

A leaf spring 346 as urging means is arranged between the support bracket 332 and the front wall 340b of the support frame 340. The leaf spring 346 is also cranked to have a shape conforming to that of the support bracket 332 and comprises a horizontal section 346a and first and second vertical sections 346b, 346c extending respectively upward and downward from the horizontal section 346a. The first vertical section 346b is provided with a pair of through bores 347, whereas the second vertical section 346c is provided with a single through bore 347. The first vertical section 346b is provided with a pair of forwardly projecting push claws 350a bent toward the support bracket 332, whereas the second vertical section 346c is provided with a pair of push claws 350b bent toward the support bracket.

When set in position, the guide holes 338 of the support bracket 332 are respectively aligned with the corresponding through bores 347 of the leaf spring 346 and the corresponding tapped holes 344 of the support frame 340. Each of the guide holes 338 is designed to receive a guide sleeve 352, which is fixed to the support frame by means of a screw 354 screwed into the corresponding tapped hole 344 of the support frame 340 by way of the corresponding through bore 347 of the leaf spring 346 and the guide sleeve.

As clearly shown in FIG. 62, each guide sleeve 352 comprises a flange 352a having an outer diameter greater than the diameter of the corresponding guide hole 338 of the support bracket 332 and a tubular portion 352b extending from the flange to reach the support frame 340 through the guide hole 338. The tubular portion 352b has a frusto-conical profile tapered toward the front end that reaches the support from 340 with its rear end having an outer diameter substantially equal to that of the guide hole 338 and its front end having an outer diameter smaller than that of the guide hole 338.

Thus, the support bracket 332 is attached to the support frame 340 by means of three guide sleeves 352, the former is movable in the axial direction of the guide sleeve or the X-direction in FIGS. 59, 62 and 63. The leaf spring 346 is securely held between the support bracket 332 and the support frame 340 by means of the guide sleeves 352. The first push claws 350a of the leaf spring 346 abuts against the first vertical section 332b of the support bracket 332, whereas the second push claws 350b abut against the second vertical section 332c of the support bracket.

Thus, the support bracket 332 is pushed toward the connector setting surface 220 of the body case 216 and therefore pressed against the flanges 352a of the guide sleeves 352. Consequently, the support bracket 332 is blocked by the flanges 352a and prevented from moving any further toward the connector setting surface 220 and is held in a stand by position as illustrated in FIG. 62.

The connector holder 328, support bracket 332, support frame 340, and guide sleeves 352 constitute supporting means in the present invention.

The second vertical sections 332c, 346c and 342c of the support bracket 332, the leaf spring 346 and the front wall 340b of the support frame 340 are provided with respective openings, through which the signal cable 327 of the second connector 227 extends.

When a personal computer of the type under consideration is fitted to the function expanding apparatus 215 provided with a second connector 227 which is supported by the support assembly 324 having the above-mentioned configuration, the support bracket 332 of the support assembly 324 is held in the stand-by position in the initial stages of fitting operation. In this stand-by position, the large diameter end of the frusto-conical tubular portion 352b of each of the guide sleeves 352 is located within the corresponding guide hole 338. Since the large diameter is substantially equal to the bore of the guide hole 338, the guide sleeve 332 is fitted in the guide hold 338 without gaps. Thus, the support bracket 332 and connector 227 are held in position without allowing them any vertical and/or lateral movement.

In this state, as the computer is pushed toward the connector setting surface 220 along the guide rails 221a, 221b of the body case 216, the rear end of the computer body 1 approaches the connector setting surface 220, and the positioning pins 237 of the second connector 227 go into the respective aligning holes 238a of the anchor nuts 238 of the computer and the aligning members 330 are engaged with the respective anchor nuts.

As the computer body 1 is pushed further to its proper position, the first connector 207 comes to be engaged with the second connector 227 of the expanding apparatus 215 to establish an electric connection between the computer and the expanding apparatus, as shown in FIG. 63. Under this connected condition, the support bracket 332 is pushed toward the support frame 340 along with the second connector 227 and the connector 227 is located at a pushed-in position illustrated in FIG. 63. Then, the computer is locked by the above-mentioned lock mechanism arranged in the body case 216 so that it may not lifted from the bearing surface 219 of the body case 216.

When the second connector 227 is placed in the pushed-in position as illustrated in FIG. 63, the small diameter end of the tubular portion 352b of each guide sleeve 352 is found within the corresponding guide hole 338. Since the diameter of the small diameter end of the guide sleeve 352 is smaller than that of the guide hole 338, there exists a gap between them so that the support bracket 332 and the second connector 227 may be displaced vertically and laterally relative to the support frame 340, or in directions perpendicular to the X-direction in which the first connector 207 is moved for engagement or disengagement. Thus, even when the computer is pushed vertically and/or laterally by external force after it is connected to the function expanding apparatus 215, the second connector 227 and the support bracket 332 may move with the first connector 207 to eliminate any stress that may be generated in the first and second connectors, thereby preventing damage of these components.

Further, in the pushed-in position, the support bracket 332 can be displaced in the X-direction wherein the first connector is moved for engagement or disengagement. Thus, even when the computer is displaced in the X direction, particularly in a direction wherein the first connector can be disconnected from the second connector, the support bracket 332 and the second connector 227 move with the first connector 207 to nullify any relative displacement of the computer and the expanding apparatus 215. As a result, the first connector 207 would not unintentionally come off the second connector 227 and the connection between the computer and the expanding apparatus 215 is secured.

With the function expanding apparatus 215 which comprises the support assembly 324 having the above described configuration, as the support bracket 332 supporting the second connector 227 is movable in the X-direction in which the first connector moves for engagement or disengagement, the connection between the two connectors is secured even when external force is applied to the computer trying to pull the first connector out of the second connector. Thus, the connection between the computer and the expanding apparatus 215 would not be unintentionally disrupted to destroy any of the data being processed by the computer or the software systems stored in the computer.

Even when the computer is displaced vertically and/or laterally relative to the expanding apparatus 215, the support bracket 332 moves with the computer in the same direction to prevent the first and second connectors 207, 227 from being damaged.

It is understood that the present invention is not limited to the above described embodiments and various changes and modifications can be made within the scope of the invention.

For instance, the present invention has been described with regard to personal computers, it may be applied any other portable electronic apparatus such as word processors.

Figure 66:
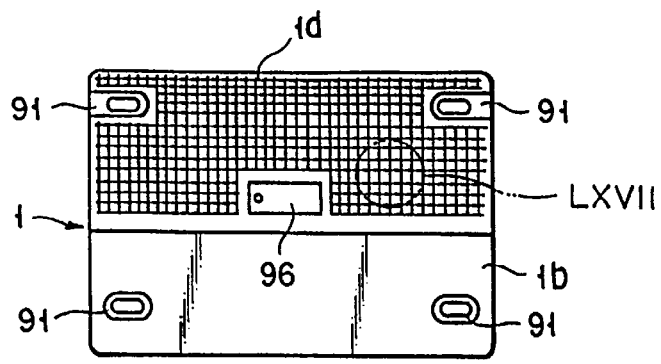
FIG. 66 is a bottom view of a personal computer provided with projections according to a third modification of the invention.
Figure 67:
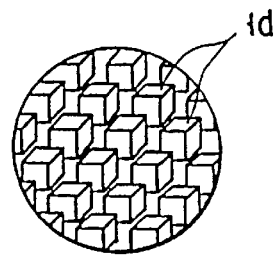
FIG. 67 is an enlarged perspective view of an area of the bottom of a personal computer indicated by circled H in FIG. 66.

In the first embodiment of the invention, the projections 1d arranged at the bottom of the lower case 1b of the computer body 1 may be extending longitudinally as illustrated in FIG. 64. Alternatively, they may be realized in a zig-zag form as illustrated in FIG. 65. Still alternatively, the projections 1d may be so many cubes as illustrated in FIGS. 66 and 67.

Figure 68:
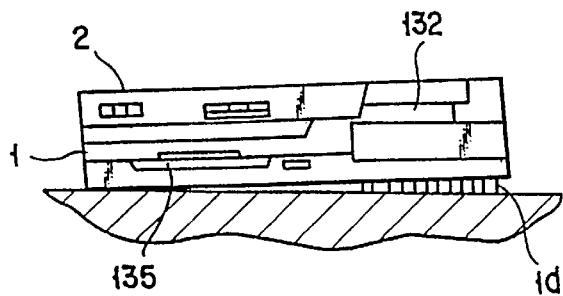
FIG. 68 is a side view of a personal computer provided on a rear portion of the bottom with projections according to the third modification.

When one or more electronic components serving as superheating members are arranged in the rear section in the computer body 1, the projections 1d are advantageously arranged in the corresponding rear section of the bottom wall as illustrated in FIG. 68. With such an arrangement, the projections 1d may serve as legs of the body 1 so that the body may be slightly inclined forward to allow easy access to the keyboard when it is placed on a desk top.

A conductive portion 160 of a card like electronic device according to the invention such as an interface card may extends to the upper and lower surfaces of the card so that it may be directly connected to the design plates 154 serving as shield plates, as shown in FIG. 69. Alternatively, such a conductive portion 160 may be arranged only on a lateral surface of the card without extending to the upper and lower surfaces as illustrated in FIG. 70. Further, as shown in FIG. 71, a conductive portion 160 may be formed by a conductive layer 160a formed on the outer surface of the rear end portion of the card 100.

The support bracket, the leaf spring, the support frame and other components of the support assembly 324 having a configuration as described above may be modified in terms of shape. The number of the guide sleeves and that of the lugs may be changed if appropriate.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. An electronic apparatus comprising:
a flat box-like body including an upper case having an opening and a lower case fitted to the upper case;
a keyboard fixed to the upper case and located within the opening;
a mount plate directly fixed to an inner surface of the upper case to cover the underside of the keyboard;
a memory device directly mounted on the mount plate;
a circuit board directly fixed to the mount plate and mounted with a number of electronic elements;
a display rotatably mounted on an outer surface of the upper case; and
a connecting cable for electrically connecting the display and the circuit board.

2. An apparatus according to claim 1, wherein said mount plate is conductive and constitutes a shield plate.

3. An electronic apparatus comprising:
a body including an upper case and a lower case fitted to the upper case;
a keyboard attached to the upper case;
a display rotatably mounted on an outer surface of the upper case;
a plurality of electronic components, including a circuit board and a memory device;
means for directly attaching the plurality of electronic components to the upper case so as to reinforce the upper case; and
a supporting unit which is attached to an inner surface of the upper case and arranged beside the electronic components, the supporting unit having a storing portion for storing a battery pack.

4. An apparatus according to claim 3, wherein said supporting unit includes a card storing portion for storing a card-shaped electronic device.

5. An electronic apparatus as in claim 3, wherein the means for directly attaching is a shield plate fixed to an inner surface of the upper case to cover an underside of the keyboard, and wherein said electronic components are directly mounted on the shield plate.

6. An electronic apparatus comprising:
a body including an upper case and a lower case fitted to the upper case, the lower case having an inner surface which includes a shielding layer;
a keyboard attached to the upper case;
a display rotatably mounted on an outer surface of the upper case;
a plurality of electronic components, including a circuit board and a memory device;
a conductive chassis directly attaching the plurality of electronic components to the upper case so as to reinforce the upper case and for shielding the electronic components; and
a connecting cable for electrically connecting the display and the circuit board.

7. An apparatus according to claim 6, wherein the conductive chassis comprises a shield plate fixed to an inner surface of the upper case to cover an underside of the keyboard, and wherein said electronic components are directly mounted on the shield plate.

8. An electronic apparatus comprising:
a body including an upper case and a lower case fitted to the upper case, the lower case having an inner surface which includes a shielding layer;
a keyboard attached to the upper case;
a display rotatably mounted on an outer surface of the upper case;
a plurality of electronic components; and
a conductive chassis directly attaching the plurality of electronic components to the upper case so as to reinforce the upper case and for shielding the electronic components.

9. An apparatus according to claim 8, wherein said electronic components include a circuit board and a memory device.

10. An apparatus according to claim 9, wherein said memory device is a disk drive.

11. An apparatus according to claim 8, wherein the conductive chassis comprises a shield plate fixed to an inner surface of the upper case to cover an underside of the keyboard, and wherein said electronic components are directly mounted on the shield plate.

12. An apparatus according to claim 11, wherein said electronic components further include a board unit mounted on the shield plate, the board unit having first and second circuit boards arranged in layers, and wherein a flexible cable connects the first and second circuit boards to each other.

13. An electronic apparatus comprising:
a base unit including a housing having a keyboard mount portion, a keyboard mounted on the keyboard mount portion, and a conductive member disposed in the housing, the conductive member including a first area and a second area;
a display mounted on the base unit to be rotatable between a closing position wherein the keyboard is covered and an opening position wherein the keyboard is exposed;
a data storage unit directly fixed to the first area with screws; and
a printed circuit board fixed to the second area with screws,
the conductive member having a size substantially equal to a size of the keyboard and being arranged between the keyboard and the printed circuit board, facing and reinforcing the keyboard.

14. An electronic apparatus according to claim 13, wherein the housing has a front portion, and the keyboard mount portion is disposed on the front portion.

15. An electronic apparatus according to claim 14, wherein the housing has a bottom wall, the conductive member being disposed between the keyboard and the bottom wall.

16. An electronic apparatus according to claim 15, wherein the conductive member is a shield plate.

17. An electronic apparatus comprising:
a base unit including an upper housing having a keyboard, and a lower housing having a lower inner surface, the lower inner surface having a shielding layer;
a display unit mounted on the base unit to be rotatable between a closing position wherein the keyboard is covered and an opening position wherein the keyboard is exposed;
a conductive chassis including a first area and a second area, the conductive chassis being disposed between the upper housing and the lower housing;
a data storage unit directly mounted on the first area with screws;
a printed circuit module directly mounted on the second area with screws; and a cable electrically connecting the keyboard and the printed circuit module, the conductive chassis having a size substantially equal to a size of the keyboard and being arranged between the keyboard and the printed circuit module and data storage unit, facing the keyboard.

18. An electronic apparatus according to claim 17, wherein the data storage unit includes a hard disk drive.

19. An electronic apparatus according to claim 17, wherein the chassis is disposed between the lower inner surface of the lower housing and the keyboard.

20. An electronic apparatus according to claim 19, wherein the upper housing includes a front portion on which the keyboard is mounted.

21. An electronic apparatus according to claim 20, wherein the upper housing includes an upper inner surface, and the chassis is fixed on the upper inner surface by the screws.

22. An electronic apparatus according to claim 21, wherein the printed circuit module includes a first circuit board, a second circuit board, and a flexible wiring board electrically connecting the first circuit board and the second circuit board, the flexible wiring board being bent so that the first circuit board is disposed above the second circuit board.

23. An electronic apparatus according to claim 22, wherein the printed circuit module includes a spacer disposed between the first circuit board and the second circuit board.

24. An electronic apparatus comprising:

a base unit including an upper housing having a keyboard and a lower housing having a lower inner surface, the lower inner surface having a shield layer;

a display unit mounted on the base unit to be rotatable between a closing position wherein the keyboard is covered and an opening position wherein the keyboard is exposed;

a conductive chassis including a first area and disposed between the upper housing and the lower housing; and a circuit board unit directly mounted on the first area with screws, the circuit board unit including a flexible wiring board, a first circuit board electrically connected to one end of the flexible wiring board, and a second circuit board electrically connected to an other end of the flexible wiring board, the first circuit board being disposed above the second circuit board, the conductive chassis having a size substantially equal to a size of the keyboard and being located between the keyboard and the circuit board unit, facing the keyboard.

25. An electronic apparatus according to claim 24, wherein the conductive chassis includes a second area, and which further comprises a data storage unit directly mounted on the second area with screws.

26. An electronic apparatus according to claim 25, wherein the upper housing includes an upper inner surface, and the conductive chassis is fixed to the upper inner surface with screws.

27. An electronic apparatus according to claim 26, wherein the first area is arranged adjacent to the second area.

28. An electronic apparatus according to claim 27, wherein the conductive chassis is disposed between the keyboard and the lower housing.

29. An electronic apparatus according to claim 28, wherein the upper housing includes a front portion on which the keyboard is disposed.

30. An electronic apparatus comprising:

a body including a housing and a keyboard mount portion provided on an upper surface of the housing;

a keyboard mounted on the keyboard mount portion;

a display mounted on the body to be rotatable between a closing position wherein the keyboard is covered and an opening position wherein the keyboard is exposed; and a conductive chassis disposed in the housing and including a first area for directly mounting a data storage unit and a second area for directly mounting a printed circuit board, the conductive chassis being arranged between the keyboard and the printed circuit board, facing the keyboard, and being fixed to the body.

31. An electronic apparatus according to claim 30, wherein the conductive chassis is a shield plate, the first area has a plurality of first engaging portions to which the data storage unit is fixed, and the second area has a plurality of second engaging portions to which the printed circuit board is fixed.

32. An electronic apparatus according to claim 31, wherein the housing has a front portion on which the keyboard mounting portion is provided, and a bottom wall, the shield plate being disposed between the keyboard and the bottom wall.

33. An electronic apparatus according to claim 32, wherein the housing includes an upper case which has an inner surface, the shield plate being fixed to the inner surface.

34. An electronic apparatus according to claim 33, wherein the data storage unit includes a floppy disk drive unit.

35. An electronic apparatus comprising:

a body including a housing and a keyboard mount portion provided on an upper surface of the housing;

a keyboard mounted on the keyboard mount portion;

a display rotatably mounted on the upper surface of the housing;

plurality of electronic components, including a circuit board and a memory device; and a conductive chassis directly attaching the plurality of electronic components to the housing so as to reinforce the housing and shielding the electronic components.

* * * * *